United States Patent
Said et al.

(10) Patent No.: US 11,430,736 B2
(45) Date of Patent: Aug. 30, 2022

(54) SEMICONDUCTOR DEVICE INCLUDING HAVING METAL ORGANIC FRAMEWORK INTERLAYER DIELECTRIC LAYER BETWEEN METAL LINES AND METHODS OF FORMING THE SAME

(71) Applicant: SANDISK TECHNOLOGIES LLC, Addison, TX (US)

(72) Inventors: Ramy Nashed Bassely Said, San Jose, CA (US); Raghuveer S. Makala, Campbell, CA (US); Senaka Kanakamedala, San Jose, CA (US); Yao-Sheng Lee, Tampa, FL (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 82 days.

(21) Appl. No.: 17/000,934

(22) Filed: Aug. 24, 2020

(65) Prior Publication Data
US 2022/0059462 A1    Feb. 24, 2022

(51) Int. Cl.
| | | |
|---|---|---|
| *H01L 23/535* | (2006.01) | |
| *H01L 27/11519* | (2017.01) | |
| *H01L 27/11524* | (2017.01) | |
| *H01L 27/11556* | (2017.01) | |
| *H01L 27/11565* | (2017.01) | |
| *H01L 27/1157* | (2017.01) | |
| *H01L 21/768* | (2006.01) | |

(Continued)

(52) U.S. Cl.
CPC ...... *H01L 23/535* (2013.01); *H01L 21/02244* (2013.01); *H01L 21/76805* (2013.01); *H01L 21/76843* (2013.01); *H01L 21/76895* (2013.01); *H01L 23/53252* (2013.01); *H01L 23/53266* (2013.01); *H01L 27/1157* (2013.01); *H01L 27/11519* (2013.01); *H01L 27/11524* (2013.01); *H01L 27/11556* (2013.01); *H01L 27/11565* (2013.01); *H01L 27/11582* (2013.01)

(58) Field of Classification Search
CPC .................. H01L 23/535; H01L 21/76895
See application file for complete search history.

(56) References Cited

U.S. PATENT DOCUMENTS

| | | |
|---|---|---|
| 5,882,548 A | 3/1999 | Liang et al. |
| 5,915,167 A | 6/1999 | Leedy |

(Continued)

FOREIGN PATENT DOCUMENTS

EP    3137647 B1    12/2019

OTHER PUBLICATIONS

Ameloot, R. "MOF-CVD Chemical Vapor Deposition of Metal-Organic Frameworks," International MicroNano Conference 2016, Dec. 13-14, Amsterdam, NL, 43 pages, (2016), https://www.micronanoconference.org/app/uploads/sites/57/2016/12/Porous-Crystals-from-the-Vapor-Phase_Rob-Ameloot_KU-Leuven.pdf.

(Continued)

*Primary Examiner* — Farun Lu
(74) *Attorney, Agent, or Firm* — The Marbury Law Group PLLC

(57) ABSTRACT

A semiconductor structure includes first metal lines located above at least one semiconductor device, and a continuous metal organic framework (MOF) material layer including lower MOF portions that are located between neighboring pairs of first metal lines and an upper MOF matrix portion that continuously extends over the first metal lines and connected to each of the lower MOF portions.

21 Claims, 44 Drawing Sheets

(51) Int. Cl.
*H01L 23/532* (2006.01)
*H01L 21/02* (2006.01)
*H01L 27/11582* (2017.01)

(56) References Cited

U.S. PATENT DOCUMENTS

| | | | |
|---|---|---|---|
| 8,123,834 | B2 | 2/2012 | Masel et al. |
| 8,349,681 | B2 | 1/2013 | Alsmeier et al. |
| 8,603,225 | B2 | 12/2013 | Schubert et al. |
| 9,252,151 | B2 | 2/2016 | Chien et al. |
| 9,346,831 | B1 | 5/2016 | Talin et al. |
| 9,356,031 | B2 | 5/2016 | Lee et al. |
| 9,397,093 | B2 | 7/2016 | Makala et al. |
| 9,419,012 | B1 | 8/2016 | Shimabukuro et al. |
| 9,428,525 | B1 | 8/2016 | Talin et al. |
| 9,515,085 | B2 | 12/2016 | Rabkin et al. |
| 9,576,975 | B2 | 2/2017 | Zhang et al. |
| 9,691,884 | B2 | 6/2017 | Makala et al. |
| 9,724,668 | B2 | 8/2017 | Zhou et al. |
| 9,875,929 | B1 | 1/2018 | Shukla et al. |
| 9,983,124 | B2 | 5/2018 | Wang et al. |
| 10,094,020 | B2 | 10/2018 | Stassen et al. |
| 10,256,247 | B1 | 4/2019 | Kanakamedala et al. |
| 10,274,421 | B2 | 4/2019 | Chang et al. |
| 2010/0064888 | A1 | 3/2010 | Schubert et al. |
| 2010/0132547 | A1 | 6/2010 | Masel et al. |
| 2015/0034500 | A1 | 2/2015 | Kim et al. |
| 2016/0159822 | A1 | 6/2016 | Tan et al. |
| 2016/0229873 | A1 | 8/2016 | Talin et al. |
| 2016/0231233 | A1 | 8/2016 | Wang et al. |
| 2016/0346759 | A1 | 12/2016 | Zhou et al. |
| 2017/0044428 | A1 | 2/2017 | Li et al. |
| 2017/0198393 | A1* | 7/2017 | Stassen ............. C23C 16/45523 |
| 2018/0011010 | A1 | 1/2018 | Chang et al. |
| 2018/0108671 | A1 | 4/2018 | Yu et al. |
| 2018/0254284 | A1* | 9/2018 | Hwang ............. H01L 27/11556 |
| 2019/0024235 | A1 | 1/2019 | Stassen et al. |
| 2019/0067025 | A1 | 2/2019 | Yada et al. |
| 2019/0096808 | A1 | 3/2019 | Tsutsumi et al. |
| 2019/0115361 | A1* | 4/2019 | Kim ..................... G11C 16/08 |
| 2021/0036001 | A1* | 2/2021 | Kim .................... H01L 23/5226 |

OTHER PUBLICATIONS

Endoh et al., "Novel Ultra High Density Memory with a Stacked-Surrounding Gate Transistor (S-SGT) Structured Cell," IEDM Proc. (2001) 33-36.
Hendon, C.H., et al. "Engineering the optical response of the titanium-MIL-125 metal-organic framework through ligand functionalization." *Journal of the American Chemical Society* 135. 30 (2013): 10942-10945.
Kramer, M. et al., "Synthesis and properties of the metal-organic framework Mo 3 (BTC) 2 (TUDMOF-1)," *Journal of Materials Chemistry*, vol. 16, No. 23 (2006): pp. 2245-2248.
Krishtab, M. et al., "Vapor-Deposited Zeolitic Imidazolate Frameworks as Gap-Filling Ultra-Low-k Dielectrics," Nature Communications, pp. 1-9, (2019) 10:3729 | https://doi.org/10.1038/s41467-019-11703-x | www.nature.com/naturecommunications.
Park, S.J. et al., "A mechanistic study of SF6/O2 reactive ion etching of molybdenum," Citation: Journal of Vacuum Science & Technology B: Microelectronics Processing and Phenomena, vol. 5, pp. 1372-1373, (1987); doi: 10.1116/1.583618 1372-1373.
Perez, E. V. et al., "Origins and Evolution of Inorganic-Based and MOF-Based Mixed-Matrix Membranes for Gas Separations," Processes 2016, vol. 4, No. 32, pp. 1-68; (2016) doi:10.3390/pr4030032, www.mdpi.com/journal/processes.
Ryder, M.R., et al. "Understanding and controlling the dielectric response of metal-organic frameworks." *ChemPlusChem* 83.4 (2018): 308-316.
Stassin, T. et al., "Vapour-Phase Deposition of Oriented Copper Dicarboxylate Metal-Organic Framework Thin Films," *Chemical Communications* 55.68 (2019): 10056-10059.
U.S. Appl. No. 16/278,426, filed Feb. 18, 2019, SanDisk Technologies LLC.
U.S. Appl. No. 16/278,488, filed Feb. 18, 2019, SanDisk Technologies LLC.
U.S. Appl. No. 16/722,745, filed Dec. 20, 2019, SanDisk Technologies LLC.
U.S. Appl. No. 16/722,824, filed Dec. 20, 2019, SanDisk Technologies LLC.
Notification of Transmittal of the International Search Report and the Written Opinion of the International Searching Authority for International Patent Application No. PCT/US2021/035308, dated Sep. 29, 2021, 12 pages.

* cited by examiner

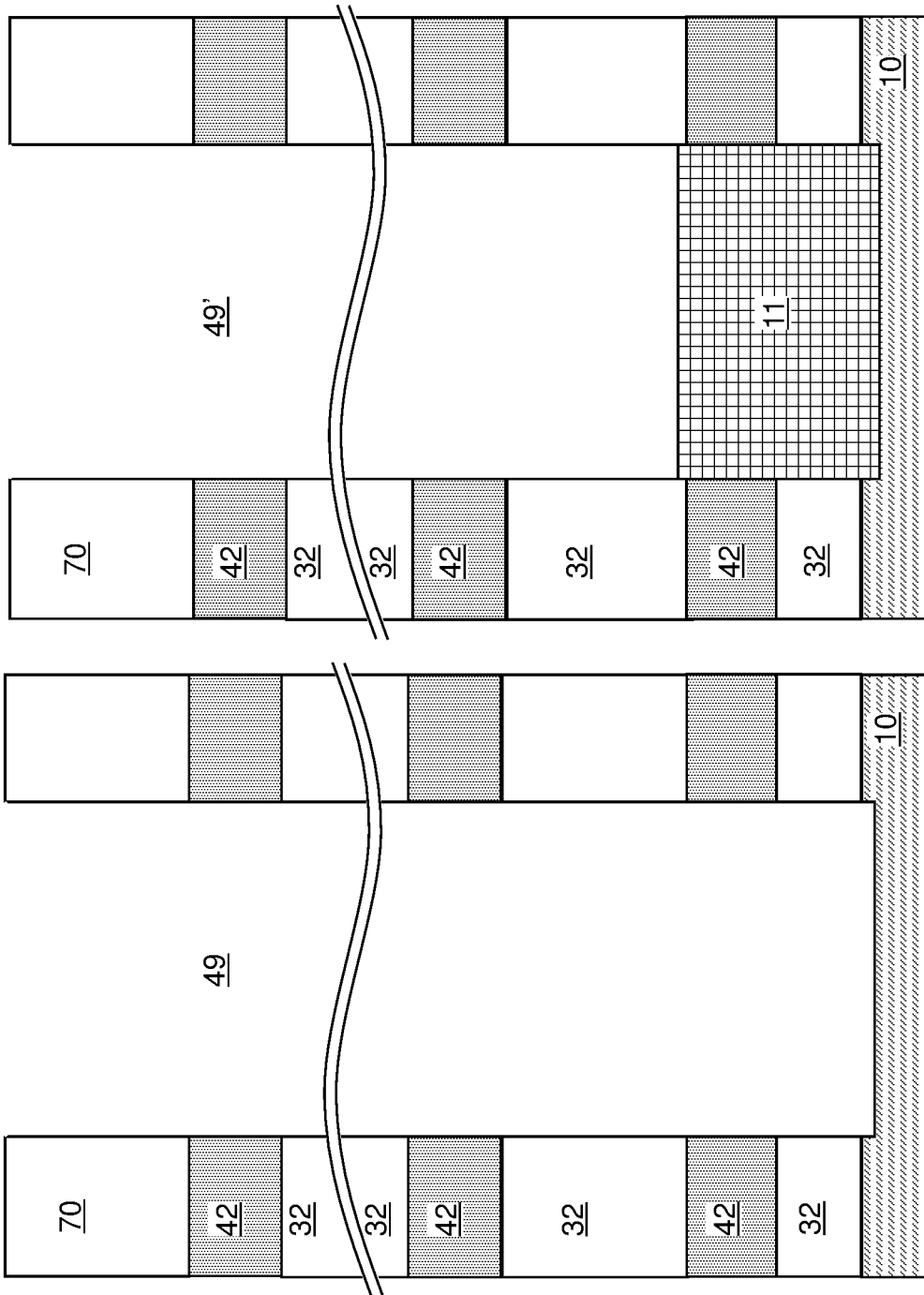

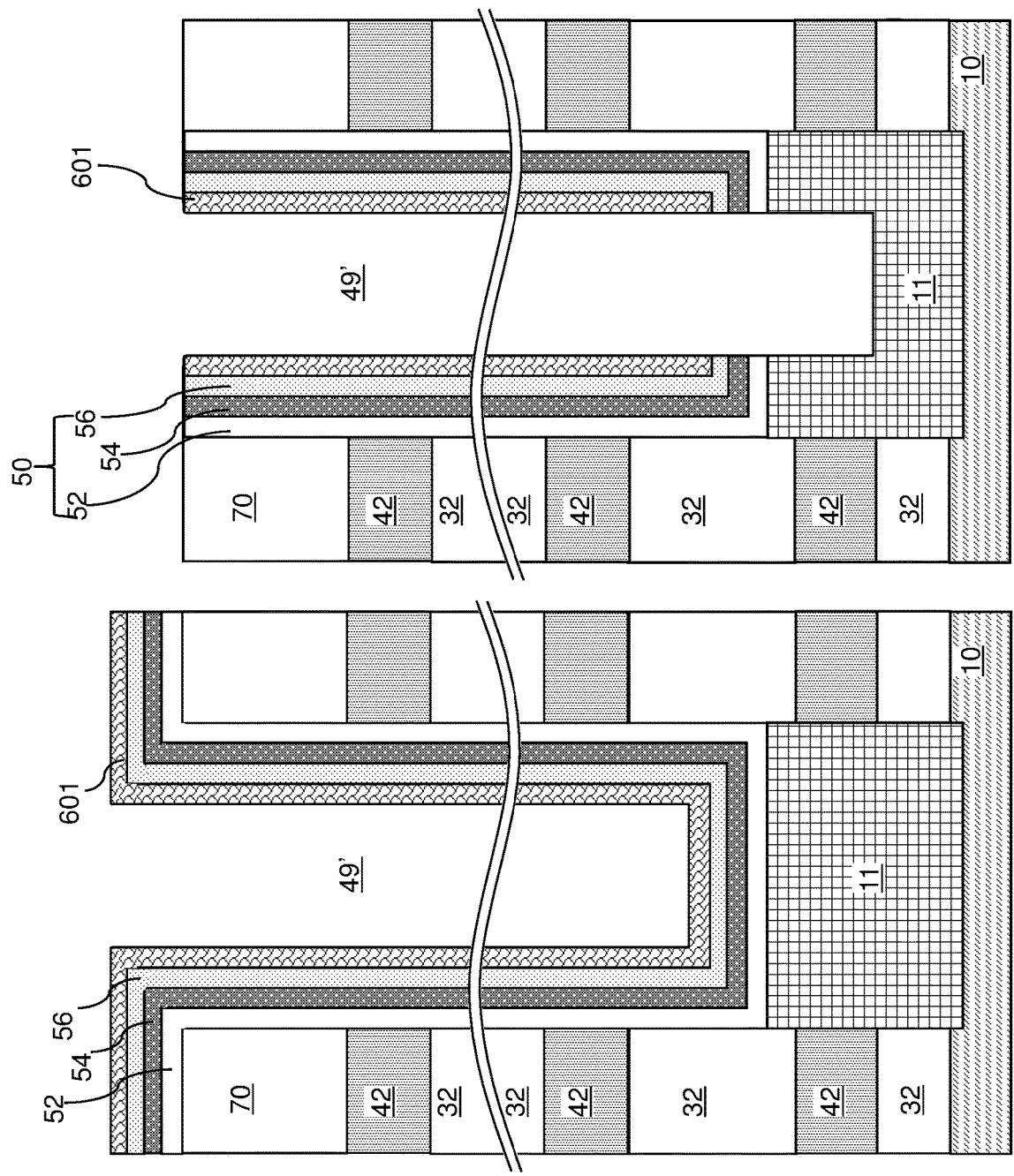

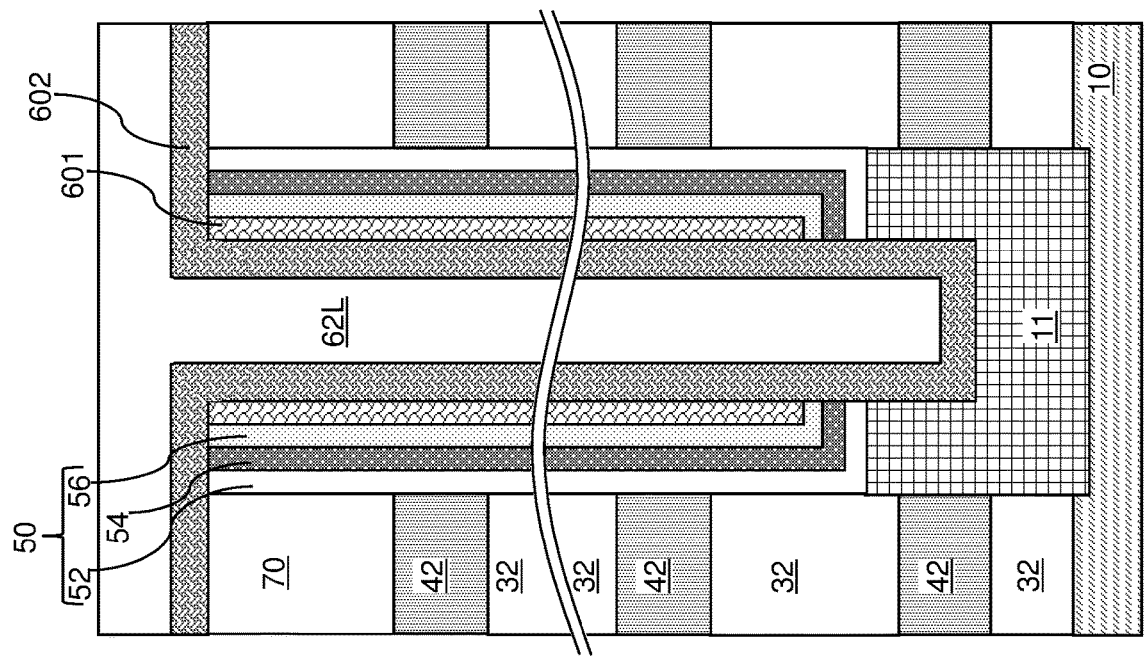
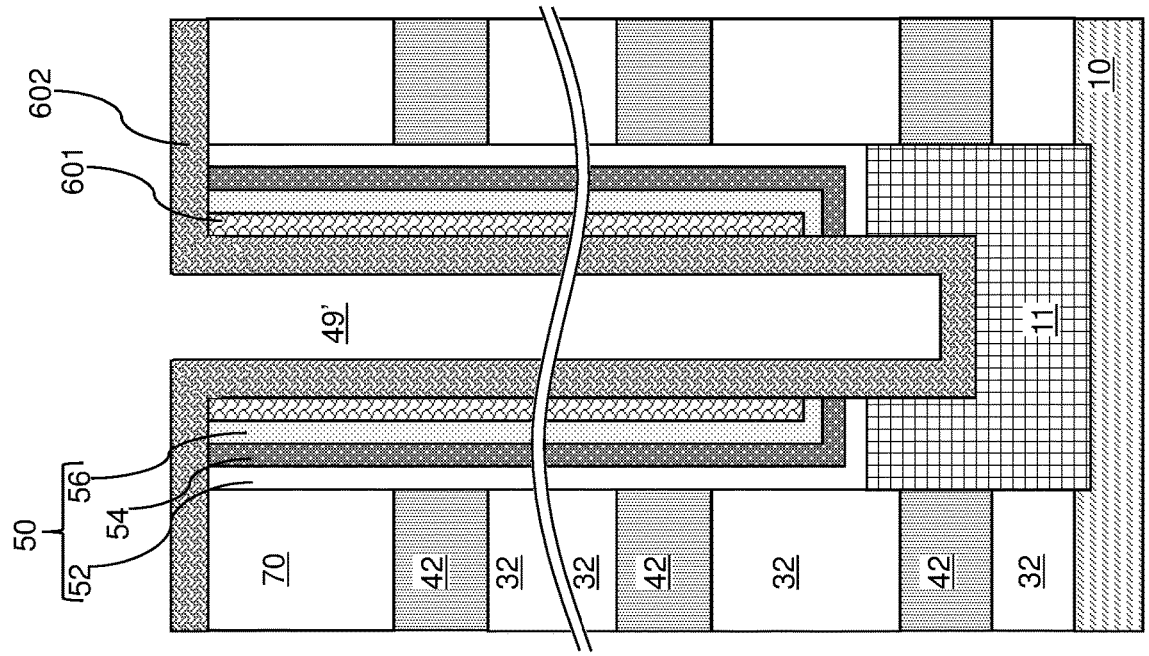

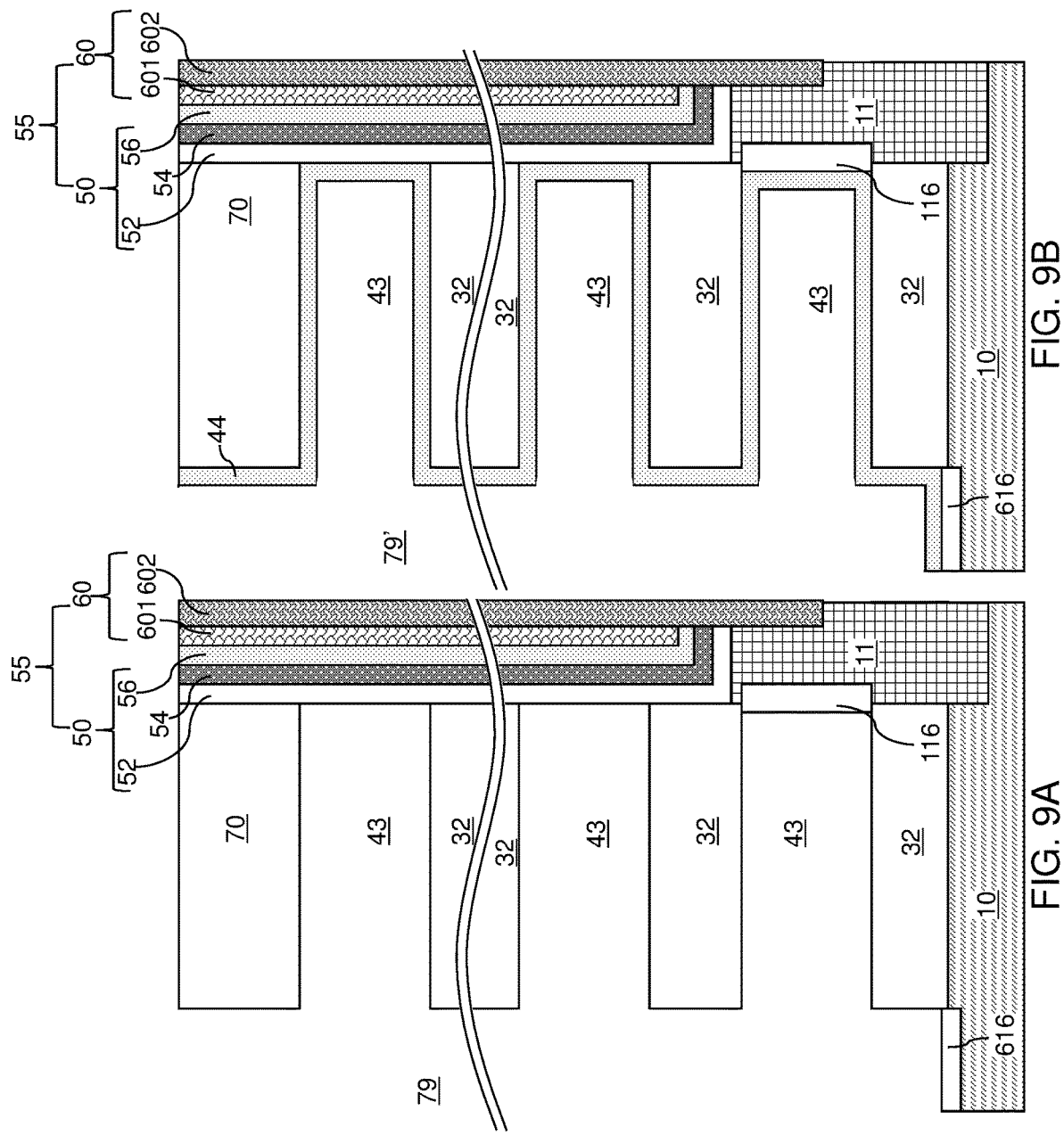

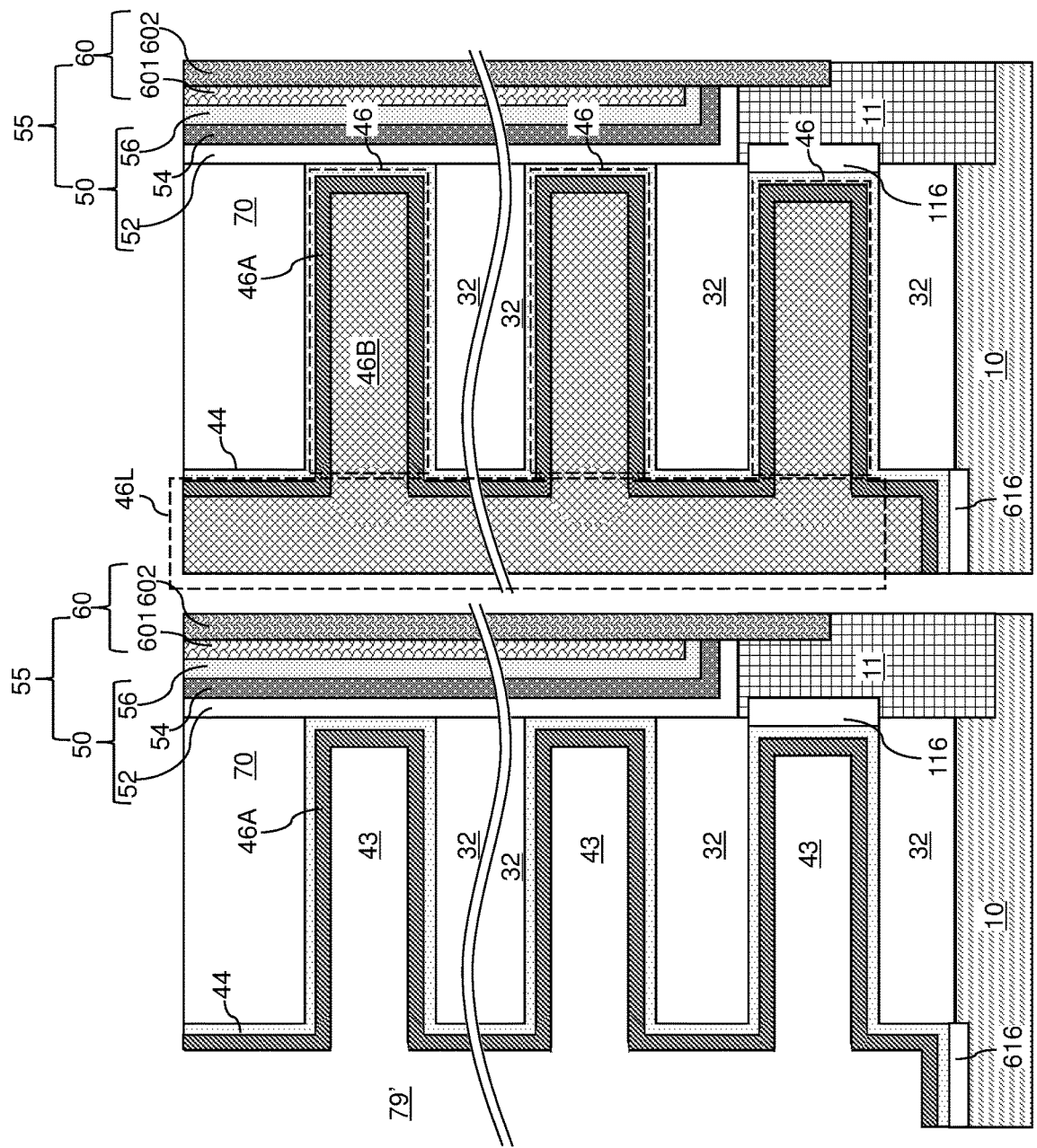

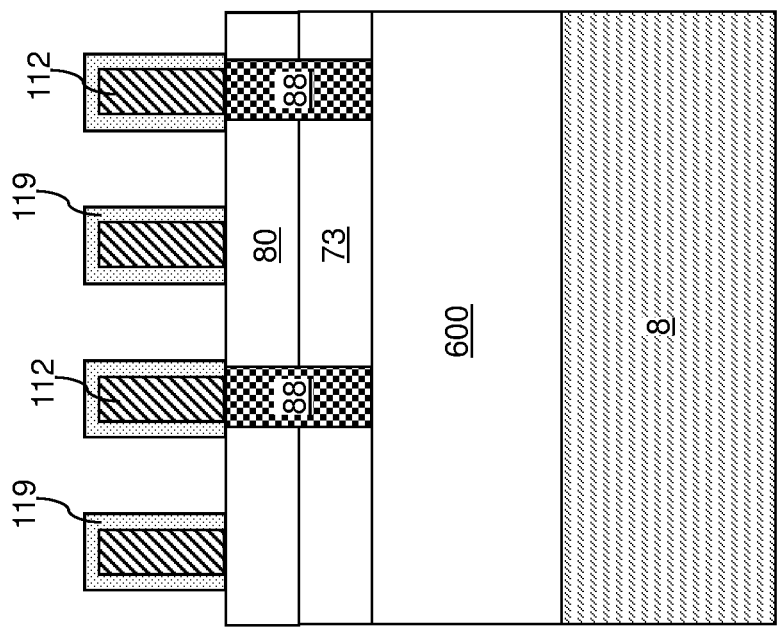
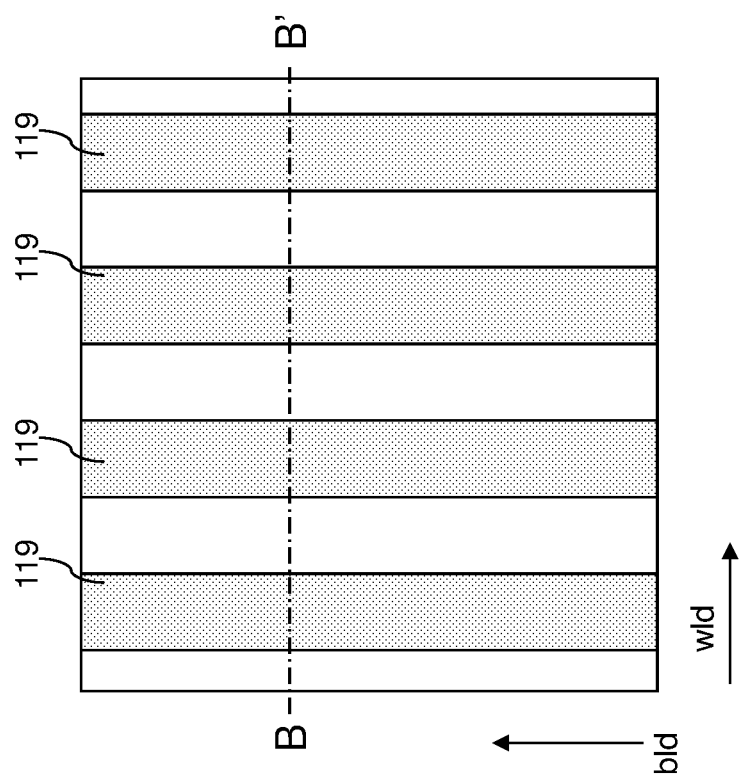
FIG. 15B
FIG. 15A

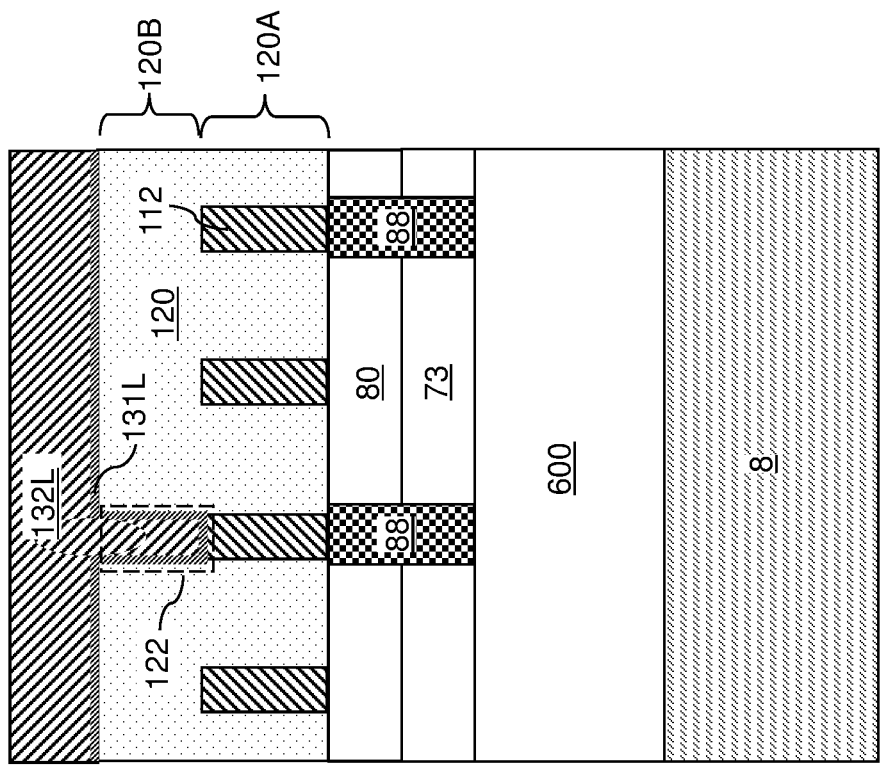
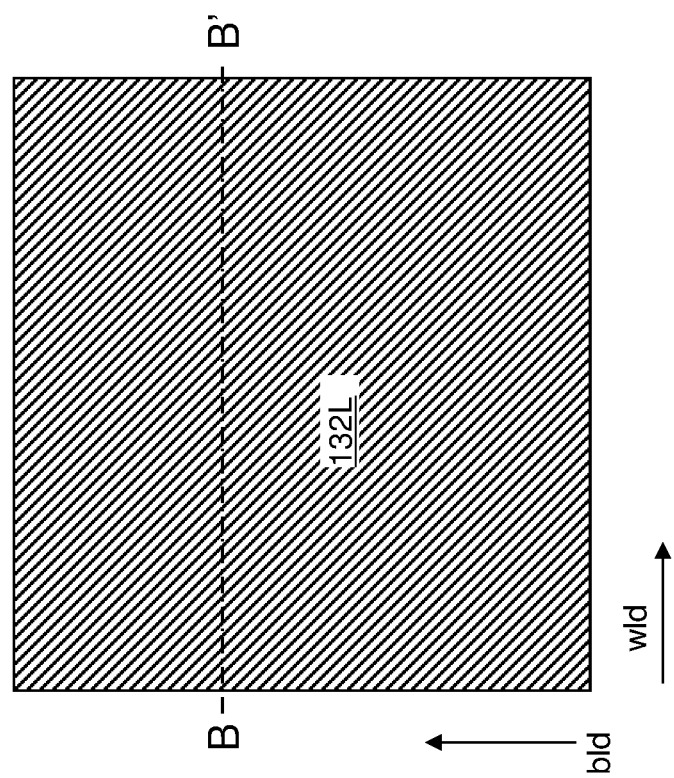
FIG. 18B
FIG. 18A

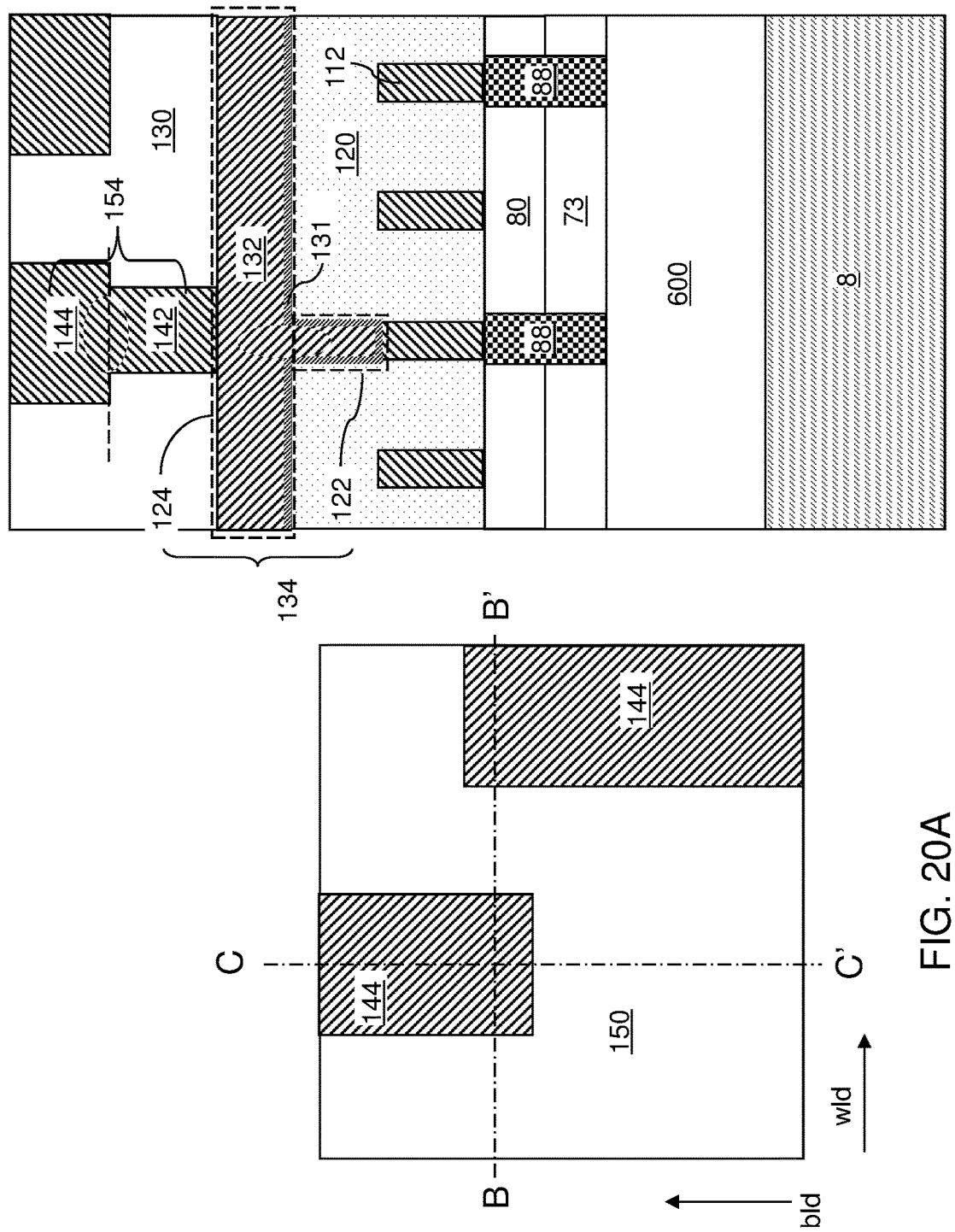

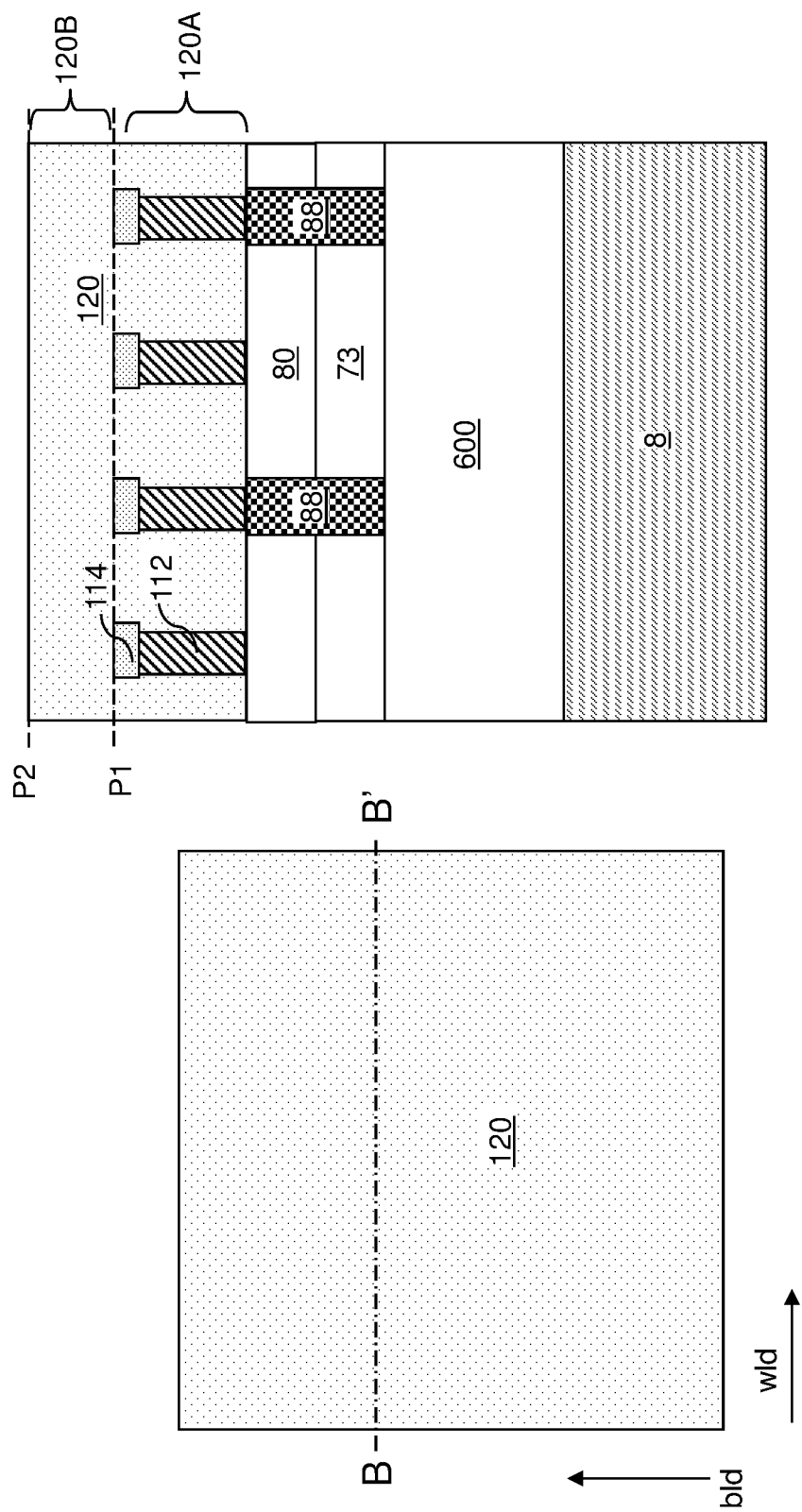

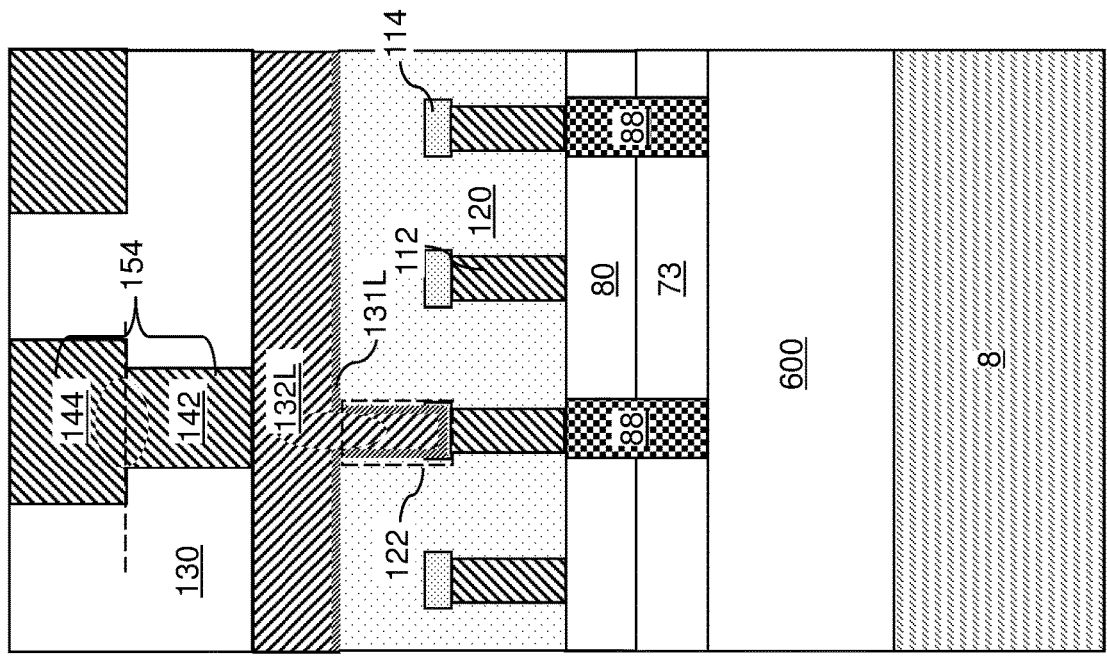
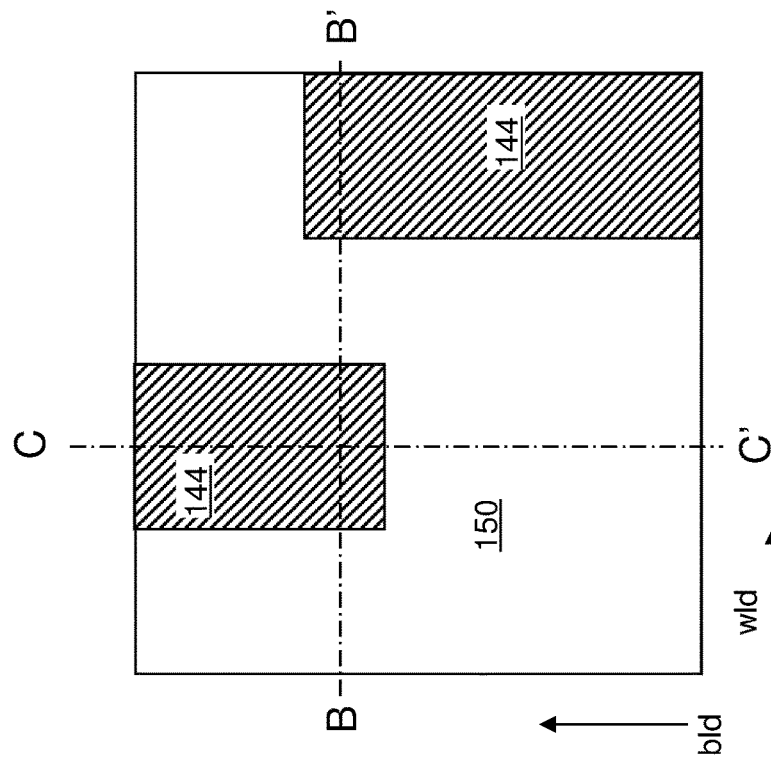
FIG. 27B
FIG. 27A

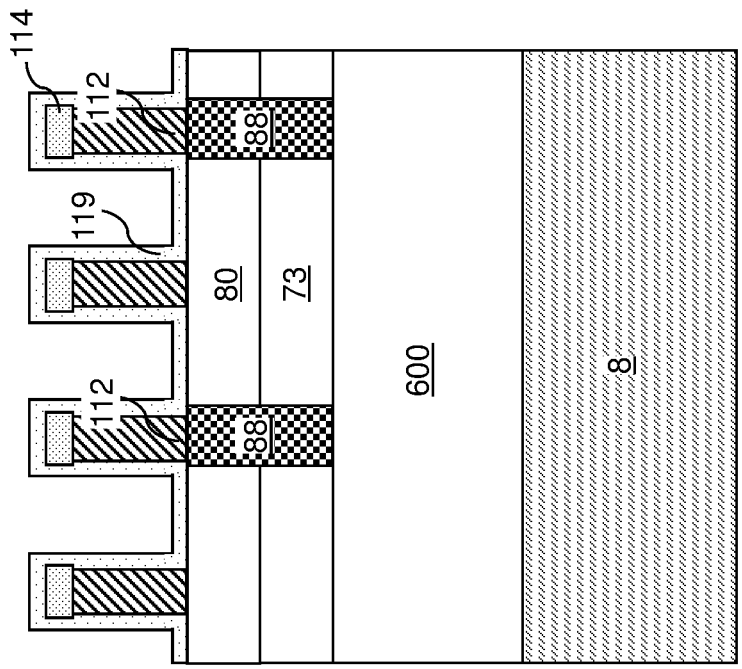
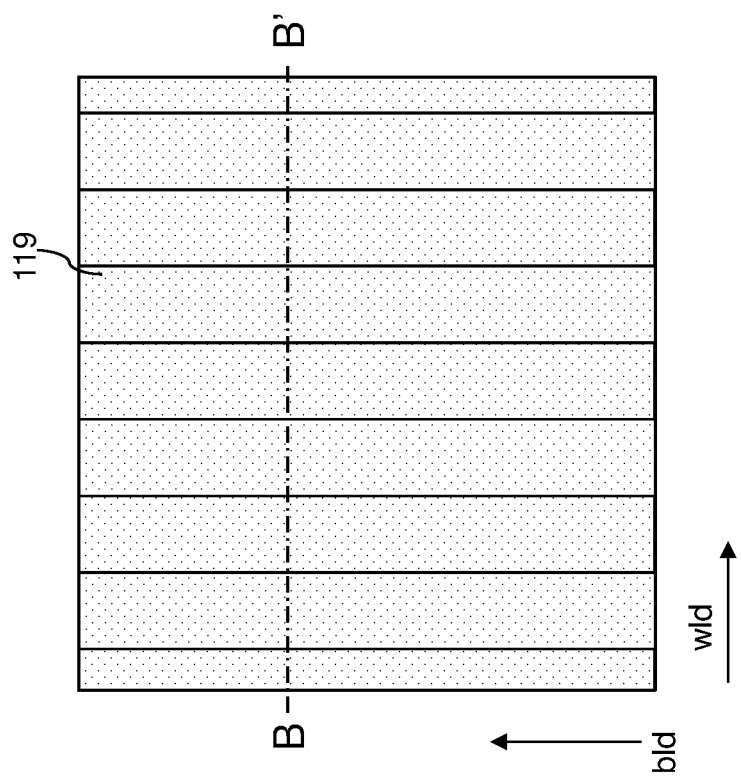
FIG. 29B
FIG. 29A

US 11,430,736 B2

1

SEMICONDUCTOR DEVICE INCLUDING HAVING METAL ORGANIC FRAMEWORK INTERLAYER DIELECTRIC LAYER BETWEEN METAL LINES AND METHODS OF FORMING THE SAME

FIELD

The present disclosure relates generally to the field of semiconductor devices, and particularly to a semiconductor device including metal organic framework interlayer dielectric layer between metal lines and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a semiconductor structure is provided, which comprises: first metal lines located above at least one semiconductor device; and a continuous metal organic framework (MOF) material layer including lower MOF portions that are located between neighboring pairs of first metal lines and an upper MOF matrix portion that continuously extends over the first metal lines and connected to each of the lower MOF portions, wherein each of the lower MOF portions is located below a first horizontal plane containing bottom surfaces of the upper MOF matrix portion, and the upper MOF matrix portion has a top surface within a second horizontal plane.

According to another embodiment of the present disclosure, a method of forming a semiconductor structure is provided, which comprises: forming at least one semiconductor device over a substrate; forming first metal lines laterally extending along a first horizontal direction and laterally spaced apart along a second horizontal direction over the at least one semiconductor device; forming a metal-containing precursor layer on sidewalls of the first metal lines; and forming a continuous metal organic framework (MOF) material layer by reacting the metal-containing precursor layer with a vapor of a linking compound, wherein the continuous metal organic framework (MOF) material layer comprises lower MOF portions that fills volumes between neighboring pairs of first metal lines and an upper MOF matrix portion that continuously extends over the first metal lines and connected to each of the lower MOF portions.

BRIEF DESCRIPTION OF THE DRAWINGS

FIGS. 5A-5H are sequential schematic vertical cross-sectional views of a memory opening within the exemplary structure during formation of a memory stack structure, an optional dielectric core, and a drain region therein according to an embodiment of the present disclosure.

FIGS. 9A-9D are sequential vertical cross-sectional views of a region of the exemplary structure during formation of electrically conductive layers according to an embodiment of the present disclosure.

FIG. 15A is a top-down view of a first configuration of the portion of the memory array region of the exemplary structure after formation of a metal-containing precursor layer for formation of a continuous metal organic framework (MOF) layer according to an embodiment of the present disclosure.

FIG. 15B is a schematic vertical cross-sectional view of the first configuration of the exemplary structure along the vertical plane B-B' of FIG. 15A.

FIG. 18A is a top-down view of the first configuration of the portion of the memory array region of the exemplary structure after deposition of at least one metallic material in the via cavities and over the upper MOF matrix portion according to an embodiment of the present disclosure.

FIG. 18B is a schematic vertical cross-sectional view of the first configuration of the exemplary structure along the vertical plane B-B' of FIG. 18A.

FIG. 20A is a top-down view of the first configuration of the portion of the memory array region of the exemplary structure after formation of a dielectric material layer and second integrated line-and-via structures including third metal lines and second metal via structures according to an embodiment of the present disclosure.

FIG. 20B is a schematic vertical cross-sectional view of the first configuration of the exemplary structure along the vertical plane B-B' of FIG. 20A.

FIG. 24A is a top-down view of the second configuration of the portion of the memory array region of the exemplary structure after formation of a continuous metal organic framework (MOF) material layer according to an embodiment of the present disclosure.

FIG. 24B is a schematic vertical cross-sectional view of the second configuration of the exemplary structure along the vertical plane B-B' of FIG. 24A.

FIG. 27A is a top-down view of the second configuration of the portion of the memory array region of the exemplary structure after formation of a dielectric material layer and second integrated line-and-via structures including third metal lines and second metal via structures according to an embodiment of the present disclosure.

FIG. 27B is a schematic vertical cross-sectional view of the second configuration of the exemplary structure along the vertical plane B-B' of FIG. 27A.

FIG. 29A is a top-down view of a fourth configuration of the portion of the memory array region of the exemplary structure after formation of a metal-containing precursor layer for formation of a continuous metal organic framework (MOF) layer according to an embodiment of the present disclosure.

FIG. 29B is a schematic vertical cross-sectional view of the second configuration of the exemplary structure along the vertical plane B-B' of FIG. 29A.

DETAILED DESCRIPTION

Figure 1:
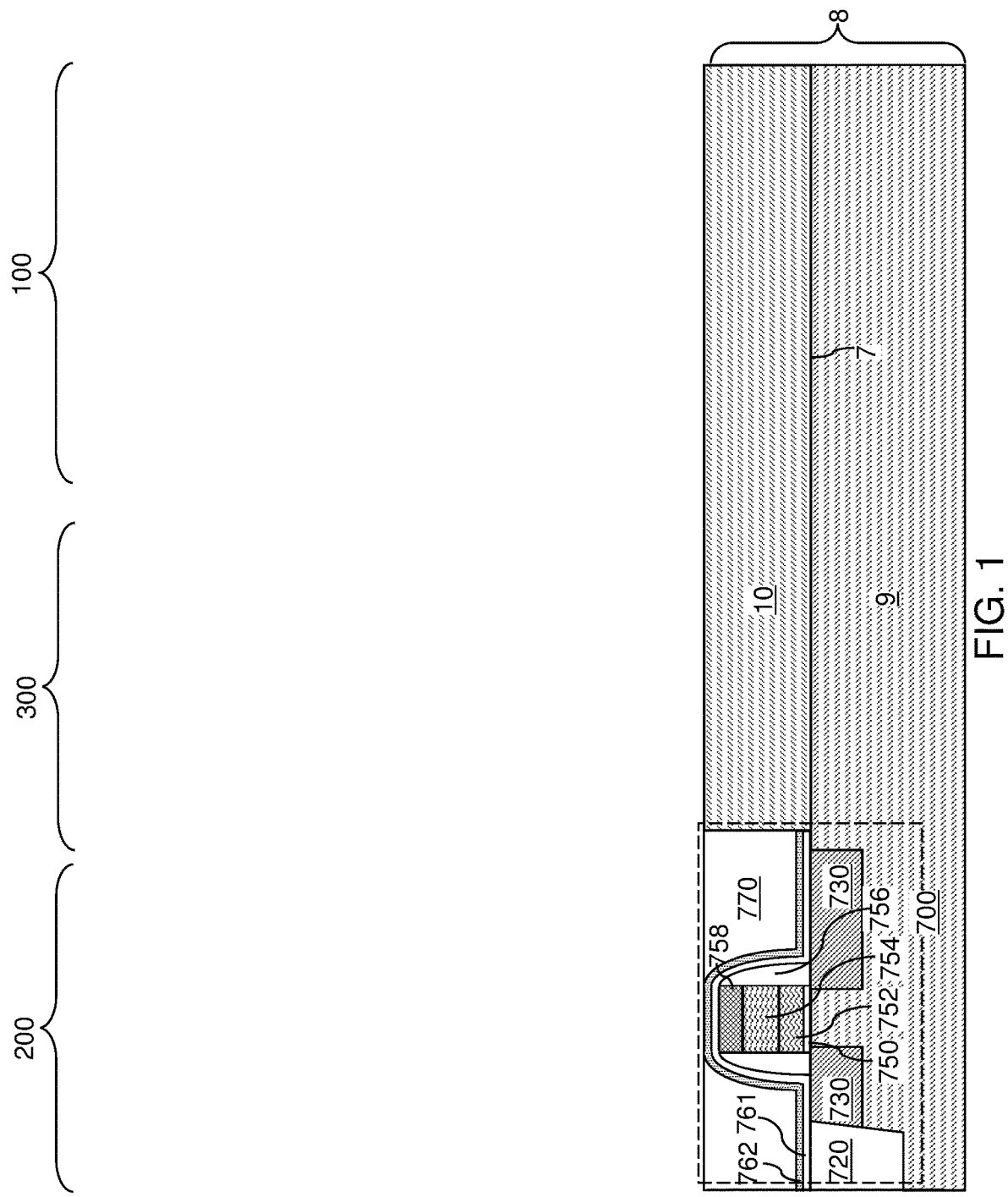
FIG. 1 is a schematic vertical cross-sectional view of an exemplary structure after formation of at least one peripheral device and a semiconductor material layer according to an embodiment of the present disclosure.

As discussed above, the embodiments of the present disclosure are directed to a semiconductor device including a metal organic framework (MOF) interlayer dielectric layer located between and/or over metal lines, such as bit lines of a memory device, and methods of manufacturing the same, the various aspects of which are discussed herein in detail. Metal organic framework (MOF) dielectric materials have a low density and a large pore volume. As such, MOF dielectric materials have a low dielectric constant, which is advantageous in reducing RC delay in metal lines. The MOF interlayer dielectric layer can be deposited in a single step between and over the metal lines, thus simplifying the device fabrication process. In one embodiment, the metal lines may comprise a barrierless metal, such as ruthenium or molybdenum without a high resistivity metal nitride diffusion barrier layer, which reduces the resistivity of the metal lines.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Referring to FIG. 1, an exemplary structure according to an embodiment of the present disclosure is illustrated, which can be employed, for example, to fabricate a device structure containing vertical NAND memory devices. The exemplary structure includes a substrate (9, 10), which can be a semiconductor substrate. The substrate can include a substrate semiconductor layer 9 and an optional semiconductor material layer 10. The substrate semiconductor layer 9 may be a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a top surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the semiconductor substrate layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 770 can be removed, for example, by chemical mechanical planarization (CMP). In this case, the semiconductor material layer 10 can have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200. In an alternative embodiment, the at least one semiconductor device 700 is formed under the memory array region 100 in a CMOS under array ("CUA") configuration. In this case, the peripheral device region 200 may be omitted or used in combination with the CUA configuration. In another alternative embodiment, the at least one semiconductor device 700 may be formed on a separate substrate and then bonded to substrate (9, 10) containing the memory array region 100.

Figure 2:
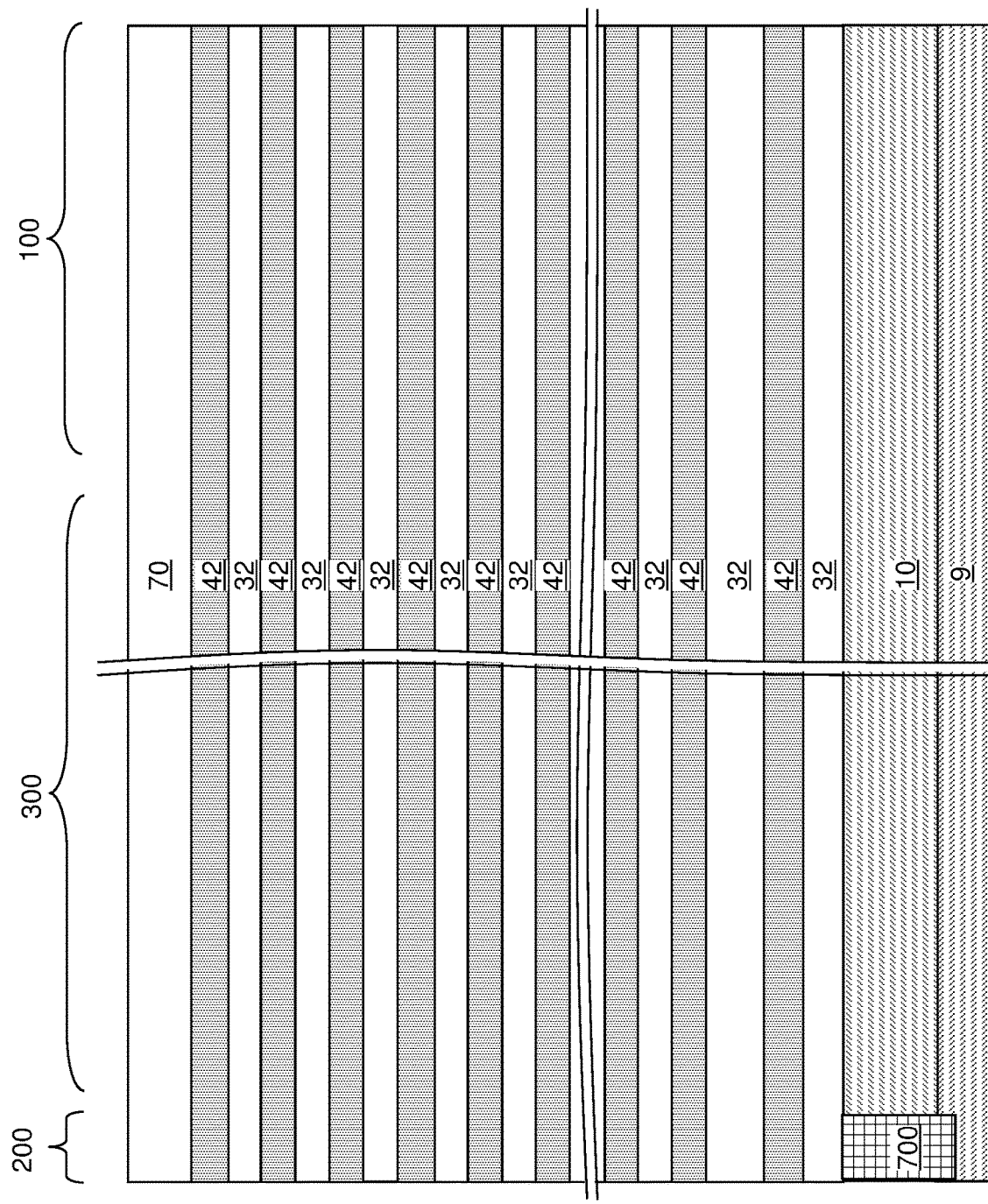
FIG. 2 is a schematic vertical cross-sectional view of the exemplary structure after formation of an in-process alternating stack of spacer material layers and sacrificial material layers according to an embodiment of the present disclosure.

Referring to FIG. 2, a stack of an alternating plurality of first material layers (which can be insulating layers 32) and second material layers (which can be sacrificial material layer 42) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3:
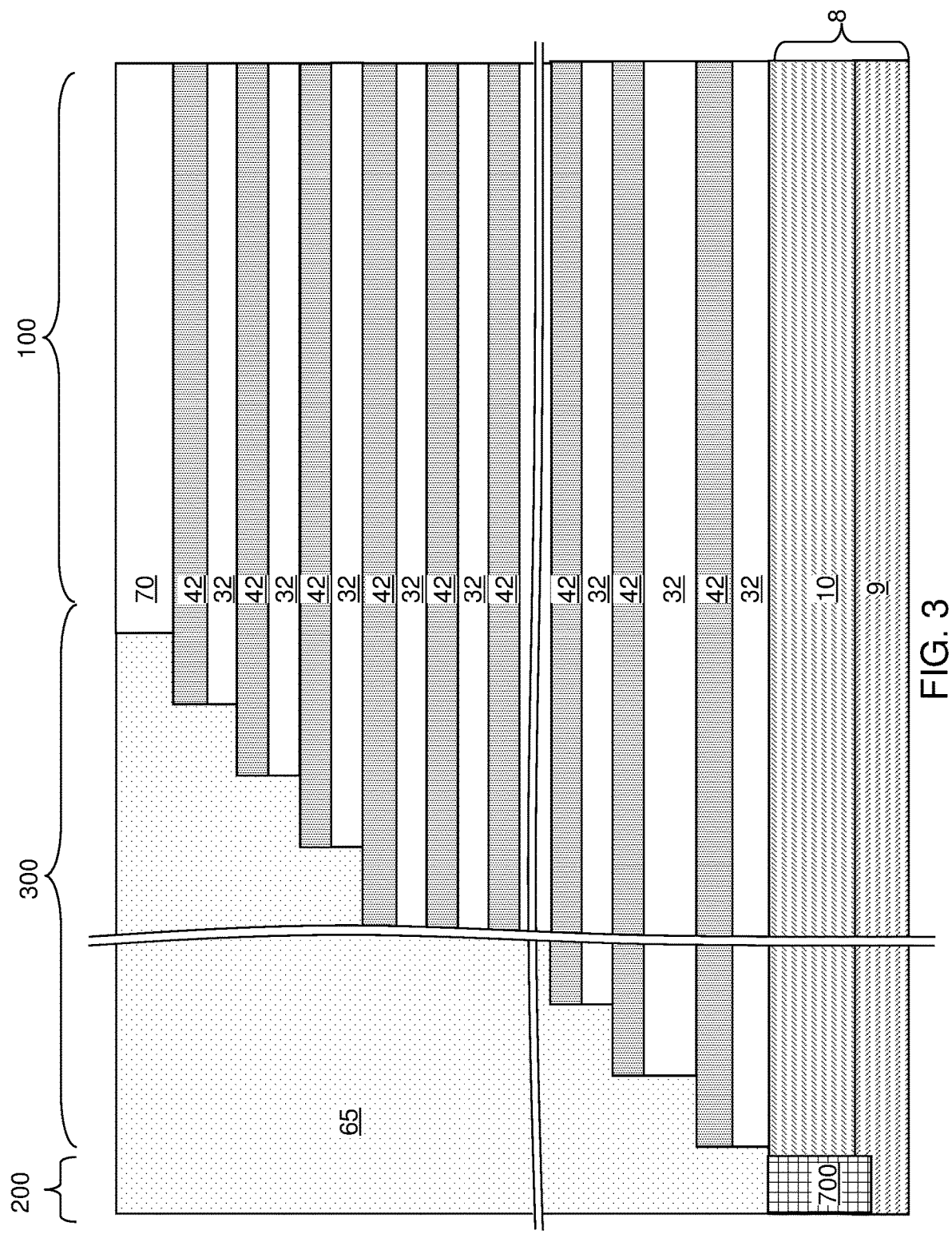
FIG. 3 is a schematic vertical cross-sectional view of the exemplary structure after formation of stepped terraces and a retro-stepped spacer material portion according to an embodiment of the present disclosure.

Referring to FIG. 3, stepped surfaces are formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the contact region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain select level isolation structures 72 can be formed through the insulating cap layer 70 and a subset of the sacrificial material layers 42 located at drain select levels. The drain select level isolation structures 72 can be formed, for example, by forming drain select level isolation trenches and filling the drain select level isolation trenches with a dielectric material such as silicon oxide. Excess portions of the dielectric material can be removed from above the top surface of the insulating cap layer 70.

Figure 4A:
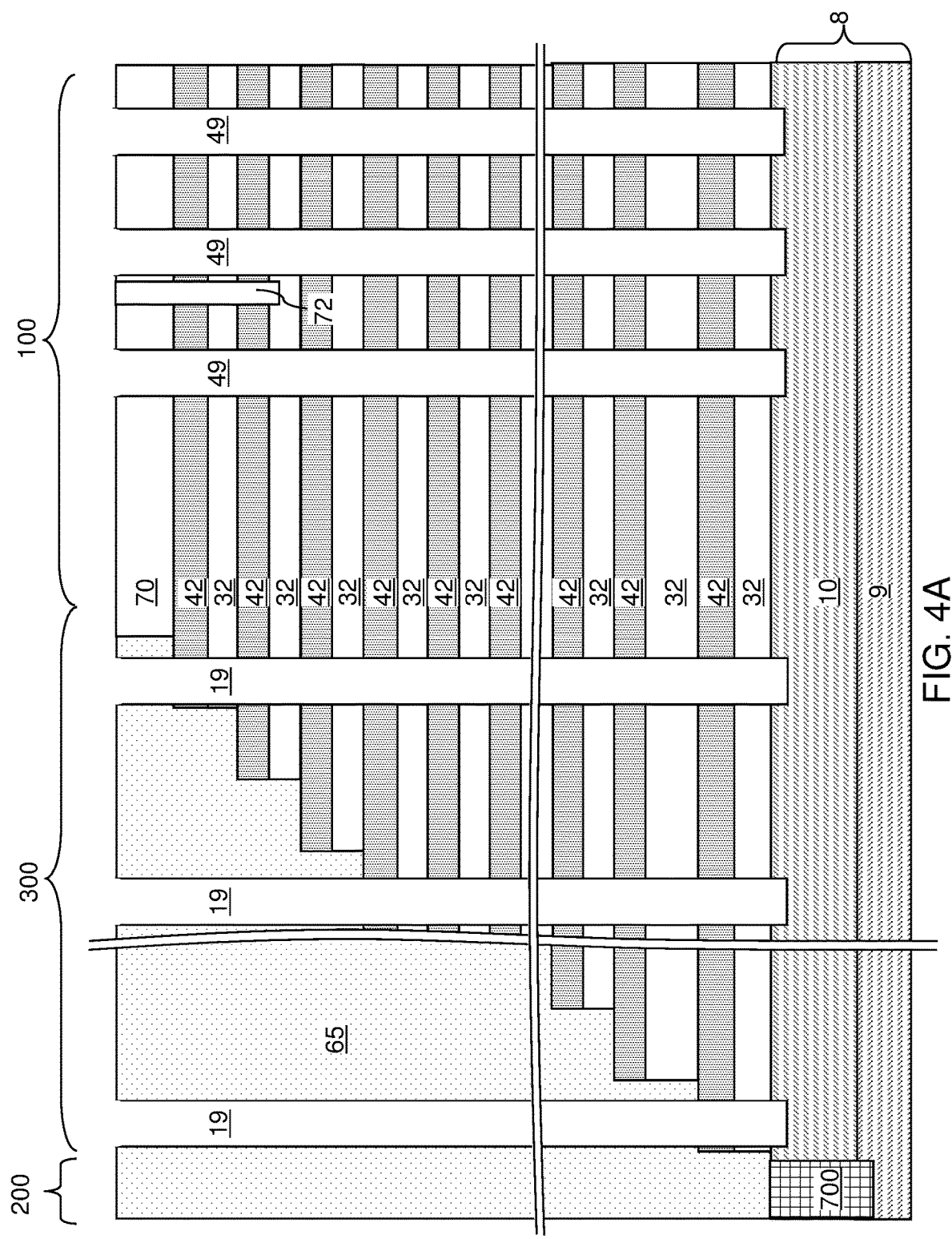
FIG. 4A is a schematic vertical cross-sectional view of the exemplary structure after formation of memory openings and support openings according to an embodiment of the present disclosure.
Figure 4B:
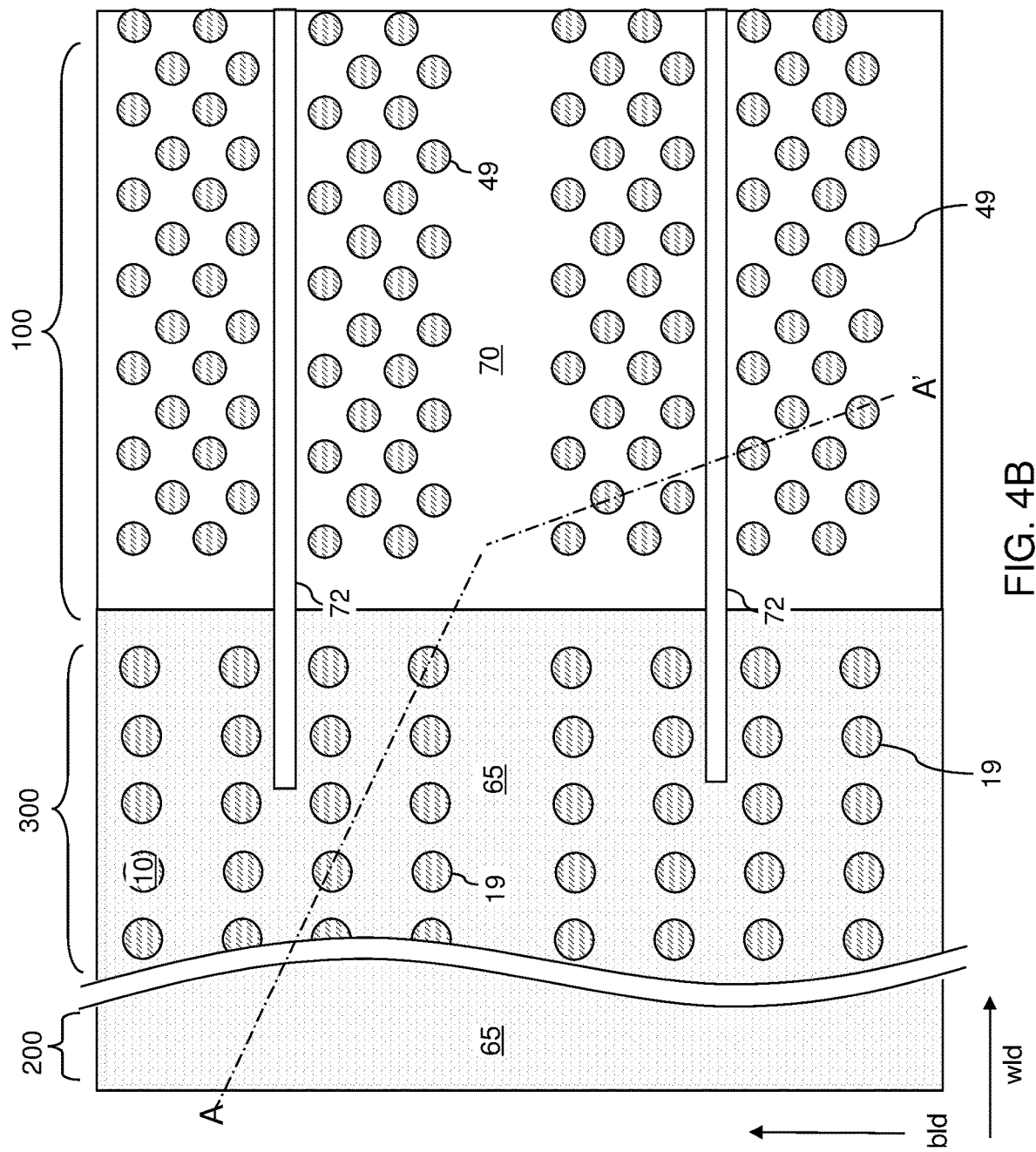
FIG. 4B is a top-down view of the exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the contact region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extended to a top surface of the substrate semiconductor layer 9.

FIGS. 5A-5H illustrate structural changes in a memory opening 49, which is one of the memory openings 49 in the exemplary structure of FIGS. 4A and 4B. The same structural change occurs simultaneously in each of the other memory openings 49 and in each support opening 19.

Referring to FIG. 5A, a memory opening 49 in the exemplary device structure of FIGS. 4A and 4B is illustrated. The memory opening 49 extends through the insulating cap layer 70, the alternating stack (32, 42), and optionally into an upper portion of the semiconductor material layer 10. At this processing step, each support opening 19 can extend through the retro-stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 5B, an optional pedestal channel portion (e.g., an epitaxial pedestal) 11 can be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the semiconductor material layer 10. In one embodiment, the pedestal channel portion 11 can have a doping of the first conductivity type, which is the same as the conductivity type of the semiconductor material layer 10 that the pedestal channel portion contacts. If a semiconductor material layer 10 is not present, the pedestal channel portion 11 can be formed directly on the substrate semiconductor layer 9, which can have a doping of the first conductivity type.

Referring to FIG. 5C, a stack of layers including a blocking dielectric layer 52, a charge storage layer 54, a tunneling dielectric layer 56, and an optional first semiconductor channel layer 601 can be sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. Alternatively or additionally, the blocking dielectric layer 52 can include a dielectric semiconductor compound such as silicon oxide, silicon oxynitride, silicon nitride, or a combination thereof.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A memory cavity 49' is formed in the volume of each memory opening 49 that is not filled with the deposited material layers (52, 54, 56, 601).

Referring to FIG. 5D, the optional first semiconductor channel layer 601, the tunneling dielectric layer 56, the charge storage layer 54, the blocking dielectric layer 52 are sequentially anisotropically etched employing at least one anisotropic etch process. The portions of the first semiconductor channel layer 601, the tunneling dielectric layer 56, the charge storage layer 54, and the blocking dielectric layer 52 located above the top surface of the insulating cap layer 70 can be removed by the at least one anisotropic etch process. Further, the horizontal portions of the first semiconductor channel layer 601, the tunneling dielectric layer 56, the charge storage layer 54, and the blocking dielectric layer 52 at a bottom of each memory cavity 49' can be removed to form openings in remaining portions thereof. Each of the first semiconductor channel layer 601, the tunneling dielectric layer 56, the charge storage layer 54, and the blocking dielectric layer 52 can be etched by a respective anisotropic etch process employing a respective etch chemistry, which may, or may not, be the same for the various material layers.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers 42 constitutes a charge storage region.

A surface of the pedestal channel portion 11 (or a surface of the semiconductor material layer 10 in case the pedestal channel portions 11 are not employed) can be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor material layer 10 in case pedestal channel portions 11 are not employed) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (comprising portions of the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 can have vertically coincident sidewalls.

Referring to FIG. 5E, a second semiconductor channel layer 602 can be deposited directly on the semiconductor surface of the pedestal channel portion 11 or the semiconductor material layer 10 if the pedestal channel portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the memory cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 5F, in case the memory cavity 49' in each memory opening is not completely filled by the second semiconductor channel layer 602, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Figure 5H:
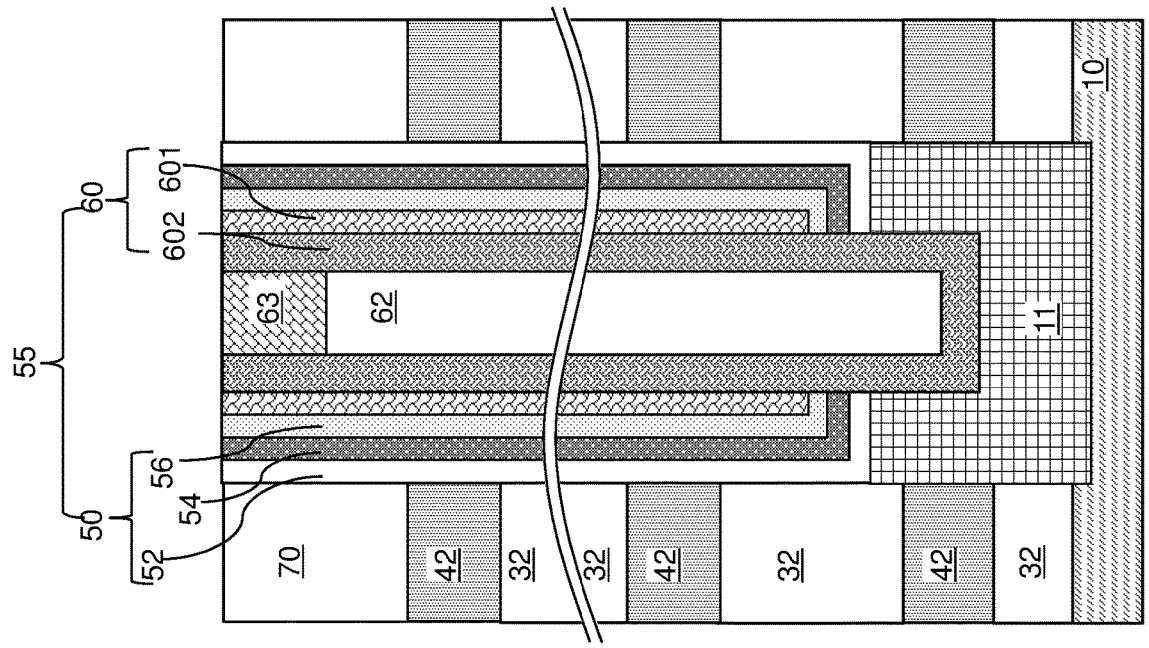
Figure 5G:
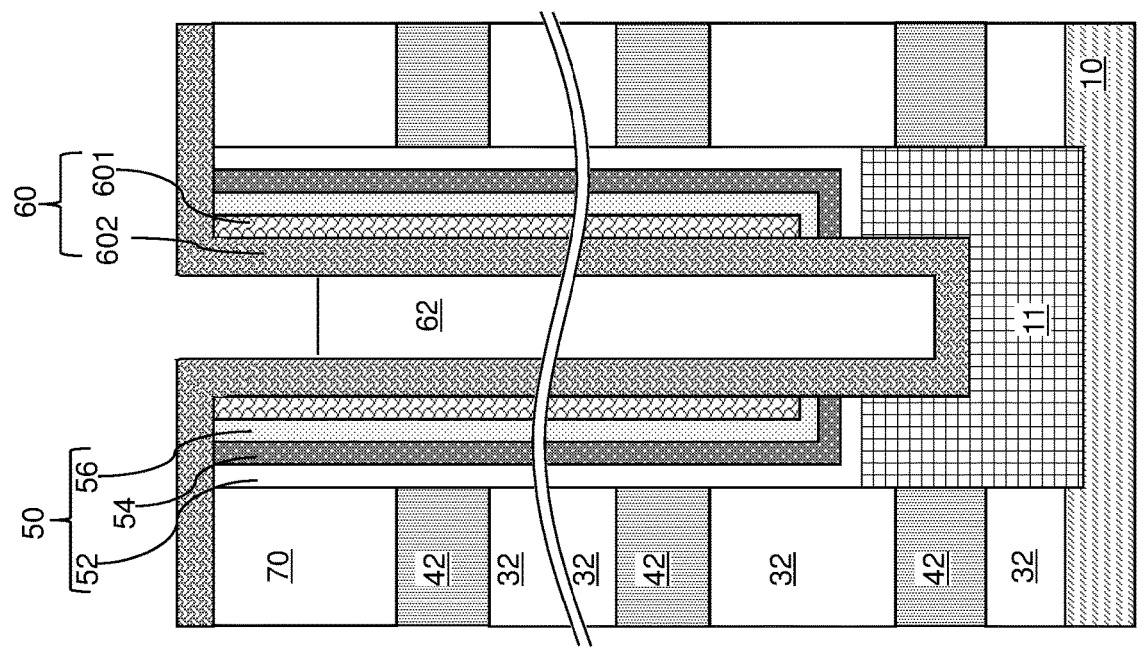

Referring to FIG. 5G, the horizontal portion of the dielectric core layer 62L can be removed, for example, by a recess etch from above the top surface of the insulating cap layer 70. Each remaining portion of the dielectric core layer 62L constitutes a dielectric core 62. Further, the horizontal portion of the second semiconductor channel layer 602 located above the top surface of the insulating cap layer 70 can be removed by a planarization process, which can employ a recess etch or chemical mechanical planarization (CMP). Each remaining portion of the second semiconductor channel layer 602 can be located entirely within a memory opening 49 or entirely within a support opening 19.

Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Referring to FIG. 5H, the top surface of each dielectric core 62 can be further recessed within each memory opening, for example, by a recess etch to a depth that is located between the top surface of the insulating cap layer 70 and the bottom surface of the insulating cap layer 70. Drain regions 63 can be formed by depositing a doped semiconductor material within each recessed region above the dielectric cores 62. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0 \times 10^{19}/cm^3$ to $2.0 \times 10^{21}/cm^3$, although lesser and greater dopant concentrations can also be employed. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Each combination of a memory film 50 and a vertical semiconductor channel 60 within a memory opening 49 constitutes a memory stack structure 55. The memory stack structure 55 is a combination of a semiconductor channel, a tunneling dielectric layer, a plurality of memory elements comprising portions of the charge storage layer 54, and an optional blocking dielectric layer 52. Each combination of a pedestal channel portion 11 (if present), a memory stack structure 55, a dielectric core 62, and a drain region 63 within a memory opening 49 is herein referred to as a memory opening fill structure (11, 55, 62, 63). Each combination of a pedestal channel portion 11 (if present), a memory film 50, a vertical semiconductor channel 60, a dielectric core 62, and a drain region 63 within each support opening 19 fills the respective support openings 19, and constitutes a support pillar structure.

Figure 6:
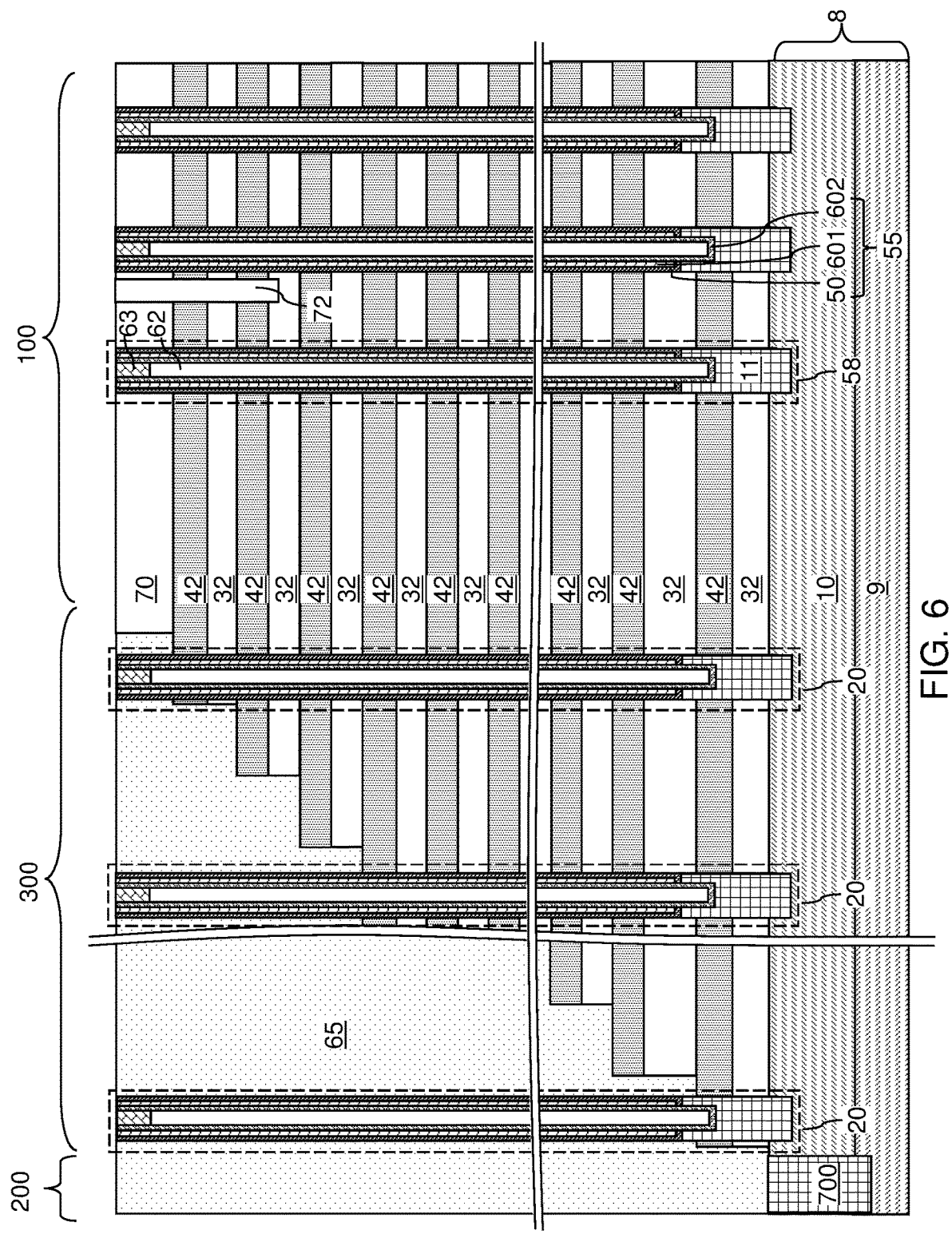
FIG. 6 is a schematic vertical cross-sectional view of the exemplary structure after formation of memory stack structures and support pillar structures according to an embodiment of the present disclosure.

Referring to FIG. 6, the exemplary structure is illustrated after formation of memory opening fill structures (11, 55, 62, 63) and support pillar structure 20 within the memory openings 49 and the support openings 19, respectively. An instance of a memory opening fill structure (11, 55, 62, 63) can be formed within each memory opening 49 of the structure of FIGS. 4A and 4B. An instance of the support pillar structure 20 can be formed within each support opening 19 of the structure of FIGS. 4A and 4B.

Each memory stack structure 55 includes a vertical semiconductor channel 60, which may comprise multiple semiconductor channel layers (601, 602), and a memory film 50. The memory film 50 may comprise a tunneling dielectric layer 56 laterally surrounding the vertical semiconductor channel 60 and a vertical stack of charge storage regions (comprising portions of the charge storage layer 54) laterally surrounding the tunneling dielectric layer 56 and an optional blocking dielectric layer 52. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

Figure 7A:
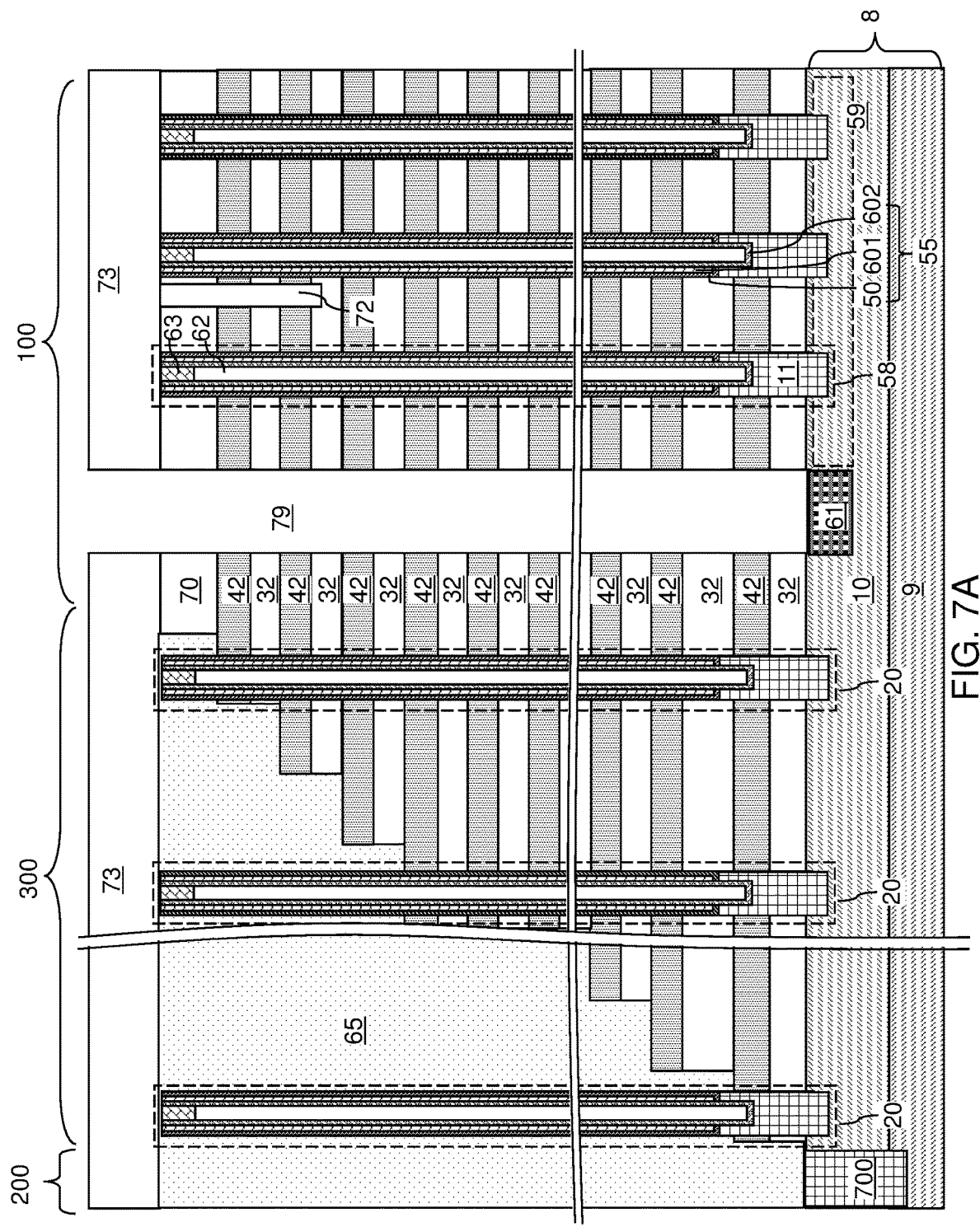
FIG. 7A is a schematic vertical cross-sectional view of the exemplary structure after formation of a first contact-level dielectric layer, backside trenches, and source regions according to an embodiment of the present disclosure.
Figure 7B:
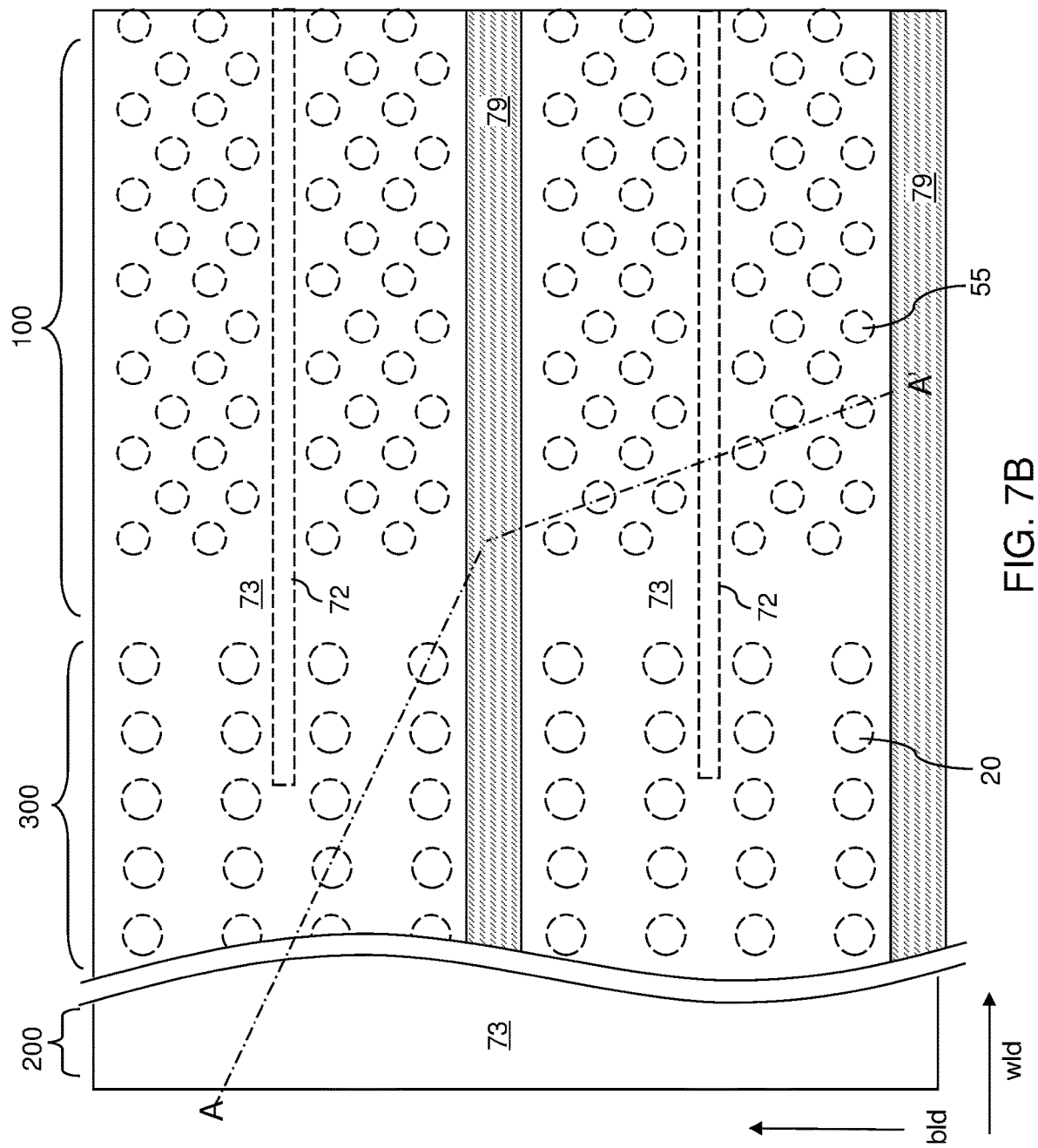
FIG. 7B is a partial see-through top-down view of the exemplary structure of FIG. 7A. The vertical plane A-A' is the plane of the schematic vertical cross-sectional view of FIG. 7A.

Referring to FIGS. 7A and 7B, a first contact-level dielectric layer 73 can be formed over the alternating stack (32, 42) of insulating layer 32 and sacrificial material layers 42, and over the memory stack structures 55 and the support pillar structures 20. The first contact-level dielectric layer 73 includes a dielectric material that is different from the dielectric material of the sacrificial material layers 42. For example, the first contact-level dielectric layer 73 can include silicon oxide. The first contact-level dielectric layer 73 can have a thickness in a range from 50 nm to 500 nm, although lesser and greater thicknesses can also be employed.

A photoresist layer (not shown) can be applied over the first contact-level dielectric layer 73, and is lithographically patterned to form openings in areas between clusters of memory stack structures 55. The pattern in the photoresist layer can be transferred through the first contact-level dielectric layer 73, the alternating stack (32, 42) and/or the retro-stepped dielectric material portion 65 employing an anisotropic etch to form backside trenches 79, which vertically extend from the top surface of the first contact-level dielectric layer 73 at least to the top surface of the substrate (9, 10), and laterally extend through the memory array region 100 and the contact region 300.

In one embodiment, the backside trenches 79 can laterally extend along a first horizontal direction (e.g., word line direction) "wld" and can be laterally spaced apart among one another along a second horizontal direction (e.g., bit line direction) "bld" that is perpendicular to the first horizontal direction. The memory stack structures 55 can be arranged in rows that extend along the first horizontal direction. The drain select level isolation structures 72 can laterally extend along the first horizontal direction. Each backside trench 79 can have a uniform width that is invariant along the lengthwise direction (i.e., along the first horizontal direction). Each drain select level isolation structure 72 can have a uniform vertical cross-sectional profile along vertical planes that are perpendicular to the first horizontal direction that is invariant with translation along the first horizontal direction. Multiple rows of memory stack structures 55 can be located between a neighboring pair of a backside trench 79 and a drain select level isolation structure 72, or between a neighboring pair of drain select level isolation structures 72. In one embodiment, the backside trenches 79 can include a source contact opening in which a source contact via structure can be subsequently formed. The photoresist layer can be removed, for example, by ashing.

A source region 61 can be formed at a surface portion of the semiconductor material layer 10 under each backside cavity 79' by implantation of electrical dopants into physically exposed surface portions of the semiconductor material layer 10. Each source region 61 is formed in a surface portion of the substrate (9, 10) that underlies a respective opening through the insulating spacer 74. An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11. Each source region 61 is formed in an upper portion of the semiconductor substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

Figure 8:
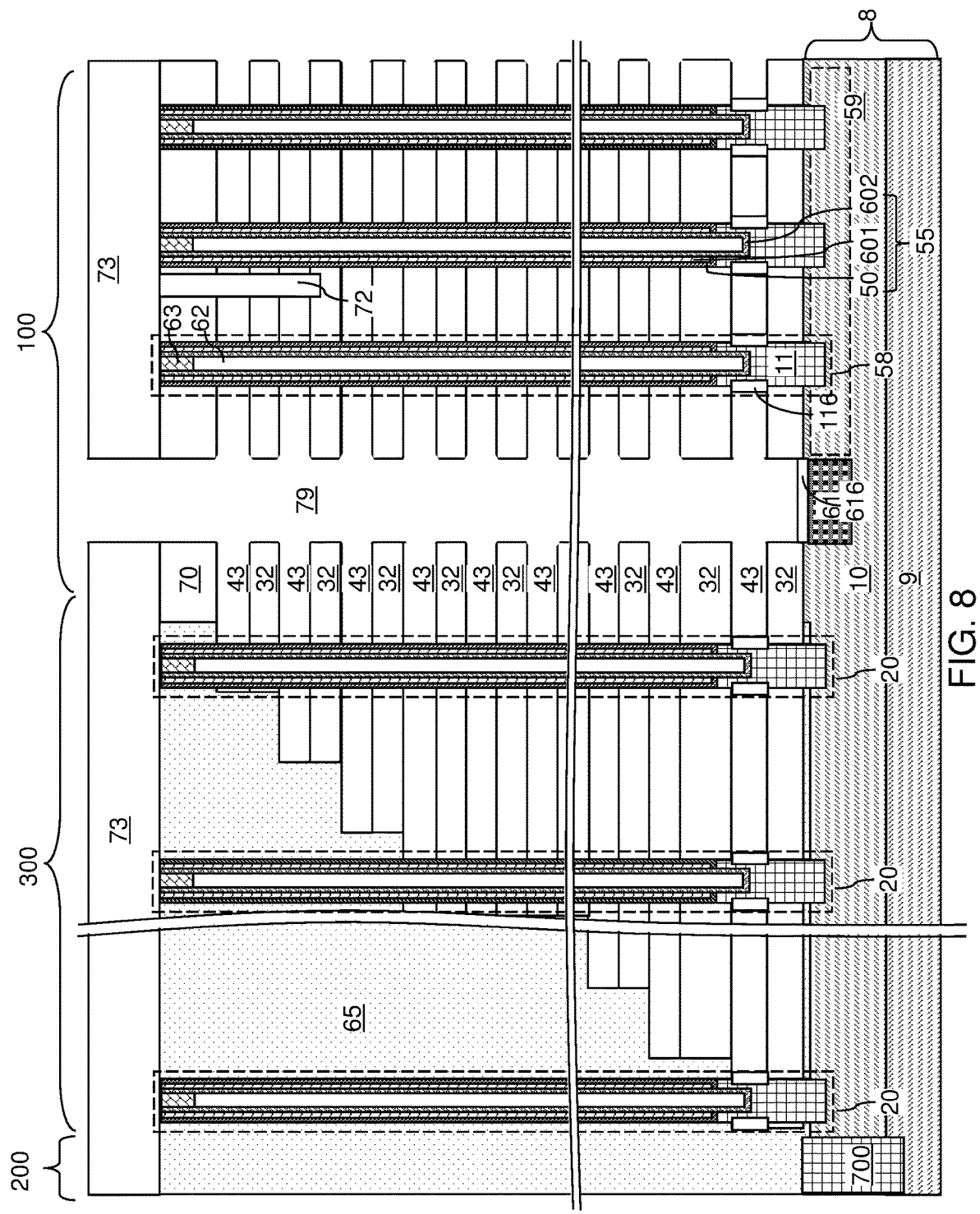
FIG. 8 is a schematic vertical cross-sectional view of the exemplary structure after formation of backside recesses, tubular dielectric spacers, and planar dielectric portions according to an embodiment of the present disclosure.

Referring to FIGS. 8 and 9A, an etchant that selectively etches the second material of the sacrificial material layers 42 with respect to the first material of the insulating layers 32 can be introduced into the backside trenches 79, for example, employing an etch process. FIG. 9A illustrates a region of the exemplary structure of FIG. 8. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Physically exposed surface portions of the optional pedestal channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

Referring to FIG. 9B, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer 44.

Referring to FIG. 9C, a metallic barrier layer 46A can be deposited in the backside recesses 43. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

Figure 10:
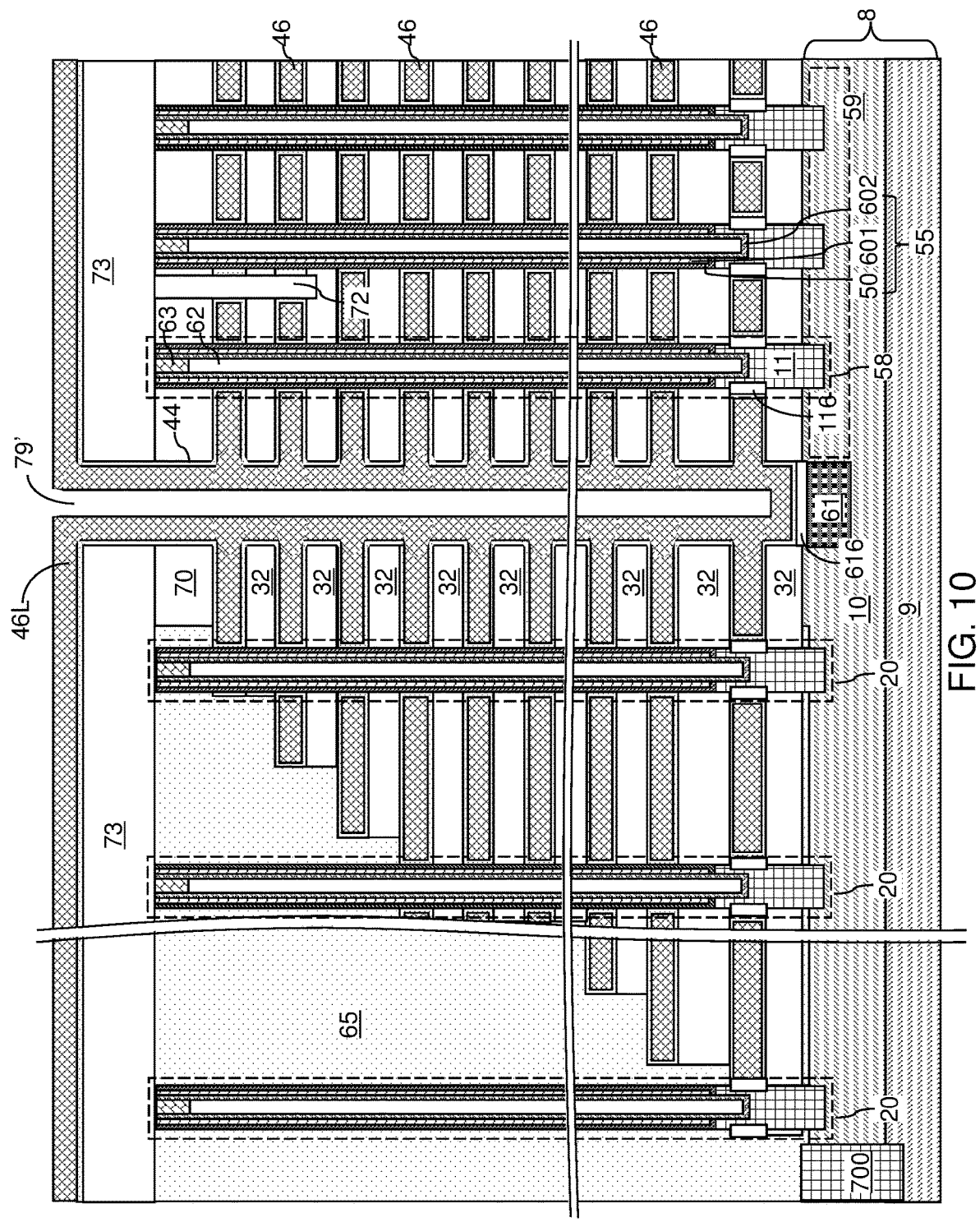
FIG. 10 is a schematic vertical cross-sectional view of the exemplary structure at the processing step of FIG. 9D.

Referring to FIGS. 9D and 10, a metal fill material is deposited in the plurality of backside recesses 43, on the sidewalls of the at least one the backside trench 79, and over the top surface of the first contact-level dielectric layer 73 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 can be formed in the plurality of backside recesses 43, and a continuous metallic material layer 46L can be formed on the sidewalls of each backside trench 79 and over the first contact-level dielectric layer 73. Each electrically conductive layer 46 includes a portion of the metallic barrier layer 46A and a portion of the metallic fill material layer 46B that are located between a vertically neighboring pair of dielectric material layers such as a pair of insulating layers 32. The continuous metallic material layer 46L includes a continuous portion of the metallic barrier layer 46A and a continuous portion of the metallic fill material layer 46B that are located in the backside trenches 79 or above the first contact-level dielectric layer 73.

Each sacrificial material layer 42 can be replaced with an electrically conductive layer 46. A backside cavity 79' is present in the portion of each backside trench 79 that is not filled with the backside blocking dielectric layer 44 and the continuous metallic material layer 46L. A tubular dielectric spacer 116 laterally surrounds a pedestal channel portion 11. A bottommost electrically conductive layer 46 laterally surrounds each tubular dielectric spacer 116 upon formation of the electrically conductive layers 46.

Figure 11A:
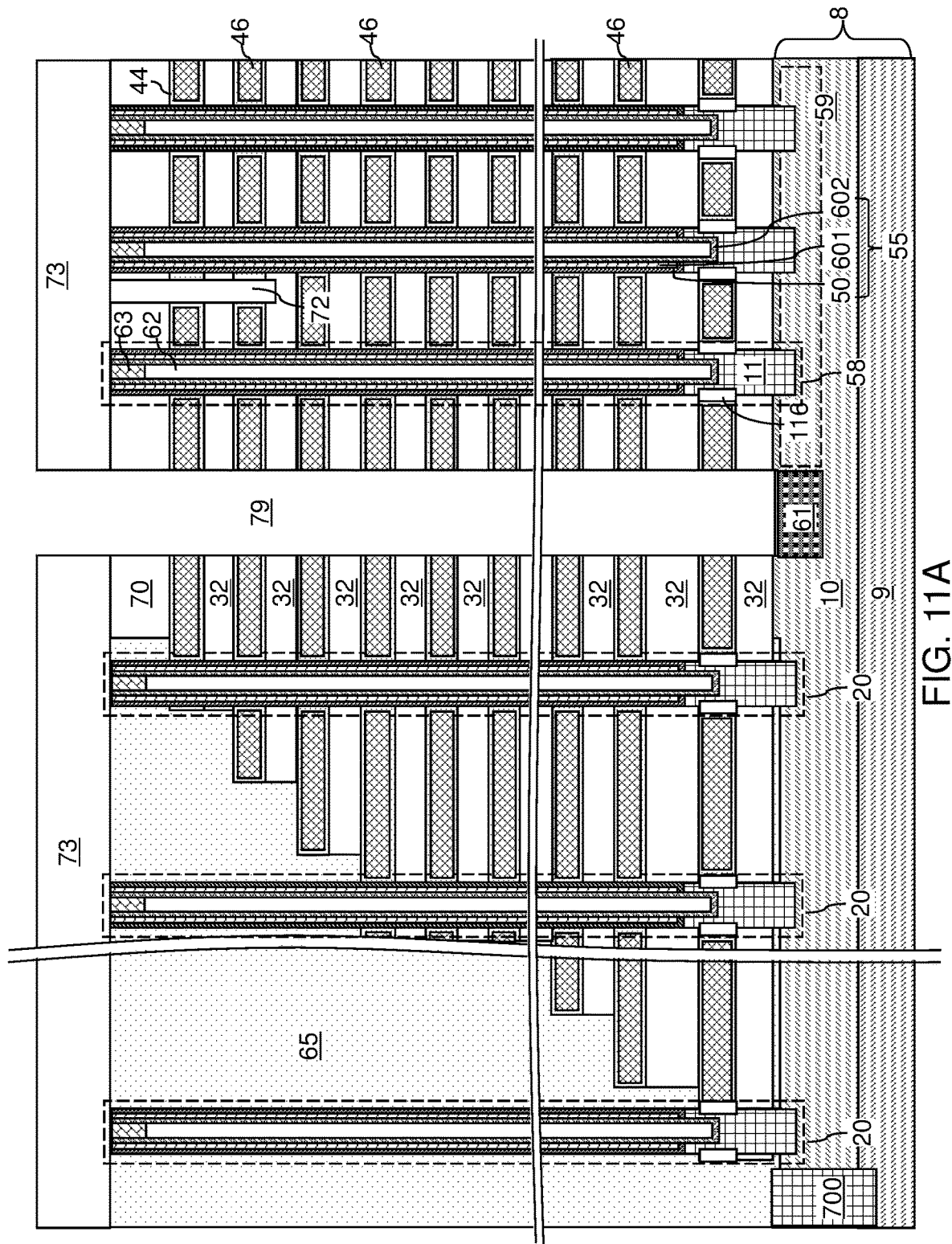
FIG. 11A is a schematic vertical cross-sectional view of the exemplary structure after removal of a deposited conductive material from within the backside trenches according to an embodiment of the present disclosure.
Figure 11B:
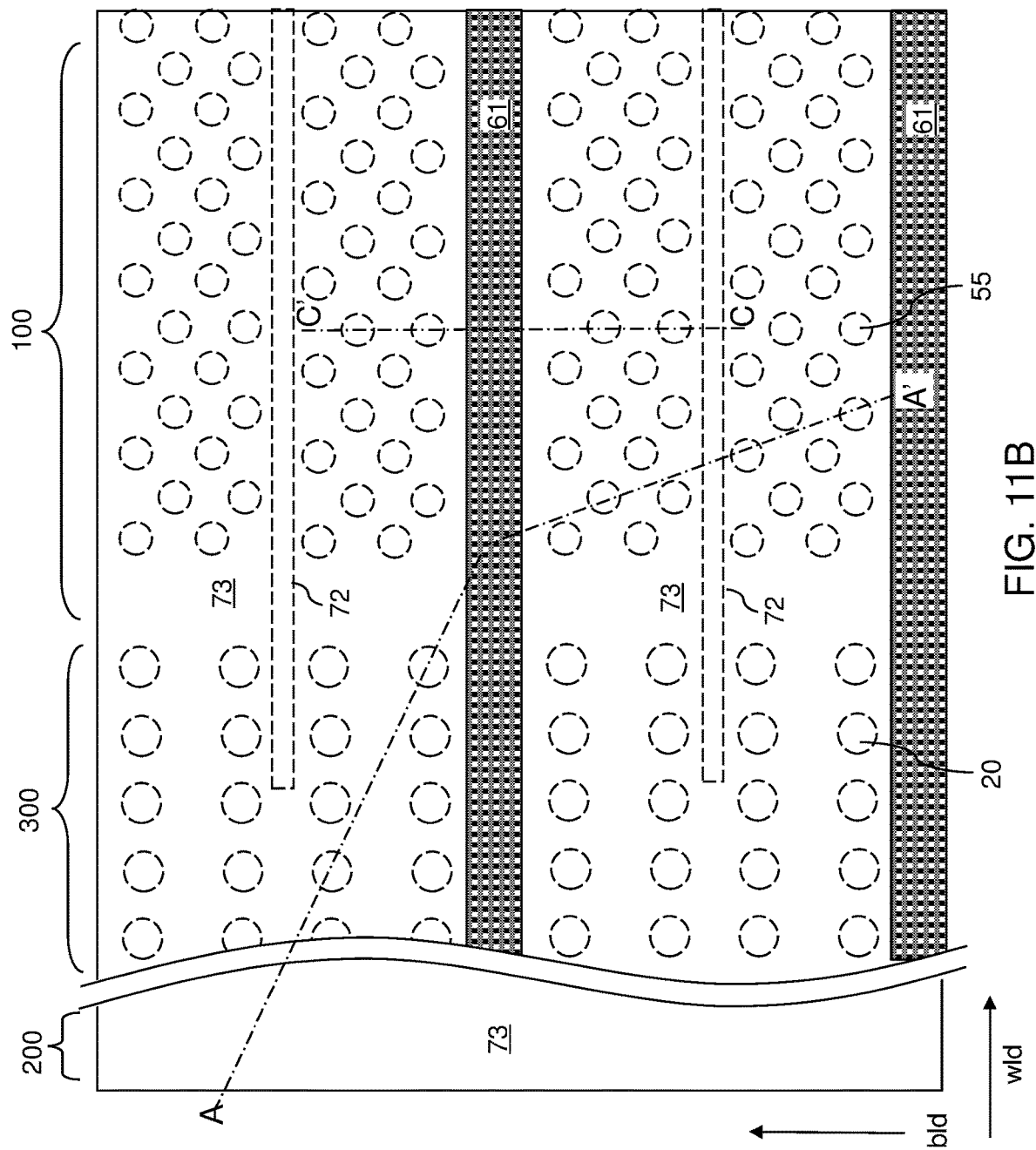
FIG. 11B is a partial see-through top-down view of the exemplary structure of FIG. 11A. The vertical plane A-A' is the plane of the schematic vertical cross-sectional view of FIG. 11A.

Referring to FIGS. 11A and 11B, the deposited metallic material of the continuous electrically conductive material layer 46L is etched back from the sidewalls of each backside trench 79 and from above the first contact-level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside trench 79. In another embodiment, the removal of the continuous electrically conductive material layer 46L may not be selective to the material of the backside blocking dielectric layer 44 or, the backside blocking dielectric layer 44 may not be employed. The planar dielectric portions 616 can be removed during removal of the continuous electrically conductive material layer 46L. A backside cavity 79' is present within each backside trench 79. At least one bottommost and at least one top most electrically conductive layer 46 provided upon formation of the electrically conductive layers 46 within the alternating stack (32, 46) can comprise respective source-side and drain-side select gate electrodes for the NAND strings.

Figure 12:
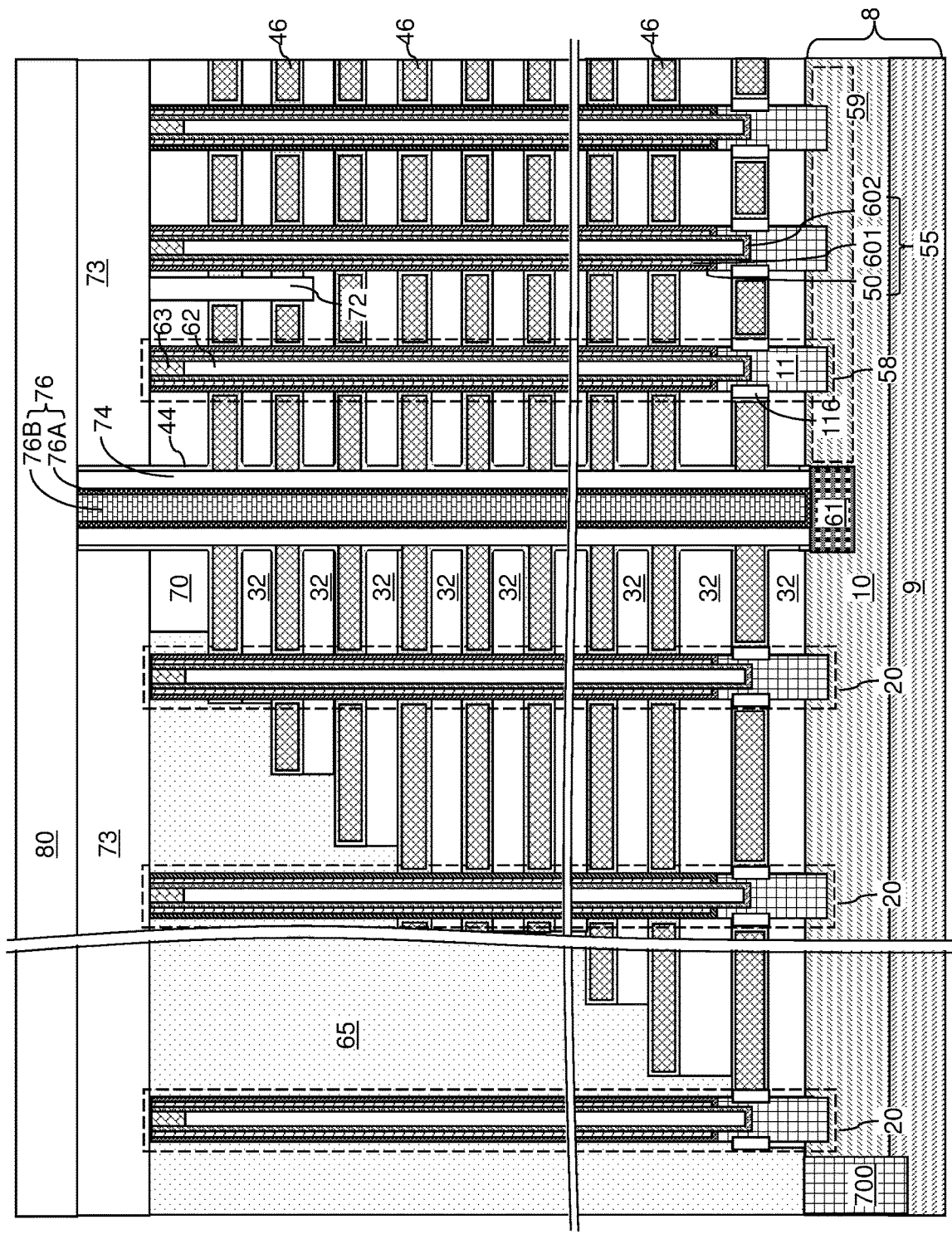
FIG. 12 is a vertical cross-sectional view of the exemplary structure after formation of backside contact via structures and a second contact-level dielectric layer according to an embodiment of the present disclosure.
Figure 13A:
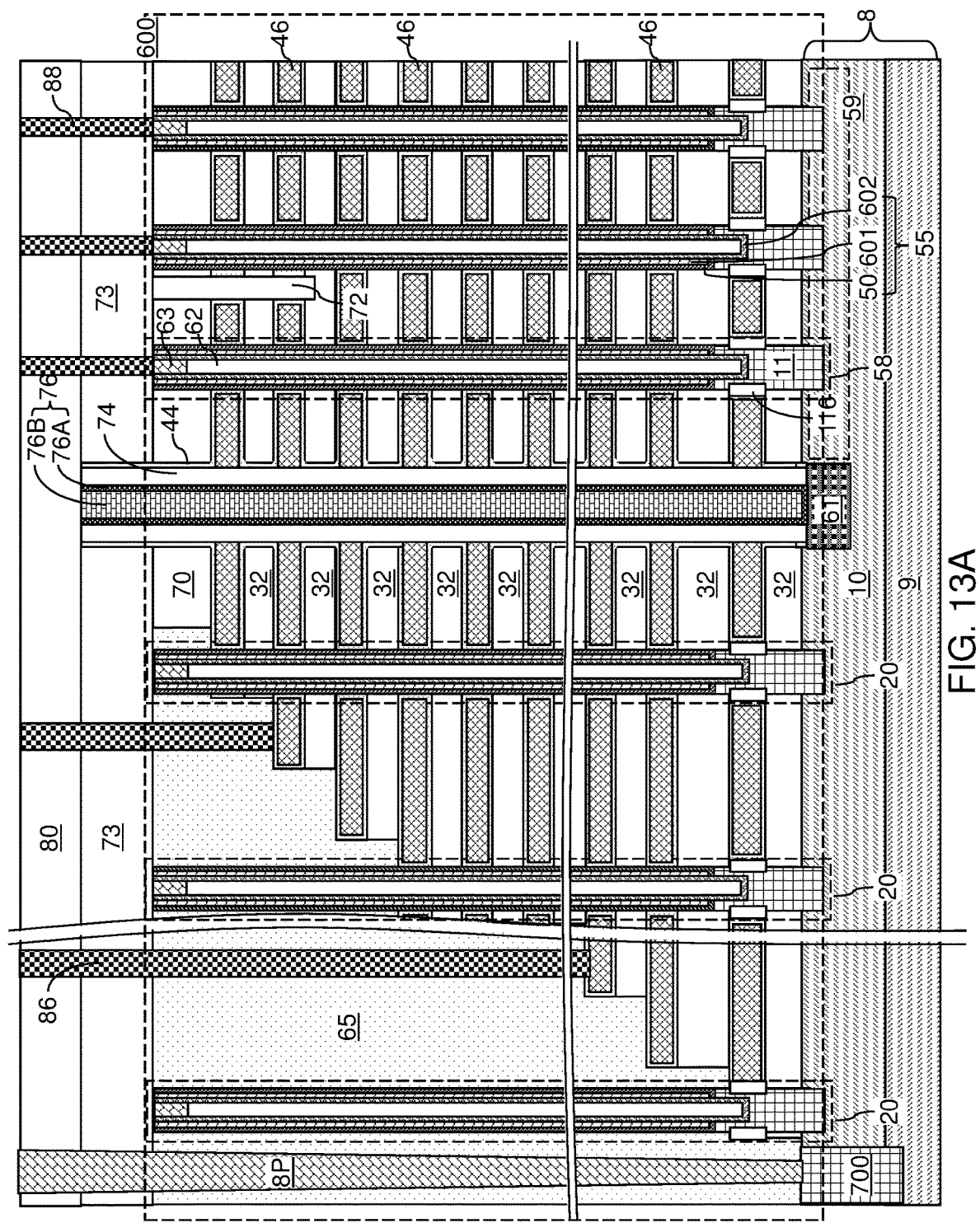
FIG. 13A is a vertical cross-sectional view of the exemplary structure after formation of various contact via structures according to an embodiment of the present disclosure.
Figure 13B:
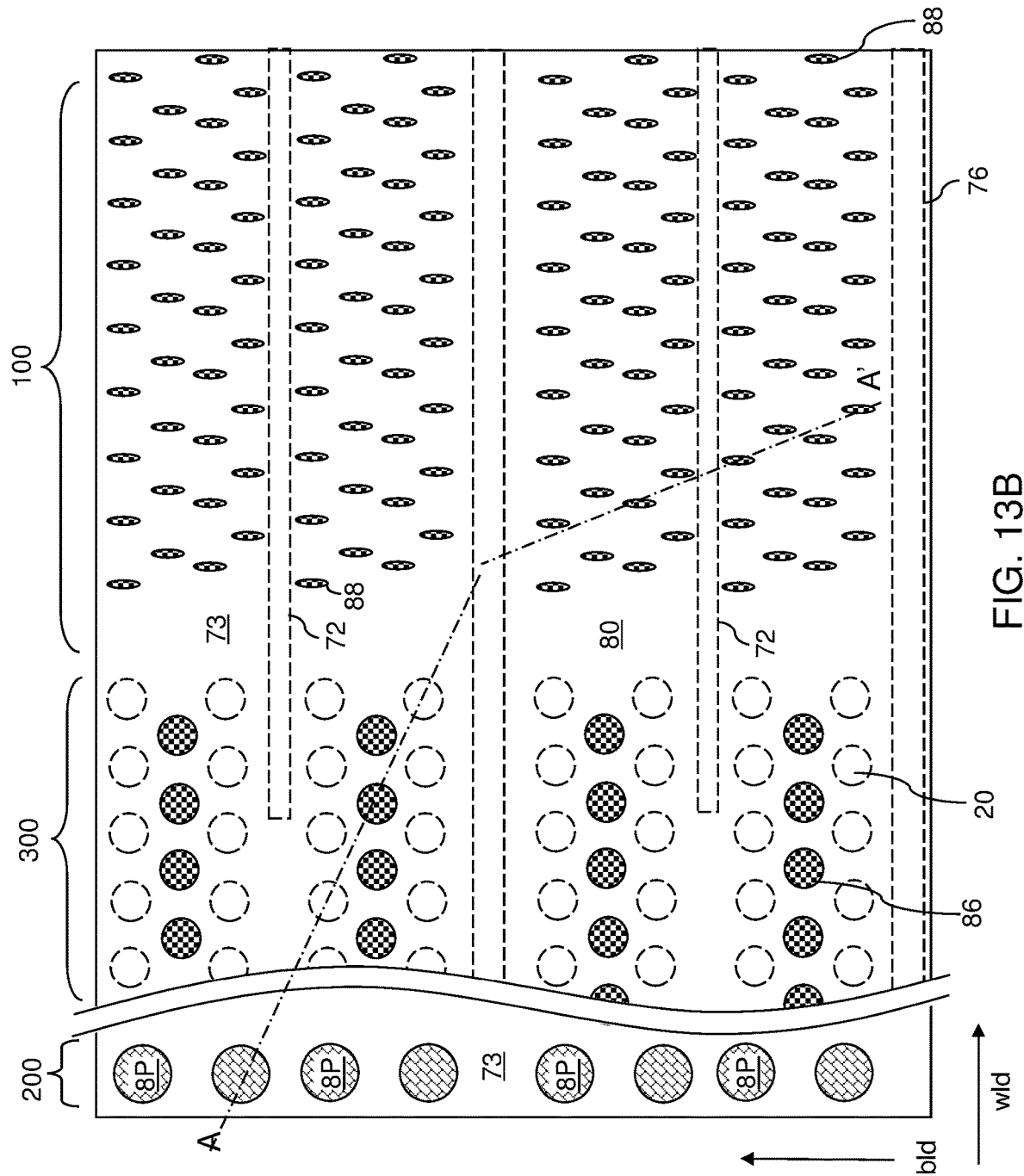
FIG. 13B is a partial see-through top-down view of the exemplary structure of FIG. 13A. The vertical plane A-A' is the plane of the schematic vertical cross-sectional view of FIG. 13A.
Figure 13D:
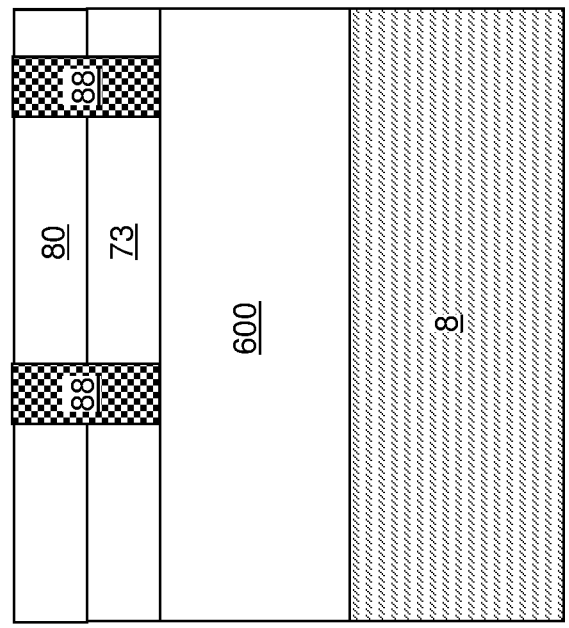
FIG. 13D is a schematic vertical cross-sectional view of the exemplary structure along the vertical plane D-D' of FIG. 13C.
Figure 13C:
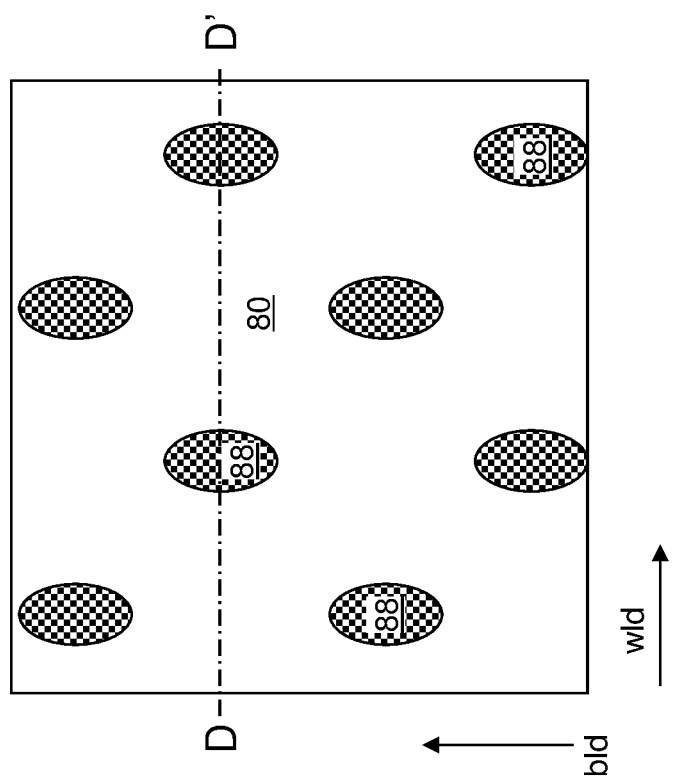
FIG. 13C is a top-down view of the portion of the memory array region of FIGS. 13A and 13B.
Figure 14A:
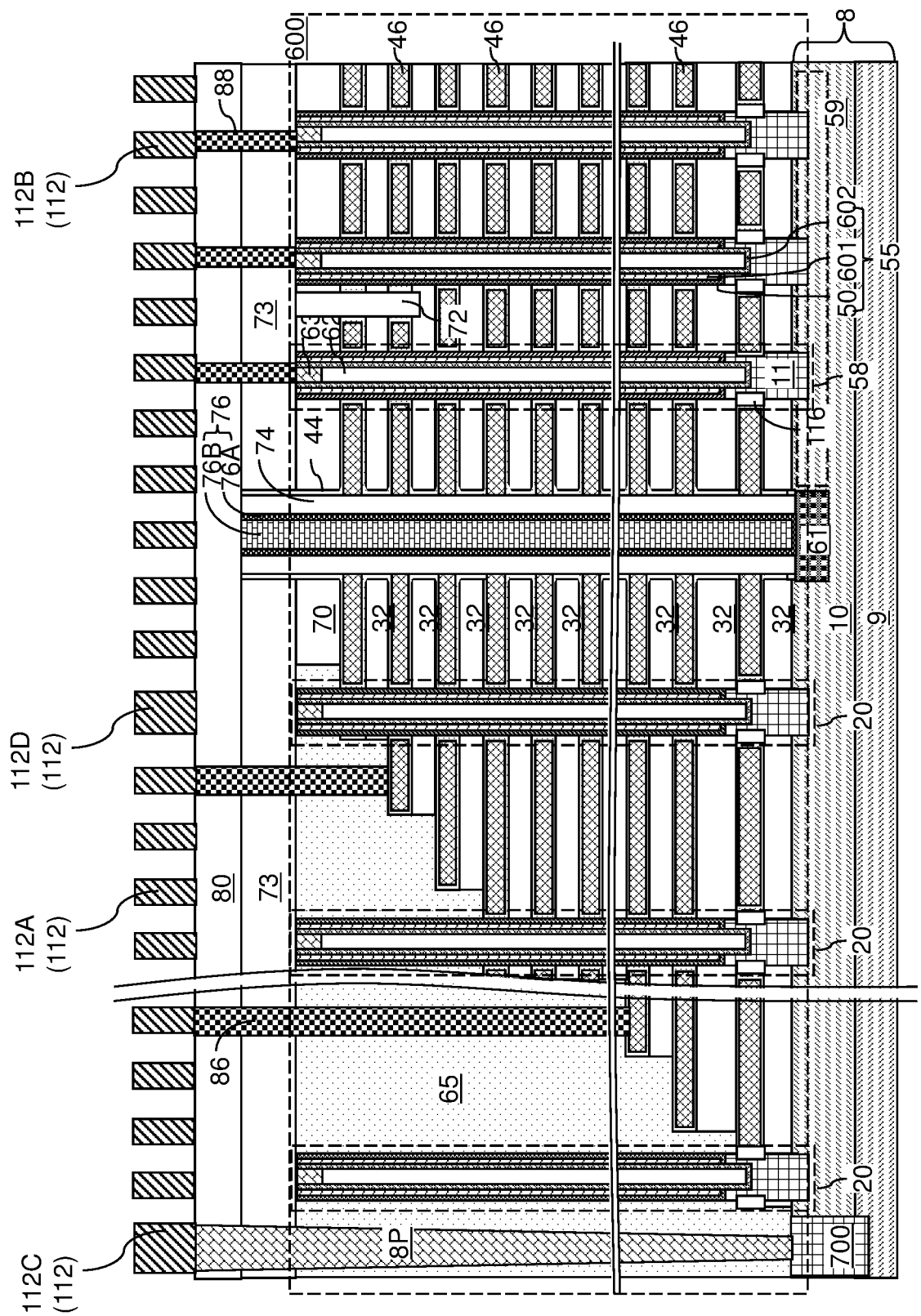
FIG. 14A is a vertical cross-sectional view of the exemplary structure after formation of first metal lines according to an embodiment of the present disclosure.
Figure 14B:
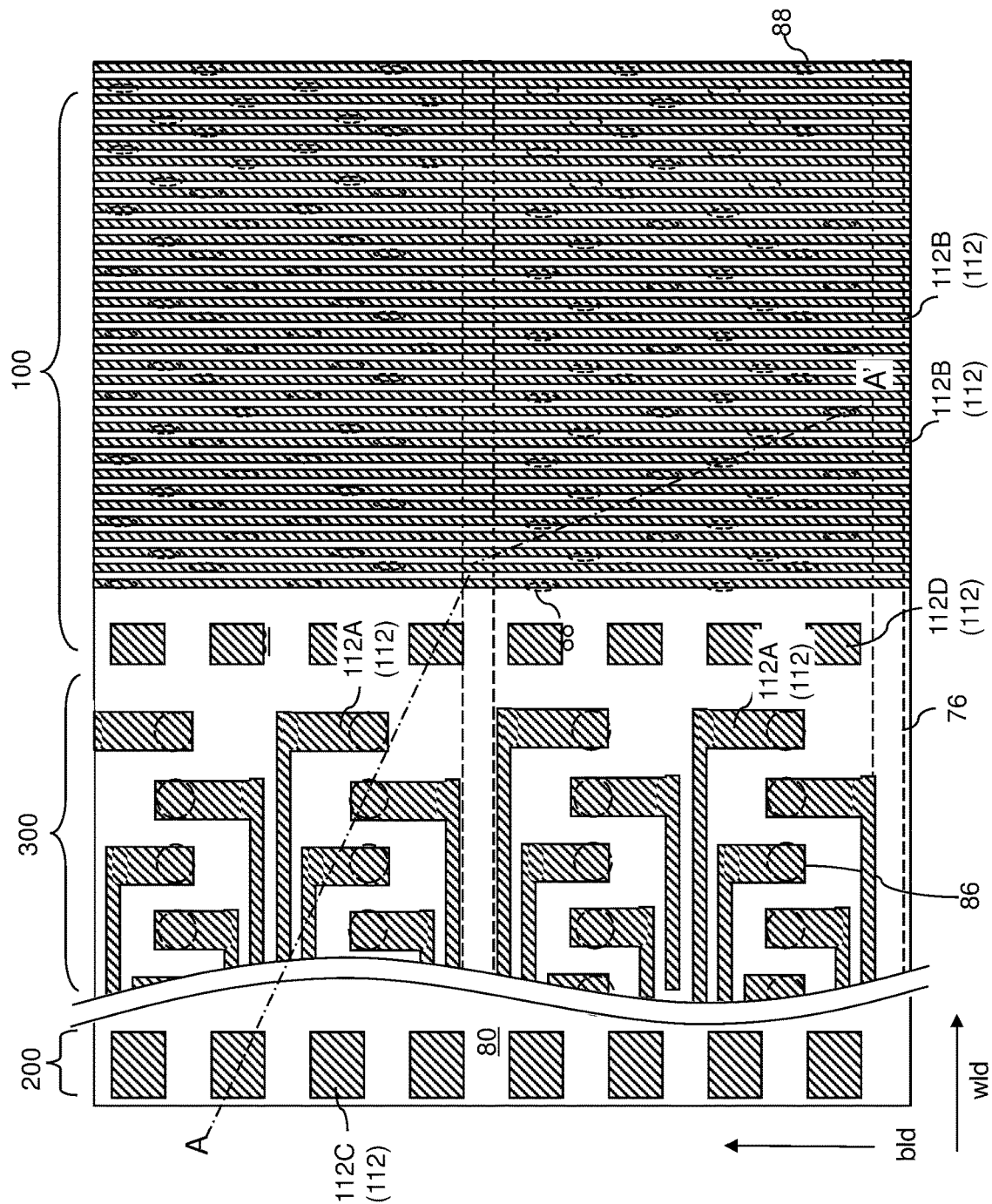
FIG. 14B is a partial see-through top-down view of the exemplary structure of FIG. 14A. The vertical plane A-A' is the plane of the schematic vertical cross-sectional view of FIG. 14A.
Figure 14D:
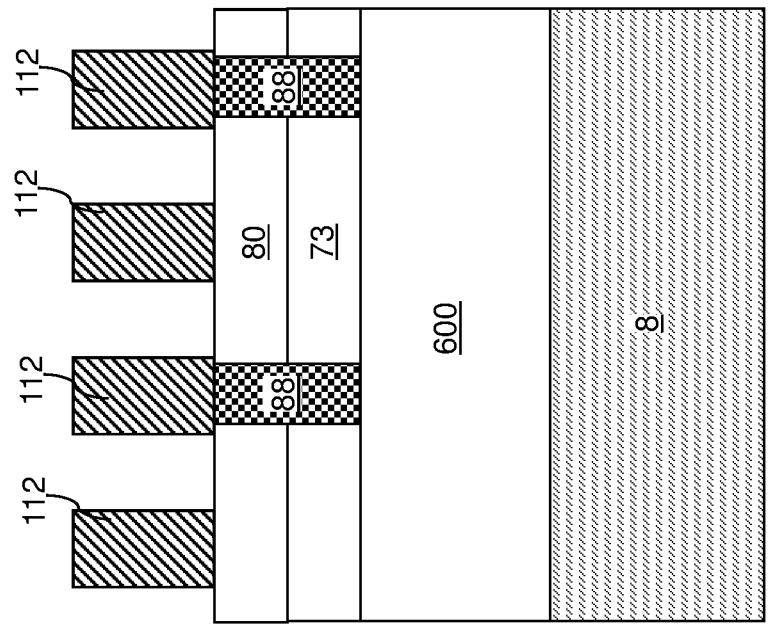
FIG. 14D is a schematic vertical cross-sectional view of the exemplary structure along the vertical plane D-D' of FIG. 14C.
Figure 14C:
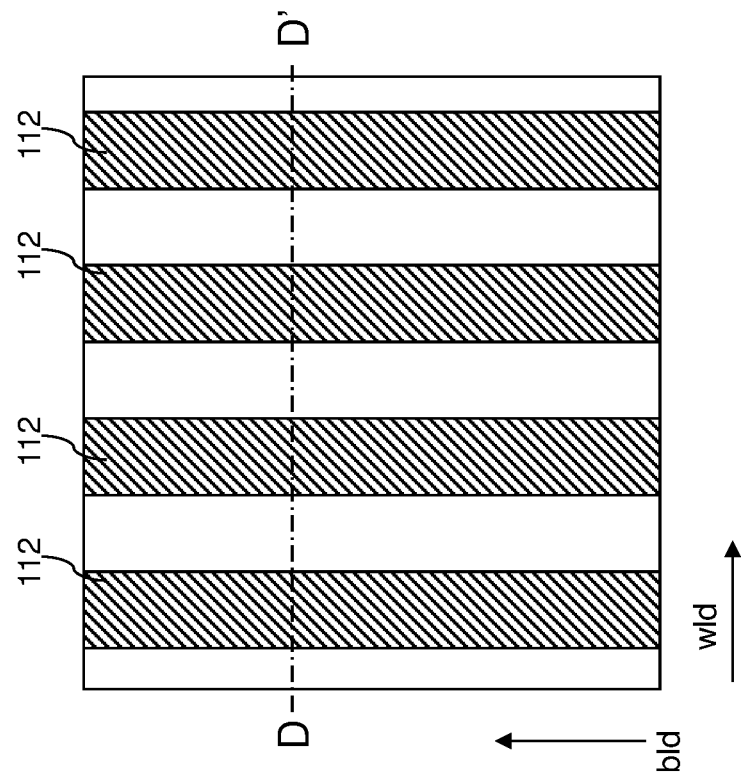
FIG. 14C is a top-down view of the portion of the memory array region of FIGS. 14A and 14B.

Referring to FIG. 12, an insulating material layer can be formed in the backside trenches 79 and over the first contact-level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If a backside blocking dielectric layer 44 is present, the insulating material layer can be formed directly on surfaces of the backside blocking dielectric layer 44 and directly on the sidewalls of the electrically conductive layers 46. If a backside blocking dielectric layer 44 is not employed, the insulating material layer can be formed directly on sidewalls of the insulating layers 32 and directly on sidewalls of the electrically conductive layers 46.

An anisotropic etch is performed to remove horizontal portions of the insulating material layer from above the first contact-level dielectric layer 73 and at the bottom of each backside trench 79. Each remaining portion of the insulating material layer constitutes an insulating spacer 74. A backside cavity 79' is present within a volume surrounded by each insulating spacer 74. A top surface of the semiconductor material layer 10 can be physically exposed at the bottom of each backside trench 79.

A backside contact via structure 76 can be formed within each backside cavity 79'. Each contact via structure 76 can fill a respective cavity 79'. The contact via structures 76 can be formed by depositing at least one conductive material in the remaining unfilled volume (i.e., the backside cavity 79') of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the first contact-level dielectric layer 73 overlying the alternating stack (32, 46) as a stopping layer. If chemical mechanical planarization (CMP) process is employed, the first contact-level dielectric layer 73 can be employed as a CMP stopping layer. Each remaining continuous portion of the at least one conductive material in the backside trenches 79 constitutes a backside contact via structure 76. The backside contact via structure 76 extends through the alternating stack (32, 46), and contacts a top surface of the source region 61. If a backside blocking dielectric layer 44 is employed, the backside contact via structure 76 can contact a sidewall of the backside blocking dielectric layer 44.

A second contact-level dielectric layer 80 can be optionally deposited over the first contact-level dielectric layer 73 and the backside contact via structures 76. The second contact-level dielectric layer 80 includes a dielectric material such as silicon oxide, and can have a thickness in a range from 50 nm to 300 nm, although lesser and greater thicknesses may also be employed. The combination of the first contact-level dielectric layer 73 and the optional second contact-level dielectric layer 80 is herein referred to as at least one contact-level dielectric layer (73, 80).

Referring to FIGS. 13A-13D, additional contact via structures (88, 86, 8P) can be formed through the first contact-level dielectric layer 73, and optionally through the retro-stepped dielectric material portion 65. For example, drain contact via structures 88 can be formed through the at least one contact-level dielectric layer (73, 80) on each drain region 63. Word line contact via structures 86 can be formed on the electrically conductive layers 46 through the at least one contact-level dielectric layer (73, 80), and through the retro-stepped dielectric material portion 65. Peripheral device contact via structures 8P can be formed through the retro-stepped dielectric material portion 65 directly on respective nodes of the peripheral devices. In one embodiment, the drain contact via structures 88 may be arranged as a two-dimensional periodic array having a first periodicity along the first horizontal direction wld and having a second periodicity along the second horizontal direction bld.

Generally, at least one semiconductor device 600 can be formed over a substrate (9, 10). While in the above described embodiment the at least one semiconductor device 600 comprises a three-dimensional memory array including an alternating stack of insulating layers 32 and electrically conductive layers 46 and a two-dimensional array of memory stack structures 55, the structures and the methods of the embodiments of the present disclosure are applicable to any general semiconductor device 600 including a plurality of electrical nodes. For example, the at least one semiconductor device 600 may include field effect transistors or any type of memory devices. In case the at least one semiconductor device 600 includes memory stack structures 55, each of the memory stack structures 55 may comprise a semiconductor channel (59, 11, 60) and a vertical stack of memory elements (such as floating gates or portions of a charge storage layer 54 located at levels of the electrically conductive layers 46). In one embodiment, contact via structures, such as the drain contact via structures 88 may provide electrical contact to a subset of electrical nodes (e.g., drain regions 63) of the at least one semiconductor device 600. In one embodiment, such contact via structures can be arranged as a two-dimensional periodic array that can be subsequently electrically contacted by a set of parallel metal lines, such as bit lines.

Referring to FIGS. 14A-14D, at least one metal or metal alloy can be deposited as a blanket (unpatterned) metal layer. In one embodiment, the at least one metal or metal alloy may include, and/or may consist essentially of, a transition metal that can be subsequently converted into a transition metal oxide, and can then be reacted with a vapor of a linking compound to form a metal organic framework (MOF) material. In an illustrative example, the blanket metal layer may include, and/or may consist essentially of, molybdenum, ruthenium, copper, cobalt, or titanium or alloys thereof. In one embodiment, the at least one metal or metal alloy may comprise a "barrierless" metal containing less than 1 atomic percent alloying elements (e.g., elemental metal), which does not require a diffusion barrier, such as a metal nitride. Examples of the barrierless metal include molybdenum or ruthenium. The metal nitride diffusion barrier (e.g., TiN or WN) typically has a higher resistivity than the metal (e.g., copper) and increases the metal line resistance. By omitting the metal nitride diffusion barrier, the line resistance and RC delay are decreased, and the device operational power is increased while line cross talk is decreased.

The blanket metal layer can be deposited by physical vapor deposition, chemical vapor deposition, atomic layer deposition, electroplating, and/or electroless plating. A diffusion barrier layer (not shown) and/or a seed layer (not shown) may be optionally provided at the bottom portion of the blanket metal layer, and a predominant upper portion of the blanket metal layer may include an elemental transition metal layer. Alternatively, the entirety of the blanket metal layer may be an elemental transition metal layer, such as Mo or Ru. The thickness of the blanket metal layer may be in a range from 5 nm to 50 nm, although lesser and greater thicknesses may also be employed.

A patterned mask layer such as a patterned photoresist layer (not shown) and/or a patterned hard mask layer can be formed over the blanket metal layer. An ion beam patterning process or an anisotropic etch process can be performed to transfer the pattern in the patterned masking layer through the blanket metal layer. In an illustrative example, in case the blanket metal layer includes molybdenum, the anisotropic etch process may employ a mixture of at least one hydrofluorocarbon gas, oxygen gas, and sulfur hexafluoride gas as etchant gases. The blanket metal layer is patterned into metal lines, which are herein referred to as first metal lines 112 or first-level metal lines. The patterned mask layer can be subsequently removed.

In an illustrative example, the first metal lines 112 may include bit lines 112B that laterally extend along the second (e.g., bit line) horizontal direction bld and are laterally spaced apart along the first (e.g., word line) horizontal direction wld with a uniform pitch. The first metal lines 112 may include word-line-connection metal lines 112A that contact a respective one of the word line contact via structures 86, and peripheral connection metal lines 112C that contact a respective one of the peripheral device contact via structures 8P (if present). Further, the first metal lines 112 may include dummy metal lines 112D that do not contact any underlying conductive structure and are electrically floating. In this case, the dummy metal lines 112D are placed in regions in which the wiring density of the first metal lines 112 is low. For example, the dummy metal lines 112D can be placed in areas in which the fraction of the area occupied by other electrically active metal lines 112 is less than a predetermined fraction, which may be in a range from 0.05 to 0.30. According to an aspect of the present disclosure, surface portions of the first metal lines 112 provide a transition metal in a metallic form that is subsequently converted into a transition metal oxide, and subsequently into a metal organic framework material. Thus, the dummy metal lines 112D provide the role of supplying a source material for forming the metal organic framework material to prevent formation of holes in a continuous metal organic framework material layer to be subsequently formed.

In one embodiment, a subset of first metal lines 112 (such as the bit lines 112B) may laterally extend along a horizontal direction (such as the second horizontal direction bld), and may be laterally spaced apart along another direction that is perpendicular to the lengthwise direction of the subset of the first metal lines (such as the first horizontal direction wld). In one embodiment, each of such first metal lines 112 may contact a respective set of at least one underlying contact via structure (such as at least one drain contact via structure 88 or an intermediate contact via structure which contacts the drain contact via structure 88). In one embodiment, such first metal lines 112 may be formed with a uniform width and with a uniform pitch along the widthwise direction (such as the first horizontal direction wld).

Referring to FIGS. 15A and 15B, a metal-containing precursor layer 119 can be generated from physically exposed surface portions of the first metal lines 112. In one embodiment, the first metal lines comprise a first transition metal in elemental form, and the metal-containing precursor layer 119 comprises an oxide of the first transition metal. The metal-containing precursor layer 119 can be formed on the sidewalls and the top surfaces of the first metal lines 112 by plasma or thermal oxidation of the first metal lines 112 in an oxygen containing ambient, such as oxygen gas or water vapor. Thus, the metal-containing precursor layer 119 may be formed as multiple disjoined material portions that do not contact one another. The thickness of the metal-containing precursor layer 119 may be in a range from 0.3 nm to 2 nm, such as from 0.4 nm to 0.8 nm, although lesser and greater thicknesses may also be employed. In one embodiment, the first metal lines 112 may comprise molybdenum, and the metal-containing precursor layer 119 may include molybdenum oxide. In one embodiment, the first metal lines 112 may comprise ruthenium, and the metal-containing precursor layer 119 may include ruthenium oxide. Alternatively, if the first metal lines 112 comprise ruthenium, then a titanium layer may be formed over the ruthenium first metal lines followed by oxidizing the titanium layer to form a titanium oxide (e.g., titanium dioxide) metal-containing precursor layer 119. Alternatively, a titanium oxide metal-containing precursor layer 119 may be deposited as a metal oxide layer on the ruthenium first metal lines 112. In one embodiment, the first metal lines 112 may comprise copper, and the metal-containing precursor layer 119 may include copper oxide. In one embodiment, the first metal lines 112 may comprise cobalt, and the metal-containing precursor layer 119 may include cobalt oxide. In one embodiment, the first metal lines 112 may comprise titanium, and the metal-containing precursor layer 119 may include titanium oxide.

Generally, the metal-containing precursor layer 119 includes a metal-containing precursor material that forms a metal organic framework (MOF) material upon exposure to a vapor of a linking compound (i.e., a linker precursor). Metal organic frameworks (MOFs) are porous crystalline materials that are formed by linking metal ions with organic ligands (i.e., linkers) with strong bonds in a structure that forms cavities having dimensions greater than the size of an individual atom. MOFs can be coordination polymers that include metal ions or clusters that are coordinated to organic ligands to form a porous three-dimensional structure. Each metal ion or cluster is connected to at least a bidentate organic ligand (i.e., two or more ligands). The organic ligands form a coordination network containing voids around the metal ions or clusters. Over 20,000 different types of MOFs have been reported. MOFs are dielectric materials and typically have a low dielectric constant, which may be in a range from 1.7 to 2.6.

Methods for forming MOFs have been disclosed in recently published articles such as M. Krishtab et al., Vapor-deposited zeolitic imidazolate frameworks as gap-filling ultra-low-k dielectrics, Nature Communications, 10:3729 (2019); T. Stassin, Vapour-phase deposition of oriented copper dicarboxylate metal organic framework thin films, Chem Commun, 2019 Sep. 4; 55(68):10056-10059; and E. Perez, Origins and Evolution of Inorganic-Based and MOF-Based Mixed-Matrix Membranes for Gas Separations, Processes 4(3):32, September 2016, the entire contents of which are incorporated herein by reference. In such methods, a metal-containing precursor material is deposited and is subsequently converted into a MOF material upon reaction with a linker precursor vapor. In one embodiment of the present disclosure, the metal-containing precursor layer 119 is derived from surface portions of the first metal lines 112 by an oxidation process, which may employ a thermal oxidation process or a plasma oxidation process.

Figures 16A, 16B:
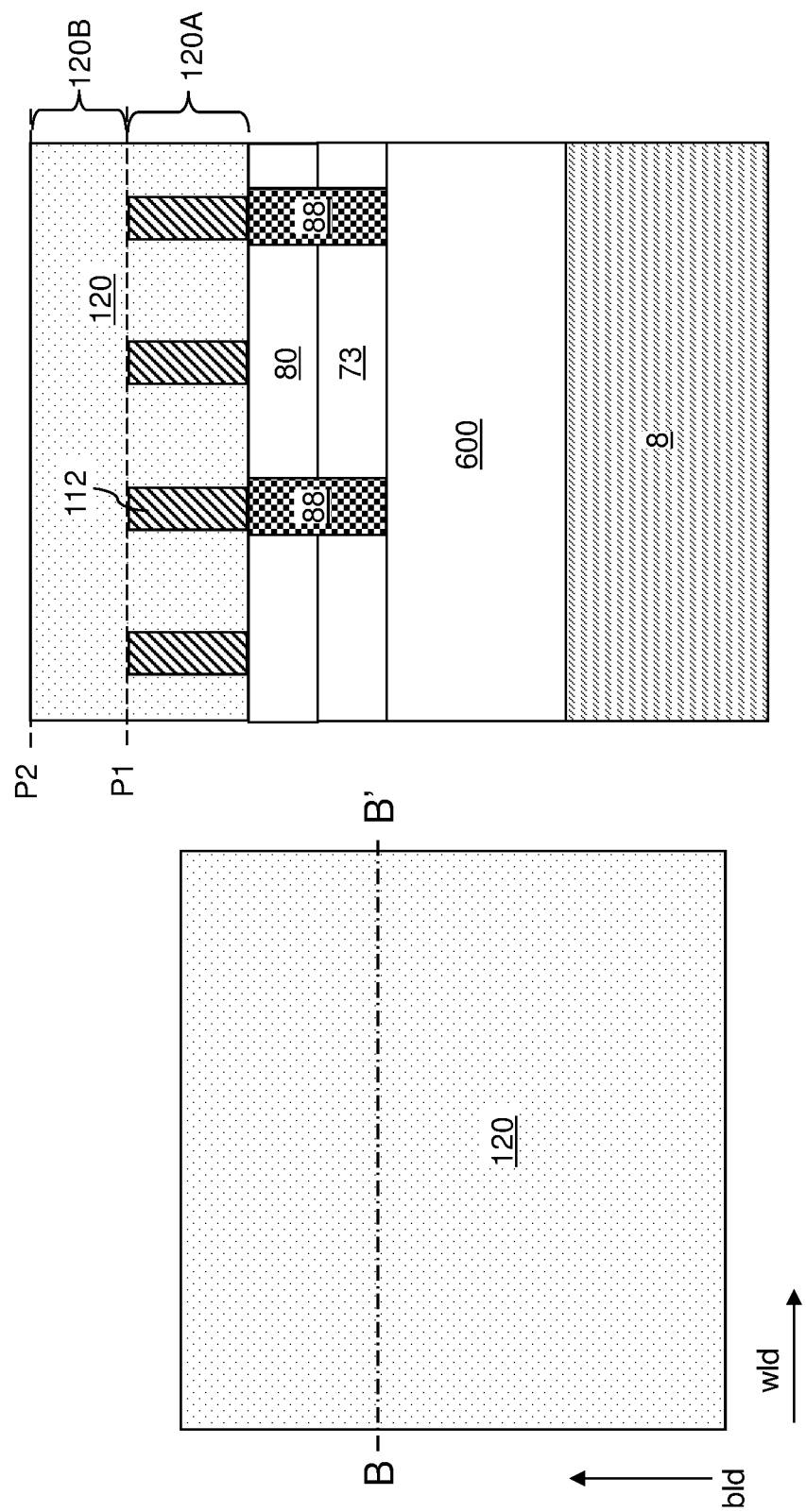
FIG. 16A is a top-down view of the first configuration of the portion of the memory array region of the exemplary structure after formation of a continuous metal organic framework (MOF) material layer according to an embodiment of the present disclosure.
FIG. 16B is a schematic vertical cross-sectional view of the first configuration of the exemplary structure along the vertical plane B-B' of FIG. 16A.

Referring to FIGS. 16A and 16B, the metal oxide material of the metal-containing precursor layer 119 is exposed to a vapor of a linking compound (e.g., organic linking compound) that forms a metal organic framework (MOF) material upon reaction. Any combination of a metallic material for the metal-containing precursor layer 119 and the vapor of the linking compound that is known to form a MOF material may be employed. Generally, the molecular species for the vapor of the linking compound can be selected based on the metallic material in the metal-containing precursor layer 119. For example, if the metal-containing precursor layer 119 includes molybdenum (e.g., molybdenum oxide layer), a vapor of 1,4-benzenedicarboxylic acid can be employed as the organic linker to form TUDMOF-1 MOF. If the metal-containing precursor layer 119 includes titanium (e.g., titanium dioxide layer), a vapor of 1,4-benzodicarboxylate (e.g., 1,4-benzodicarboxylic acid) can be employed as the organic linker to form MOF MIL-125, which includes titanium containing nodes and 1,4-benzodicarboxylic acid organic linkers that form the framework, that contains large pores between the structure of the framework. If the first metal lines 112 include ruthenium and the metal-containing precursor layer 119 includes titanium oxide as described above, then MOF MIL-125 may also be formed. Generally, suitable organic linkers may be employed to form the continuous metal organic framework (MOF) material layer 120 for each transition metal in the first metal lines 112. If the metal-containing precursor layer 119 includes copper, the continuous metal organic framework (MOF) material layer 120 may include HKUST-1 MOF. If the metal-containing precursor layer 119 includes cobalt, the continuous metal organic framework (MOF) material layer 120 may include ZIF-67.

Since MOFs have a high expansion factor (e.g., 10 or above) during deposition, a continuous metal organic framework (MOF) material layer 120 is formed by reaction of the metal-containing precursor layer 119 and the vapor of the linking compound. The metal-containing precursor layer 119 can be completely consumed during the optional oxidation process and subsequent conversion into the continuous MOF material layer 120. Various MOF materials can be formed depending on the composition of the metal-containing precursor layer 119. The composition of the continuous MOF material layer 120 depends on the composition of the metal-containing precursor layer 119 and the composition of the linking compound.

In one embodiment, the continuous MOF material layer 120 can include lower MOF portions 120A that are located between neighboring pairs of first metal lines 112 and an upper MOF matrix portion 120B that continuously extend over the first metal lines 112 and connected to each of the lower MOF portions 120A. Each of the lower MOF portions 120A is located below a first horizontal plane P1 containing bottom surfaces of the upper MOF matrix portion 120B, and the upper MOF matrix portion 120B has a top surface within a second horizontal plane P2 that overlies the first horizontal plane P1. In one embodiment, the fraction of the area covered by the first metal lines 112 can be controlled within a predetermined range (such as from 0.05 to 0.30) so that the continuous MOF material layer 120 is formed as a continuous material layer without any hole therein. Further, the fraction of the area covered by the first metal lines 112 and the lateral gaps among the first metal lines 112 may be controlled such that the entire volume between neighboring pairs of the first metal lines 112 can be filled within the lower MOF portions 120A. The thickness of the upper MOF matrix portion 120B can be in a range from 5 nm to 50 nm, such as from 10 nm to 25 nm, although lesser and greater thicknesses may also be employed. Generally, the thickness of the upper MOF matrix portion 120B depends on the geometry and dimensions of the first metal lines 112 and the volume expansion factor during formation of the continuous MOF material layer 120. The volume expansion factor is the ratio of the volume of the continuous MOF material layer 120 to the volume of the metal-containing precursor layer 119.

The continuous MOF material layer 120 can be formed as a single continuous material layer having a homogeneous material composition throughout. Thus, the lower MOF portions 120A and the upper MOF matrix portion 120B can include a homogenous MOF material throughout. Each sidewall of the first metal lines 112 can contact a respective one of the lower MOF portions 120A. Each top surface of the first metal lines 112 can contact a respective one of the bottom surfaces of the upper MOF matrix portion 120B. In one embodiment, the continuous MOF material layer 120 and the first metal lines 112 may include a same transition metal (e.g., molybdenum) therein. In one embodiment, the first metal lines 112 consists essentially of a transition metal, and the continuous MOF material layer 120 consists essentially of a metal organic framework material that contains the transition metal as a metallic component. In another embodiment, the continuous MOF material layer 120 and the first metal lines 112 may include a different transition metal (e.g., titanium and ruthenium, respectively) therein.

If the continuous MOF material layer 120 is not sufficient to completely fill the spaces between the first metal lines 112, then cyclical MOF deposition may be performed. For example, after a first portion of the continuous MOF material layer 120 is formed, a second metal-containing precursor layer 119 is formed on the first portion of the continuous MOF material layer 120. The second metal-containing precursor layer 119 is also exposed to a vapor of a linking compound (e.g., organic linking compound) that forms a metal organic framework (MOF) material upon reaction to form a second portion of the continuous MOF material layer 120. This process may be repeated until the deposition of the continuous MOF material layer 120 is completed and all of the metal-containing precursor layers 119 are consumed during the MOF deposition steps.

In one embodiment, a hydrophobic functional group can be added to the linker vapor during the MOF deposition step. For example, the hydrophobic functional group can be a methyl group. The hydrophobic functional group further blocks water from getting to the interface between the first metal lines 112 and the continuous MOF material layer 120 and prevent or reduce the water from attaching to the metal oxide units of the metal-containing precursor layer 119.

If the top surface of the continuous MOF material layer 120 is uneven due to the uneven topography of the underlying first metal lines 112, then the top surface of the continuous MOF material layer 120 can optionally be planarized (i.e., flattened). For example, the planarization may be carried out by mechanical polishing, chemical mechanical polishing (CMP) or by etch back.

Figure 17B:
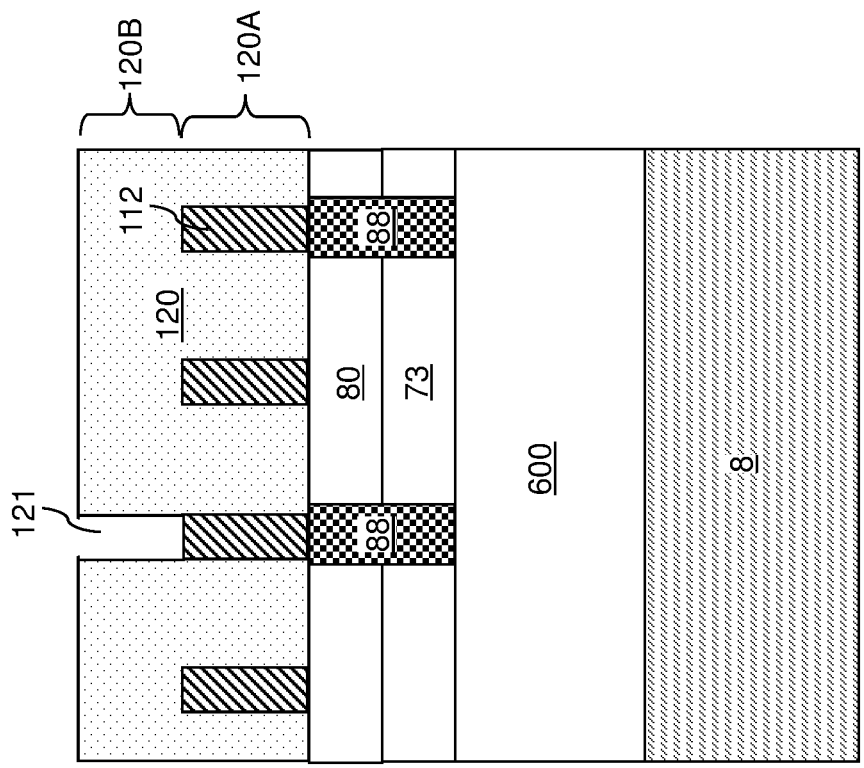
FIG. 17B is a schematic vertical cross-sectional view of the first configuration of the exemplary structure along the vertical plane B-B' of FIG. 17A.
Figure 17A:
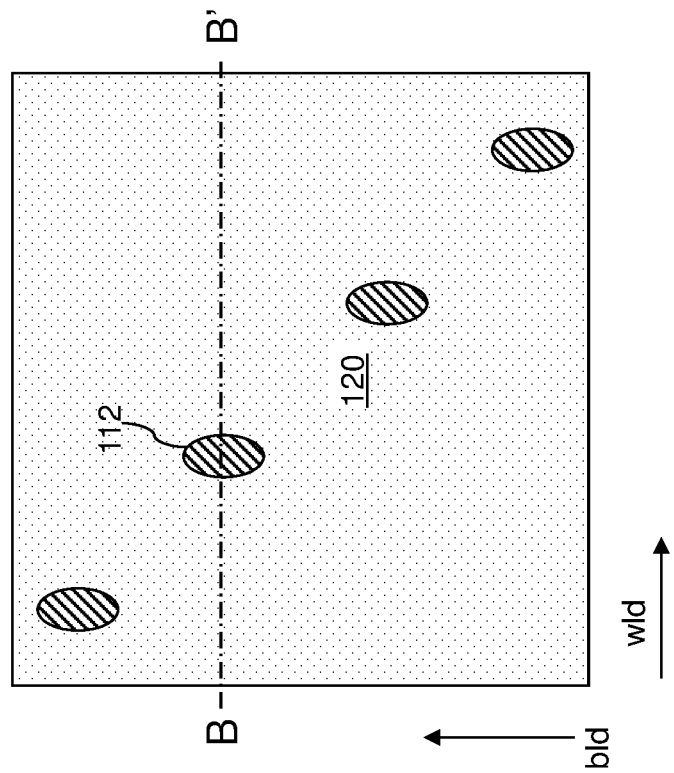
FIG. 17A is a top-down view of the first configuration of the portion of the memory array region of the exemplary structure after formation of via cavities through an upper MOF matrix portion according to an embodiment of the present disclosure.

Referring to FIGS. 17A and 17B, a photoresist layer (not shown) can be applied over the top surface of the continuous MOF material layer 120, and can be lithographically patterned to form an array of openings therein. The pattern of the openings in the photoresist layer can be transferred through the upper MOF matrix portion 120B of the continuous MOF material layer 120 by an anisotropic etch process such as a reactive ion etch process. Via cavities 121 vertically extending through the upper MOF matrix portion 120B of the continuous MOF material layer 120 can be formed. The pattern of the openings in the photoresist layer can be selected such that a top surface of a first metal line 112 is physically exposed at the bottom of each via cavity 121. The photoresist layer can be subsequently removed, for example, by ashing.

Referring to FIGS. 18A and 18B, at least one metallic material (131L, 132L) can be deposited in the via cavities 121 and over the upper MOF matrix portion 120B of the continuous MOF material layer 120. The at least one metallic material (131L, 132L) may include an optional metallic barrier layer 131L (which may be present or may be omitted) and a metal layer 132L including a metal that provides high electrical conductivity. For example, the metallic barrier layer 131L may include TiN, TaN, or WN, and may have a thickness in a range from 1 nm to 3 nm. The metal layer 132L may include W, Cu, Mo, Ru, Co, Cu, and/or at least another metal. The metallic barrier layer 131L may be deposited by physical vapor deposition or chemical vapor deposition. The metal layer 132L may be deposited by physical vapor deposition, chemical vapor deposition, electroplating, and/or electroless plating.

Figure 19B:
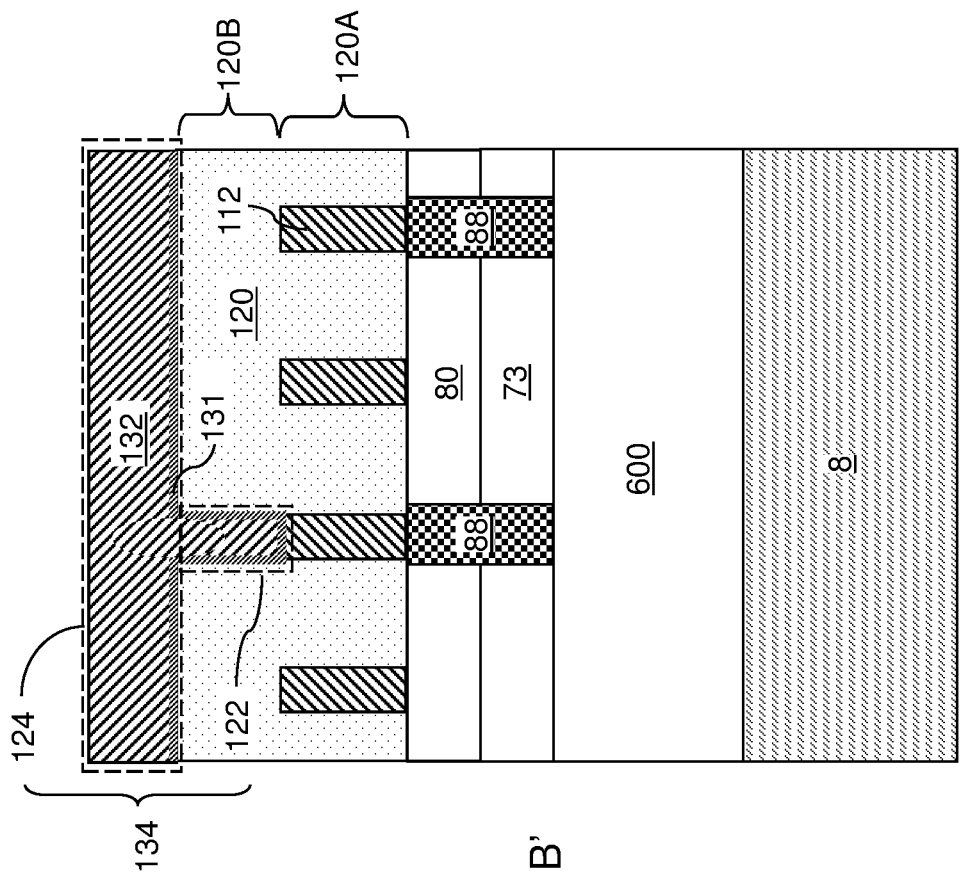
FIG. 19B is a schematic vertical cross-sectional view of the first configuration of the exemplary structure along the vertical plane B-B' of FIG. 19A.
Figure 19A:
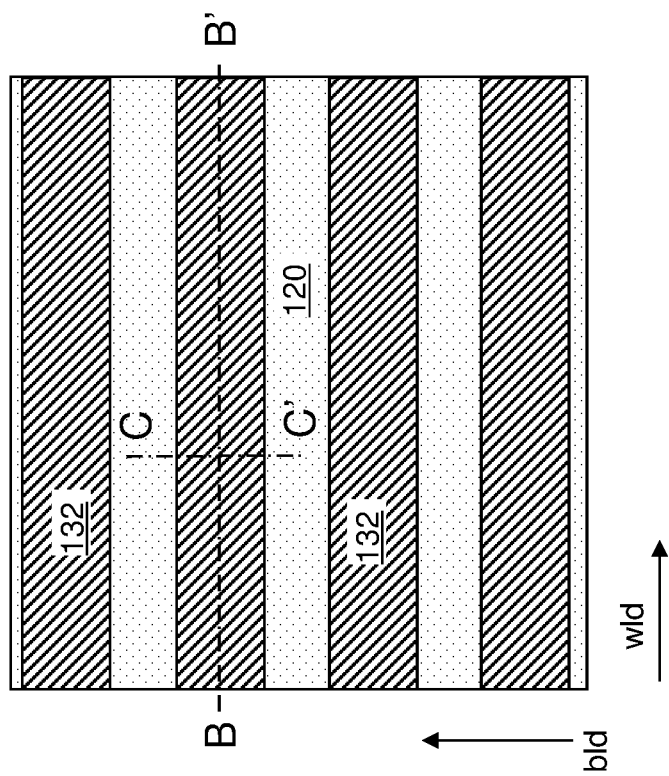
FIG. 19A is a top-down view of the first configuration of the portion of the memory array region of the exemplary structure after formation of first integrated line-and-via structures including second metal lines and first metal via structures according to an embodiment of the present disclosure.
Figure 19C:
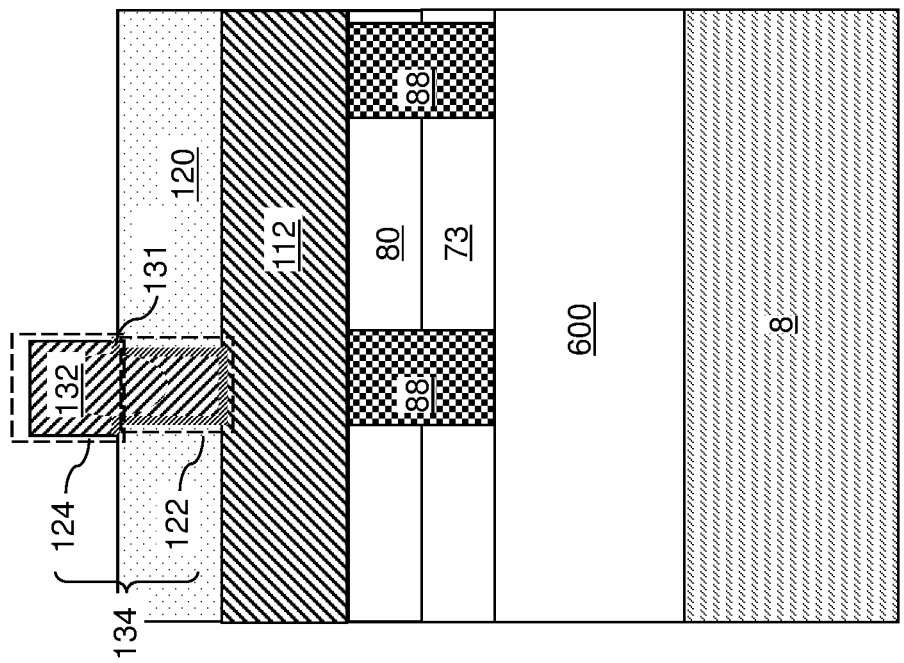
FIG. 19C is a schematic vertical cross-sectional view of the first configuration of the exemplary structure along the vertical plane C-C' of FIG. 19A.

Referring to FIGS. 19A-19C, a photoresist layer (not shown) can be applied over the at least one metallic material (131L, 132L), and can be lithographically patterned into line patterns. An anisotropic etch process can be performed to etch unmasked portions of the at least one metallic material (131L, 132L). The continuous MOF material layer 120 can be employed as a stopping layer for the anisotropic etch process. Remaining portions of the at least one metallic material (131L, 132L) comprise first integrated line-and-via structures 134. Each first integrated line-and-via structure 134 includes a respective second metal line 124 and at least one first metal via structure 122 that is adjoined to the respective second metal line 124. The photoresist layer can be subsequently removed, for example, by ashing.

Each first integrated line-and-via structure 134 includes a respective patterned portion of the at least one metallic material (131L, 132L). As such, each first integrated line-and-via structure 134 may include an optional metallic barrier liner 131 which is a patterned portion of the metallic barrier liner 131L, and includes a metal portion 132 which is a patterned portion of the metal layer 132L. Each second metal line 124 may include a respective portion of a metallic barrier liner 131 within a first integrated line-and-via structure 134 and a respective region of a metal portion within the first integrated line-and-via structure 134. Likewise, each first metal via structure 122 may include a respective portion of a metallic barrier liner 131 within a first integrated line-and-via structure 134 and a respective region of a metal portion 132 within the first integrated line-and-via structure 134.

A metallic barrier liner 131 within a first integrated line-and-via structure 134 may continuously extend through the second metal line 124 and the at least one first metal via structure 122 of the first integrated line-and-via structure 134. The metallic barrier liner 131 may contact a portion of a top surface of the upper MOF matrix portion 120B of the continuous MOF material layer 120, the entire sidewall of each via cavity into which the first integrated line-and-via structure 134 extends, and each top surface of at least one first metal line 112 that underlies the first integrated line-and-via structure 134. A metallic portion 132 within a first integrated line-and-via structure 134 may continuously extend through the second metal line 124 and the at least one first metal via structure 122 of the first integrated line-and-via structure 134. In case a metallic barrier liner is not present within the first integrated line-and-via structure 134, the metallic portion 132 may contact a portion of a top surface of the upper MOF matrix portion 120B of the continuous MOF material layer 120, the entire sidewall of each via cavity into which the first integrated line-and-via structure 134 extends, and each top surface of at least one first metal line 112 that underlies the first integrated line-and-via structure 134.

Generally, each first integrated line-and-via structure 134 can comprise a combination of a second metal line 124 and at least one first metal via structure 122, and can be formed by depositing and patterning at least one metallic material (131L, 132L) in the via cavities 121 and over the upper MOF matrix portion 120B. Each second metal line 124 comprises a portion of the at least one metallic material (131L, 132L) located over a horizontal plane including a top surface of the upper MOF matrix portion 120B, and each first metal via structure 122 comprises a portion of the at least one metallic material (131L, 132L) located within a respective via cavity 121. The at least one first metal via structure 122 extends through the upper MOF matrix portion 120B and contacts a set of at least one of the first metal lines 112.

In one embodiment, the first metal lines 112 (including bit lines 112B) laterally extend along a second horizontal direction (e.g., bit line direction) bld, and the second metal lines 124 laterally extends along a first horizontal direction wld that is perpendicular to the second horizontal direction bld. In one embodiment, each first integrated line-and-via structure 134 comprises a continuous metal portion 132 that extends across the second metal line 124 and each of the at least one first metal via structure 122. In one embodiment, each first integrated line-and-via structure 134 comprises a metallic barrier liner 131 that continuously extends into each of the second metal line 124 and the at least one first metal via structure 122 and contacts a portion of the top surface of the upper MOF matrix portion 120B and a top surface of each first metal line 112 within a set of at least one of the first metal lines 112 that underlies a respective first integrated line-and-via structure 134.

Figure 20C:
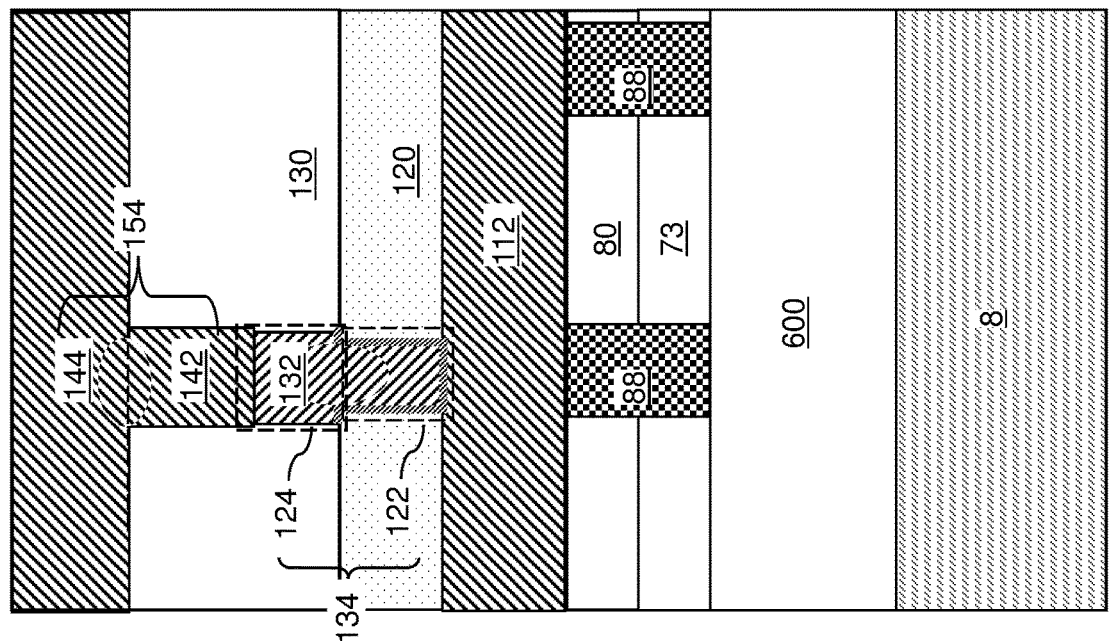
FIG. 20C is a schematic vertical cross-sectional view of the first configuration of the exemplary structure along the vertical plane C-C' of FIG. 20A.

Referring to FIGS. 20A-20C, a dielectric material layer 130 can be deposited over the first integrated line-and-via structures 134 and the continuous MOF material layer 120. The dielectric material layer 130 includes a dielectric material such as silicon oxide, silicon nitride, silicon carbonitride, silicon oxynitride, silicon oxide carbide, organosilicate glass, or porous derivatives thereof. The dielectric material layer 130 may be deposited by a self-planarizing process (such as spin-coating), or the top surface of the dielectric material layer 130 may be planarized by a planarization process such as a chemical mechanical planarization (CMP) process. The thickness of the dielectric material layer 130, as measured between the top surface of the dielectric material layer 130 and the top surfaces of the first integrated line-and-via structures 134, may be in a range from 15 nm to 300 nm, such as from 30 nm to 150 nm, although lesser and greater thicknesses may also be employed. The bottom surface of the dielectric material layer 130 contacts the top surface of the continuous MOF material layer 120, and is vertically spaced from the top surface of the first metal lines 112 by the thickness of the upper MOF matrix portion 120B of the continuous MOF material layer 120. The dielectric material layer contacting each of the second metal lines 124 in the first integrated line-and-via structures 134, and overlies the continuous MOF material layer 120.

Two combinations of a lithographic patterning process and an anisotropic etch process can be performed to form integrated line-and-via cavities in an upper portion of the dielectric material layer 130. For example, a first lithographic patterning process and a first anisotropic etch process can be performed to form via cavities, and a second lithographic patterning process and a second anisotropic etch process can be performed to form line cavities such that the line cavities overlap with the via cavities. The merged cavities constitute the integrated line-and-via cavities. Alternatively, a first lithographic patterning process and a first anisotropic etch process can be performed to form line cavities, and a second lithographic patterning process and a second anisotropic etch process can be performed to form via cavities such that the via cavities overlap with the line cavities. The merged cavities constitute the integrated line-and-via cavities. Generally, the integrated line-and-via cavities can be formed such that a top surface of a second metal line 124 is physically exposed at the bottom of each via cavity portion of the integrated line-and-via cavities.

At least one metallic material can be deposited in the integrated line-and-via cavities, and excess portions of the at least one metallic material can be removed from above the horizontal plane including the top surface of the dielectric material layer 130 by a planarization process such as a chemical mechanical planarization process. Additional integrated line-and-via structures are formed in the dielectric material layer 130. The additional integrated line-and-via structures are herein referred to as second integrated line-and-via structures 154. Each second integrated line-and-via structure 154 can be formed directly on a top surface of a respective first integrated line-and-via structure 134. Each second integrated line-and-via structure 154 comprises a combination of a third metal line 144 and at least one second via structure 142. Each second integrated line-and-via structure 154 can have a top surface located within a horizontal plane including a top surface of the dielectric material layer 130.

Figure 21B:
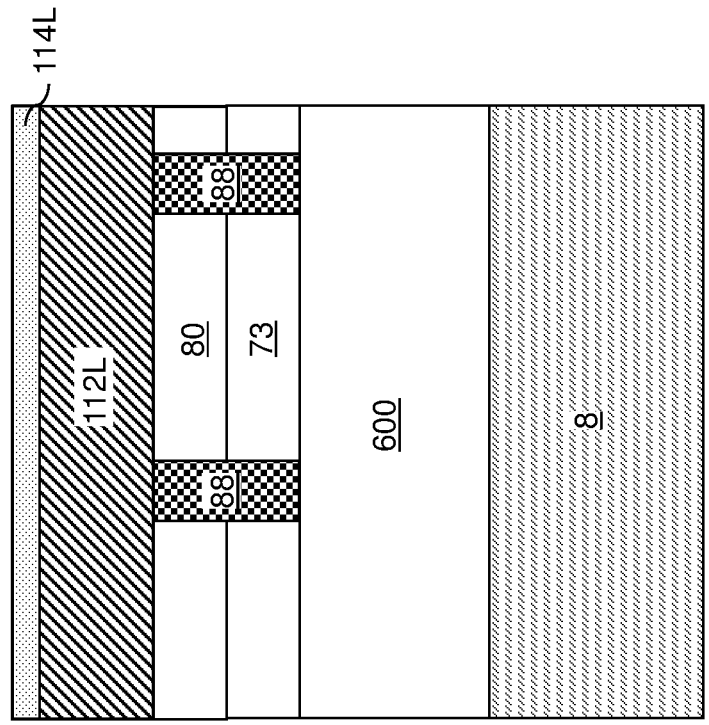
FIG. 21B is a schematic vertical cross-sectional view of the second configuration of the exemplary structure along the vertical plane B-B' of FIG. 21A.
Figure 21A:
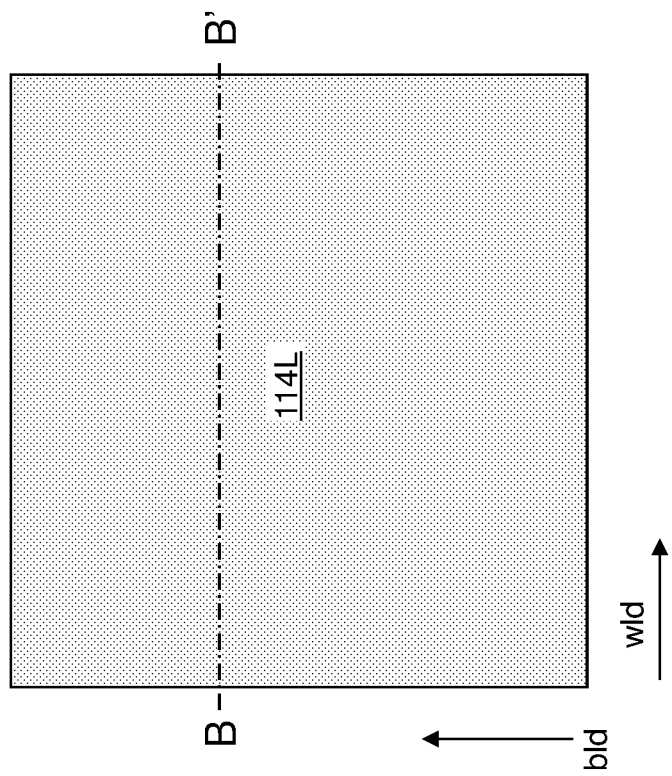
FIG. 21A is a top-down view of a second configuration of the portion of the memory array region of the exemplary structure after formation of a metal layer and a dielectric hard mask layer according to an embodiment of the present disclosure.

Referring to FIGS. 21A and 21B, a second configuration of a portion of a memory array region of the exemplary structure is illustrated after formation of a metal layer, which is herein referred to as a first-line-level metal layer 112L, and a dielectric hard mask layer 114L. The structure illustrated in FIGS. 21A and 21B can be derived from the exemplary structure of FIGS. 13A-13C by deposition of a blanket metal layer (which forms the first-line-level metal layer 112L) and a blanket dielectric material layer (which forms the dielectric hard mask layer 114L). The material of the first-line-level metal layer 112L may be the same as the material of the first metal lines 112 in the structure of FIGS. 14A-14D. The thickness of the first-line-level metal layer 112L may be the same as the height of the first metal lines 112 in the structure of FIGS. 14A-14D.

The dielectric hard mask layer 114L includes a dielectric material. In one embodiment, the dielectric hard mask layer 114L includes a dielectric material that can function as an etch strop material during subsequent patterning of via cavities. In this case, the dielectric hard mask layer 114L may comprise, and/or may consist essentially of, a dielectric material selected from silicon oxide, silicon nitride, silicon oxynitride, silicon nitride carbide (i.e., silicon carbonitride), and a dielectric metal oxide. In this case, the dielectric hard mask layer 114L may be deposited by chemical vapor deposition, and may have a thickness in a range from 0.5 nm to 5 nm, such as from 1 nm to 3 nm, although lesser and greater thicknesses may also be employed.

In another embodiment, the dielectric hard mask layer 114L includes a metal-containing precursor material that can subsequently form a portion of a continuous metal organic framework material layer. In this case, a metal-containing precursor layer to be subsequently formed comprises a first metal-containing precursor material for forming a continuous MOF material layer, and the dielectric hard mask layer 114L may comprise a second metal-containing precursor material for forming the continuous MOF material layer. In this case, the second metal-containing precursor material may be the same as, or may be different from, the first metal-containing precursor material. In one embodiment, the dielectric hard mask layer 114L may include molybdenum oxide, copper oxide, cobalt oxide, or titanium oxide. The thickness of the dielectric hard mask layer 114L in this case may be in a range from 0.5 nm to 6 nm, such as from 1.0 nm to 3 nm, although lesser and greater thicknesses may also be employed.

Figure 22B:
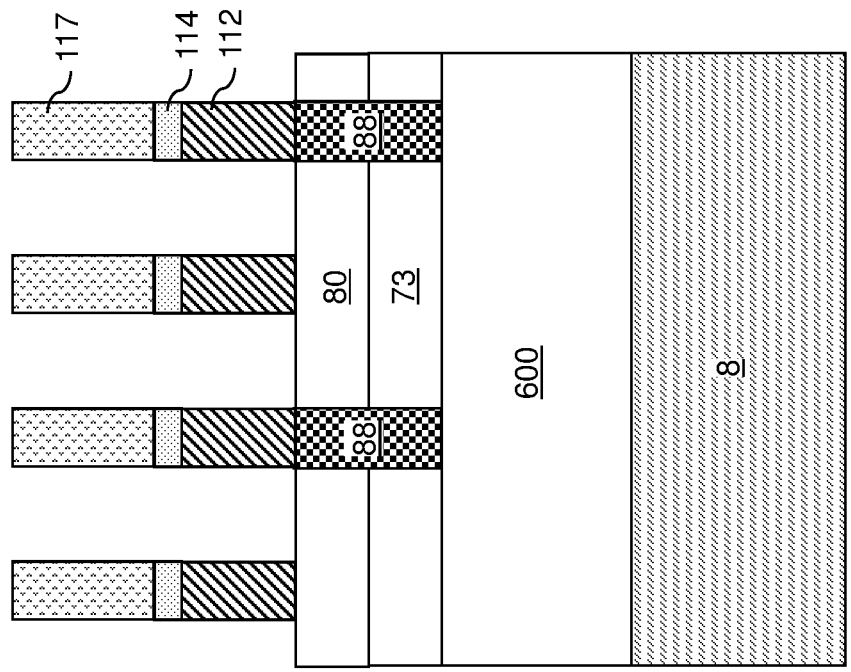
FIG. 22B is a schematic vertical cross-sectional view of the second configuration of the exemplary structure along the vertical plane B-B' of FIG. 22A.
Figure 22A:
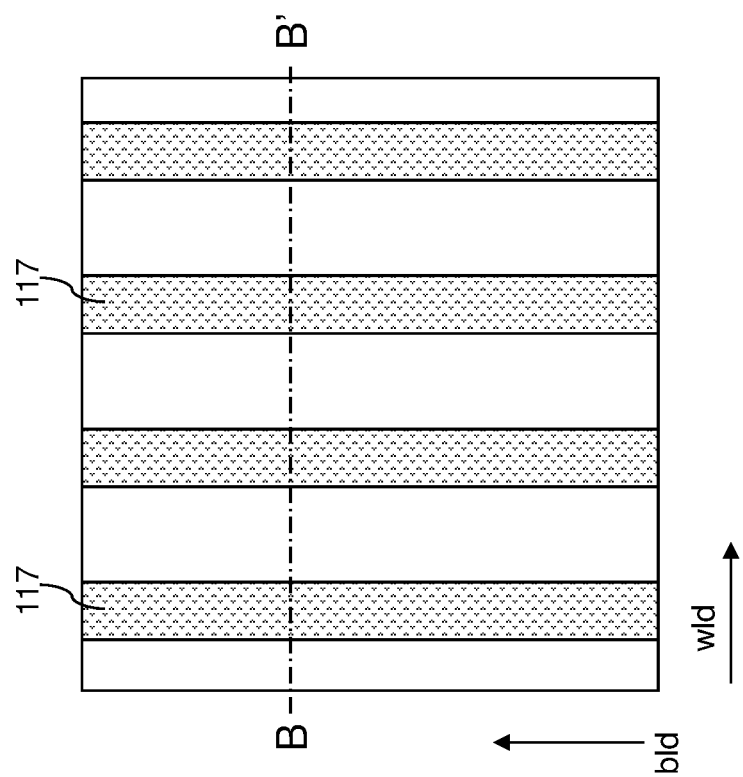
FIG. 22A is a top-down view of a second configuration of the portion of the memory array region of the exemplary structure after formation of first metal lines and dielectric hard mask strips according to an embodiment of the present disclosure.

Referring to FIGS. 22A and 22B, a photoresist layer 117 can be applied over the dielectric hard mask layer 114L, and can be lithographically patterned. The pattern in the photoresist layer can be transferred through the dielectric hard mask layer 114L and the first-line-level metal layer 112L. The first-line-level metal layer 112L is patterned into first metal lines 112, which can have the same pattern as the first metal lines 112 illustrated in FIGS. 14A-14D. The dielectric hard mask layer 114L is patterned into dielectric hard mask strips 114. Each dielectric hard mask strip 114 can have the same pattern as a respective underlying first metal line 112.

Each dielectric hard mask strip 114 can be formed on a top surface of a respective first metal line 112.

Figure 23B:
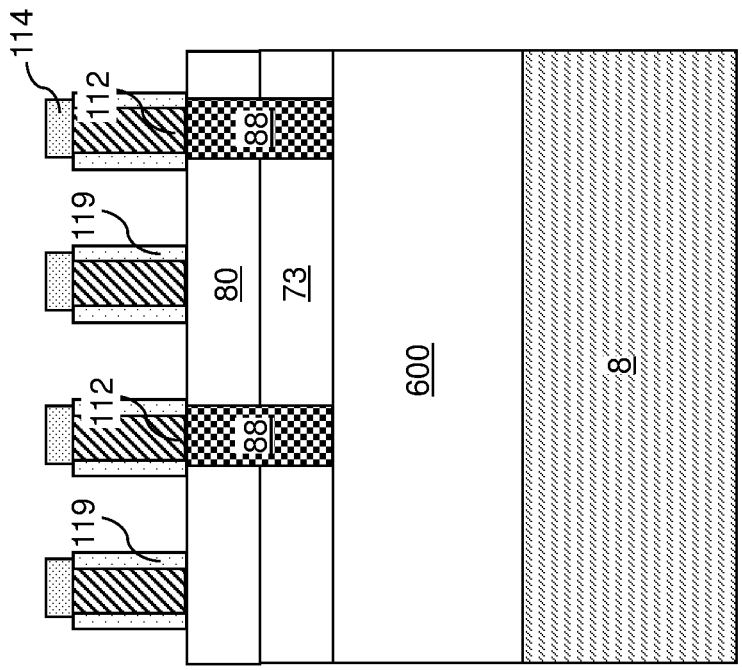
FIG. 23B is a schematic vertical cross-sectional view of the second configuration of the exemplary structure along the vertical plane B-B' of FIG. 23A.
Figure 23A:
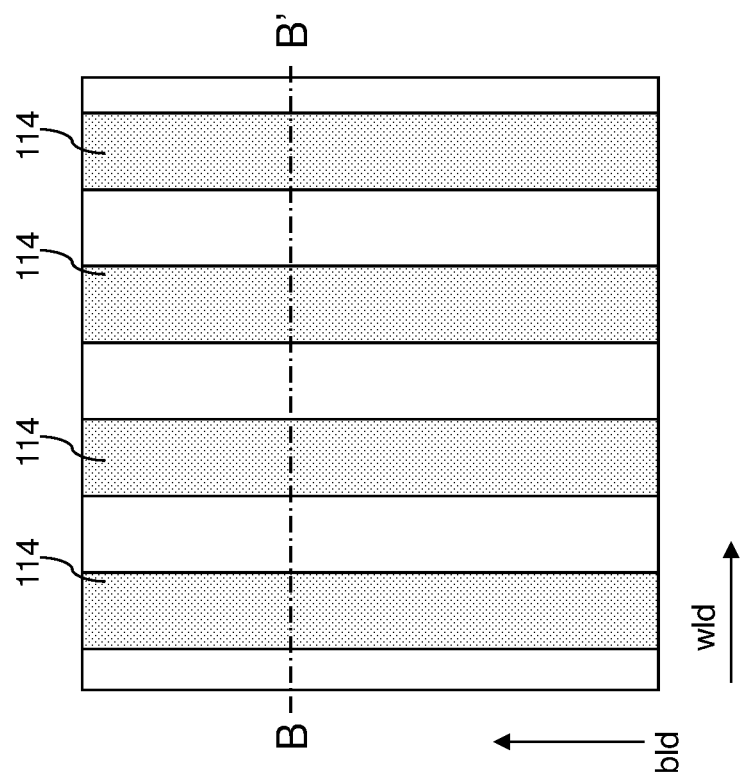
FIG. 23A is a top-down view of a second configuration of the portion of the memory array region of the exemplary structure after formation of a metal-containing precursor layer for formation of a continuous metal organic framework (MOF) layer according to an embodiment of the present disclosure.

Referring to FIGS. 23A and 23B, the processing steps of FIGS. 15A and 15B can be performed to oxidize the physically exposed surface portions of the first metal lines 112 into a metal-containing precursor layer 119, which is subsequently employed for formation of a continuous metal organic framework (MOF) layer. In this case, the metal-containing precursor layer 119 can be formed only on sidewalls of the first metal lines 112, and may not be formed directly on the top surfaces of the first metal lines 112 due to the presence of the dielectric hard mask strips 114. The thickness and the material composition of the metal-containing precursor layer 119 may be the same as in the structure illustrated in FIGS. 15A and 15B.

Referring to FIGS. 24A and 24B, the processing steps of FIGS. 16A and 16B can be performed to form a continuous metal organic framework (MOF) material layer 120. A continuous metal organic framework (MOF) material layer 120 is formed by reacting the metal-containing precursor layer 119 with a vapor of a linking compound.

In one embodiment, the dielectric hard mask strips 114 includes a metal-containing precursor material that can subsequently form a portion of a continuous metal organic framework material layer. For example, the dielectric hard mask strips 114 may include molybdenum oxide, copper oxide, cobalt oxide, or titanium oxide. In this case, the metal-containing precursor layer 119 may comprise a first metal-containing precursor material for forming first portions of the continuous MOF material layer 120, and the dielectric hard mask strips 114 may comprise a second metal-containing precursor material for forming second portions of the continuous MOF material layer 120. In this case, the second metal-containing precursor material may be the same as, or may be different from, the first metal-containing precursor material. If the second metal-containing precursor material of the dielectric hard mask strips 114 is the same as the first metal-containing precursor material of the metal-containing precursor layer 119, the continuous MOF material layer 120 may have a homogenous material composition throughout. If the second metal-containing precursor material of the dielectric hard mask strips 114 is different from the first metal-containing precursor material of the metal-containing precursor layer 119, the continuous MOF material layer 120 may have first portions having a first MOF material composition and a second portion having a second MOF material composition that is different from the first MOF material composition. The first MOF material composition can be derived from the metal-containing precursor layer 119, and may be a predominant component (i.e., a component that occupies more than 50% of the volume) of each of the lower MOF portions 120A. The second MOF material composition can be derived from the dielectric hard mask strips 114, and may be a predominant component of the upper MOF matrix portion 120B.

While FIGS. 24A and 24B illustrate an embodiment in which the dielectric hard mask strips 114 are not converted into a portion of the continuous MOF material layer 120, it is understood that an embodiment in which the dielectric hard mask strips 114 are converted into a portion of the continuous MOF material layer 120 generates a configuration illustrated in FIGS. 16A and 16B. In such an embodiment, the processing steps of FIGS. 17A-20C can be performed to provide a structure illustrated in FIGS. 20A-20C. In this case, the continuous MOF material layer 120 may have a homogeneous material composition throughout, or may have first portions having a first MOF material composition and a second portion having a second MOF material composition that is different from the first MOF material composition.

Figure 25B:
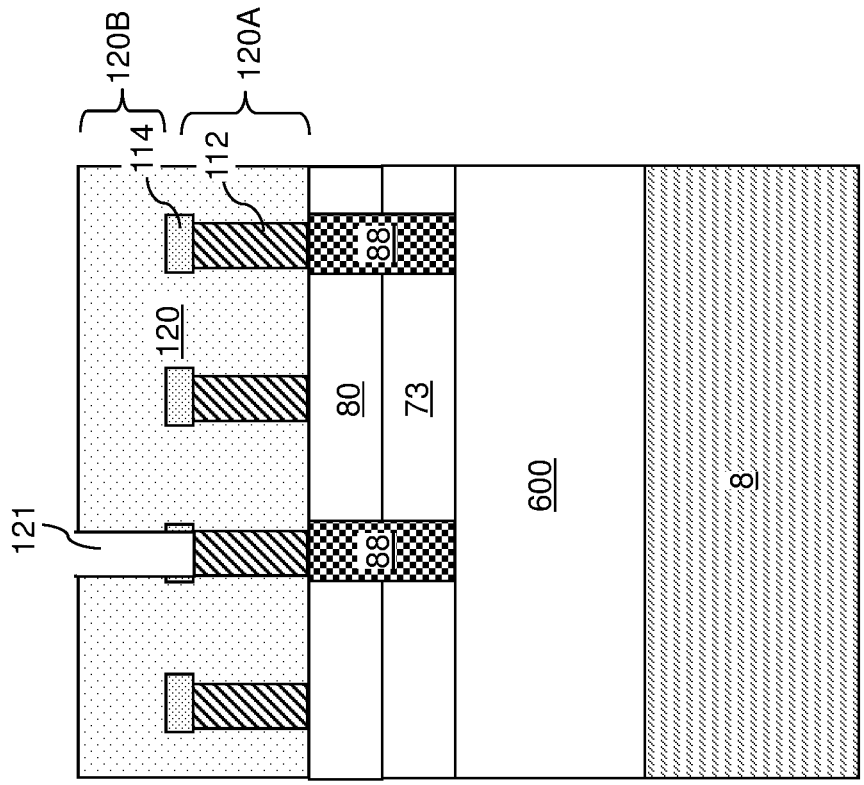
FIG. 25B is a schematic vertical cross-sectional view of the second configuration of the exemplary structure along the vertical plane B-B' of FIG. 25A.
Figure 25A:
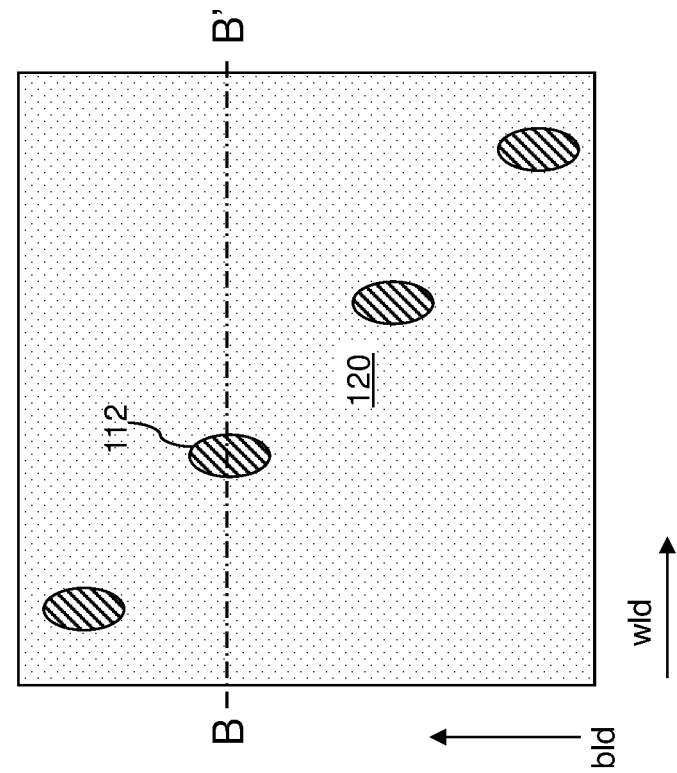
FIG. 25A is a top-down view of the second configuration of the portion of the memory array region of the exemplary structure after formation of via cavities through an upper MOF matrix portion according to an embodiment of the present disclosure.

Referring to FIGS. 25A and 25B, an embodiment in which the dielectric hard mask strips 114 are not converted into portions of the continuous MOF material layer 120 is illustrated. A photoresist layer (not shown) can be applied over the top surface of the continuous MOF material layer 120, and can be lithographically patterned to form an array of openings therein. The pattern of the openings in the photoresist layer can be transferred through the upper MOF matrix portion 120B of the continuous MOF material layer 120 and through the dielectric hard mask strips 114 by an anisotropic etch process such as a reactive ion etch process. Via cavities 121 vertically extending through the upper MOF matrix portion 120B of the continuous MOF material layer 120 can be formed. The pattern of the openings in the photoresist layer can be selected such that a top surface of a first metal line 112 is physically exposed at the bottom of each via cavity 121. The photoresist layer can be subsequently removed, for example, by ashing.

Figure 26B:
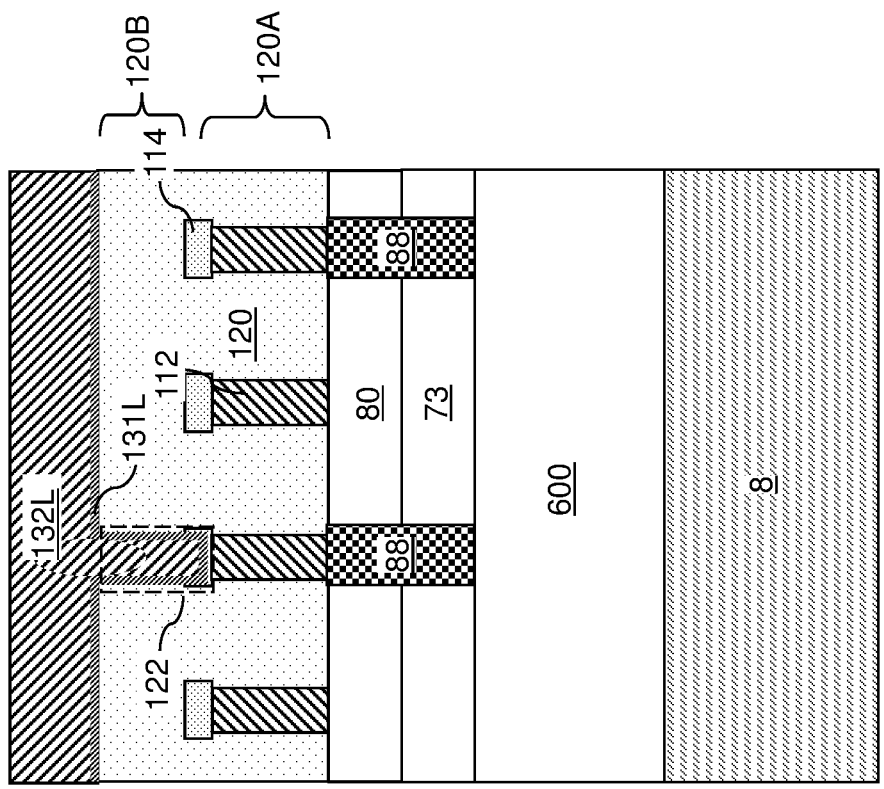
FIG. 26B is a schematic vertical cross-sectional view of the second configuration of the exemplary structure along the vertical plane B-B' of FIG. 26A.
Figure 26A:
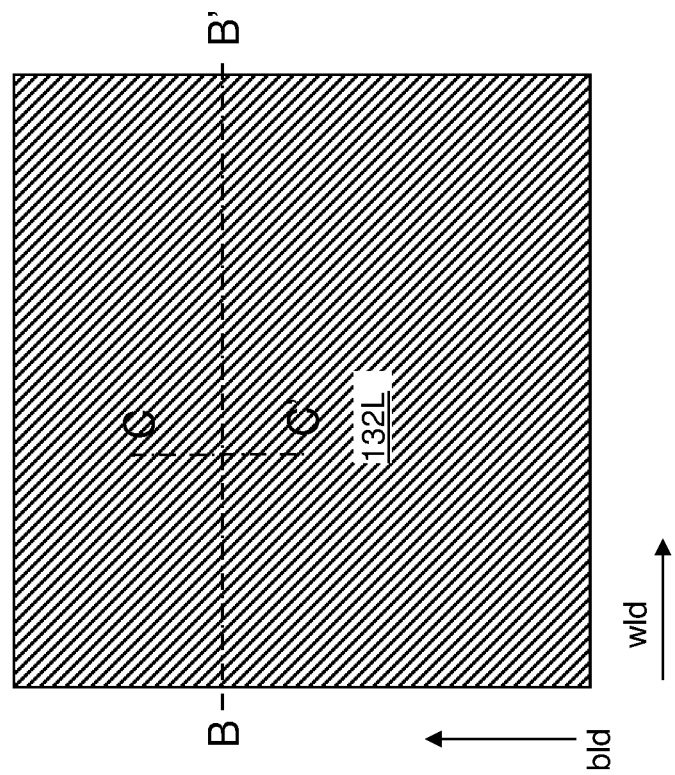
FIG. 26A is a top-down view of the second configuration of the portion of the memory array region of the exemplary structure after formation of second integrated line-and-via structures including second metal lines and second metal via structures according to an embodiment of the present disclosure.
Figure 26C:
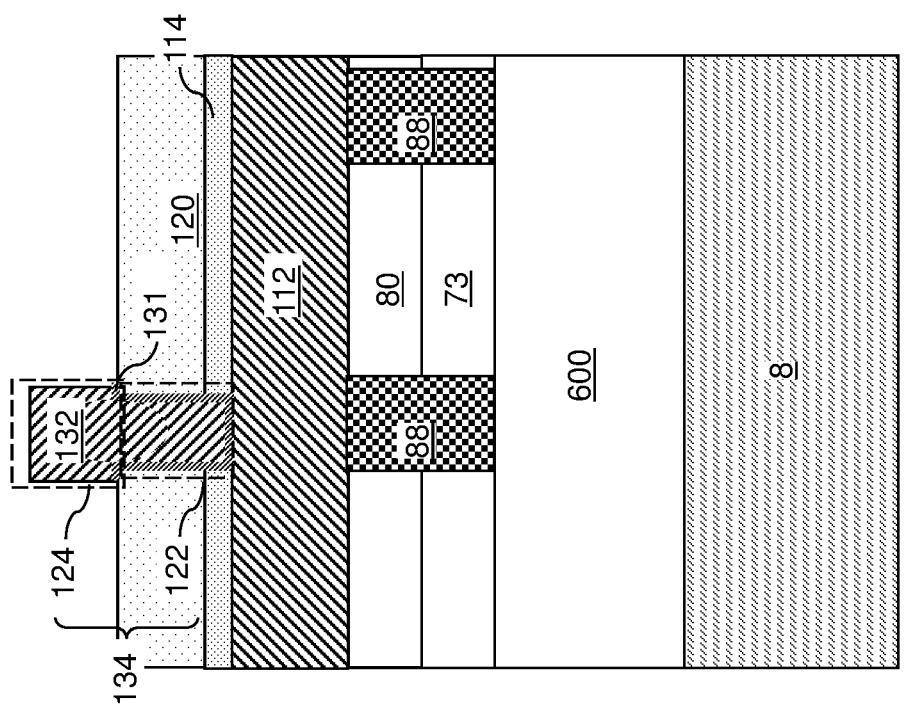
FIG. 26C is a schematic vertical cross-sectional view of the second configuration of the exemplary structure along the vertical plane C-C' of FIG. 26A.

Referring to FIGS. 26A-26C, the processing steps of FIGS. 18A and 18B and the processing steps of FIGS. 19A-19C can be performed to form first integrated line-and-via structures 134.

Figure 27C:
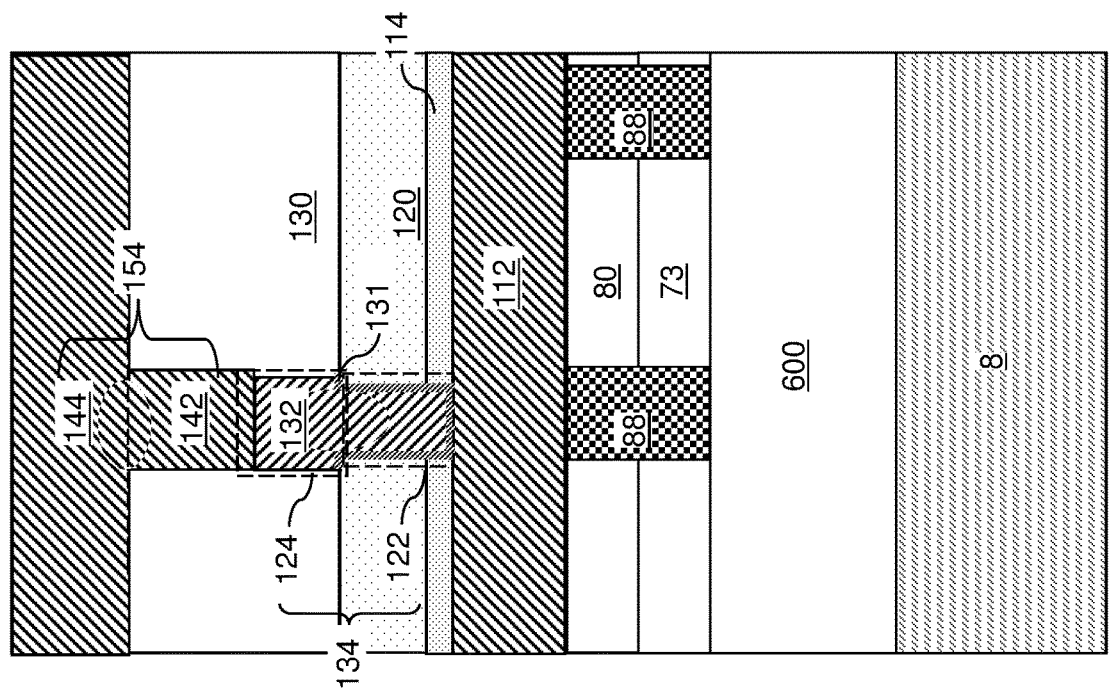
FIG. 27C is a schematic vertical cross-sectional view of the second configuration of the exemplary structure along the vertical plane C-C' of FIG. 27A.

Referring to FIGS. 27A-27C, the processing steps of FIGS. 20A-20C can be performed to form a dielectric material layer 130 and second integrated line-and-via structures 154.

Figure 28B:
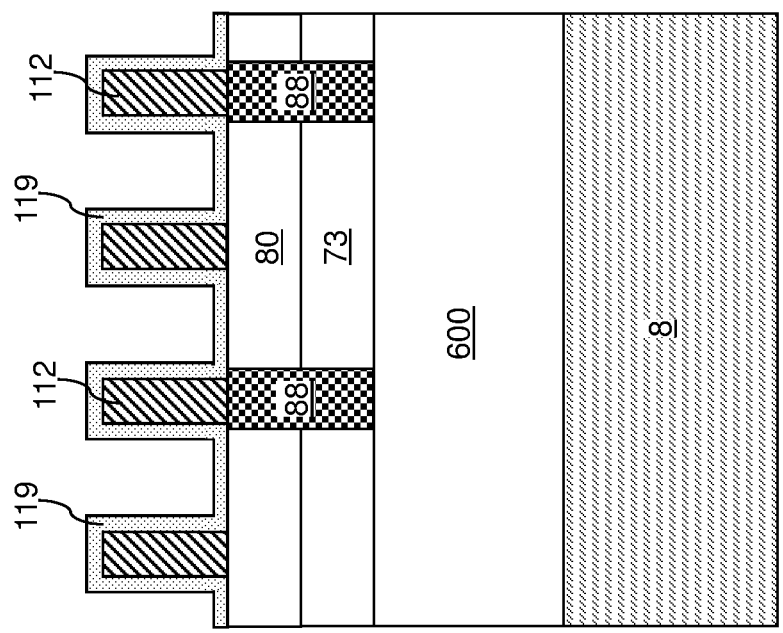
FIG. 28B is a schematic vertical cross-sectional view of the second configuration of the exemplary structure along the vertical plane B-B' of FIG. 28A.
Figure 28A:
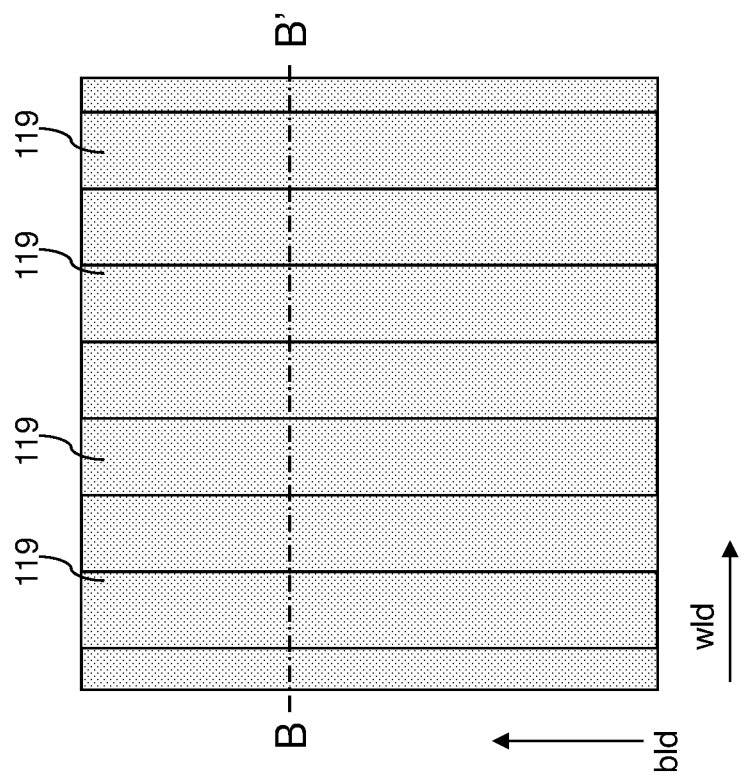
FIG. 28A is a top-down view of a third configuration of the portion of the memory array region of the exemplary structure after formation of a metal-containing precursor layer for formation of a continuous metal organic framework (MOF) layer according to an embodiment of the present disclosure.

Referring to FIGS. 28A and 28B, a third configuration of the portion of the memory array region of the exemplary structure is illustrated after formation of a metal-containing precursor layer 119 for formation of a continuous metal organic framework (MOF) layer 120. In the third configuration, the metal-containing precursor layer 119 can be deposited by a conformal deposition process such as a chemical vapor deposition process or an atomic layer deposition process. Accordingly, the first metal lines 112 may include any metal such as any transition metal. In other words, it is not necessary to employ a metal that can be oxidized to form a metal oxide which can be subsequently converted into a MOF material for the first metal lines 112 in the third configuration of the exemplary structure.

The metal-containing precursor layer 119 may include any metal oxide material that can react with a linking compound to form a MOF material. For example, the first metal lines 112 may include ruthenium and the metal-containing precursor layer 119 may include titanium oxide. As discussed above, selection of the linking compound depends on the composition of the metal oxide material within the metal-containing precursor layer 119, and consequently, the material composition of a continuous MOF material layer 120 derived from the metal-containing precursor layer 119 depends on the material composition of the metal-containing precursor layer 119.

Subsequently, the processing steps of FIGS. 16A-20C can be performed to form a structure illustrated in FIGS. 20A-20C. In the third configuration, the material composition of the first metal lines 112 and the material composition of the continuous MOF material layer 120 can be independent. In one embodiment, the first metal lines 112 comprise, and/or consist essentially of, a first transition metal, and the continuous MOF material layer 120 consists essentially of a metal organic framework material that contains a second transition metal, which may be the same as, or may be different from, first transition metal as a metallic component.

Referring to FIGS. 29A and 29B, a fourth configuration of a portion of a memory array region of the exemplary structure is illustrated after formation of a metal-containing precursor layer 119 for formation of a continuous metal organic framework (MOF) layer 120. The fourth configuration of the exemplary structure can be derived from the second configuration of the exemplary structure illustrated in FIGS. 22A and 22B by removing the photoresist layer 117, and by forming a metal-containing precursor layer 119 employing the methods of the third configuration, i.e., by a conformal deposition method. As in the second configuration of the exemplary structure, the dielectric hard mask strips 114 may include a dielectric material such as silicon oxide, silicon nitride, silicon oxynitride, or a dielectric metal oxide that does not react with the linking compound, or may include a metal-containing precursor material that can subsequently form a portion of a continuous metal organic framework material layer.

Subsequently, the processing steps of FIGS. 24A-27C can be performed to form a structure illustrated in FIGS. 20A-20C or in FIGS. 27A-27C. In the fourth configuration, the material composition of the first metal lines 112 and the material composition of the continuous MOF material layer 120 can be independent. In one embodiment, the first metal lines 112 comprise, and/or consist essentially of, a first transition metal, and the continuous MOF material layer 120 consists essentially of a metal organic framework material that contains a second transition metal, which may be the same as, or may be different from, first transition metal as a metallic component.

In one embodiment of the fourth configuration, the metal-containing precursor layer 119 may comprise a first metal-containing precursor material for forming first portions of the continuous MOF material layer 120, and the dielectric hard mask strips 114 may comprise a second metal-containing precursor material for forming second portions of the continuous MOF material layer 120. In this case, the second metal-containing precursor material may be the same as, or may be different from, the first metal-containing precursor material. If the second metal-containing precursor material of the dielectric hard mask strips 114 is the same as the first metal-containing precursor material of the metal-containing precursor layer 119, the continuous MOF material layer 120 may have a homogenous material composition throughout. Even if the second metal-containing precursor material of the dielectric hard mask strips 114 is different from the first metal-containing precursor material of the metal-containing precursor layer 119, the continuous MOF material layer 120 should have a uniform composition since the metal-containing precursor layer 119 covers the hard mask strips 114.

Referring to all drawings and according to various embodiments of the present disclosure, a semiconductor structure is provided, which comprises: first metal lines 112 located above at least one semiconductor device 600; and a continuous metal organic framework (MOF) material layer 120 including lower MOF portions 120A that are located between neighboring pairs of first metal lines 112 and an upper MOF matrix portion 120B that continuously extends over the first metal lines 112 and connected to each of the lower MOF portions 120A, wherein each of the lower MOF portions 120A is located below a first horizontal plane P1 containing bottom surfaces of the upper MOF matrix portion 120B, and the upper MOF matrix portion 120B has a top surface within a second horizontal plane P2.

In one embodiment, the lower MOF portions 120A and the upper MOF matrix portion 120B include a homogenous MOF material throughout. In one embodiment, each sidewall of the first metal lines 112 contacts a respective one of the lower MOF portions 120A. In one embodiment, each top surface of the first metal lines 112 contacts a respective one of the bottom surfaces of the upper MOF matrix portion 120B.

In one embodiment, dielectric hard mask strips 114 can contact a top surface of a respective one of the first metal lines 112 and a bottom surface of a respective one of the bottom surfaces of the upper MOF matrix portion 120B.

In one embodiment, the semiconductor structure also includes an integrated line-and-via structure 134 comprising a combination of a second metal line 124 and at least one metal via structure 122, wherein the integrated line-and-via structure 134 comprises a continuous metal portion 132 that extends across the second metal line 124 and each of the at least one metal via structure 122, and the at least one metal via structure 122 extends through the upper MOF matrix portion 120B and contacts a set of at least one of the first metal lines 112; and a dielectric material layer 130 contacting the second metal line 124 and overlying the continuous MOF material layer 120.

In one embodiment, the second metal line 124 has a bottom surface contacting the top surface of the upper MOF matrix portion 120B. In one embodiment, the first metal lines 112 laterally extend along a second horizontal direction bld; and the second metal line 124 laterally extends along a first horizontal direction wld that is perpendicular to the second horizontal direction bld. In one embodiment, the integrated line-and-via structure 134 comprises a metallic barrier liner 131 that continuously extends into each of the second metal line 124 and the at least one metal via structure 122 and contacts a portion of the top surface of the upper MOF matrix portion 120B and a top surface of each first metal line 112 within the set of at least one of the first metal lines 112.

In one embodiment, the semiconductor structure comprises an additional integrated line-and-via structure 154 embedded in the dielectric material layer 130, including a combination of an additional metal line 144 and at least one additional via structure 142 through which an additional continuous metal portion extends, having a top surface located within a horizontal plane including a top surface of the additional integrated line-and-via structure 154, and contacting a top surface of the integrated line-and-via structure 134.

In one embodiment, the first metal lines 112 consist essentially of a first transition metal and lack a metal nitride diffusion barrier layer. In one embodiment, the first metal lines 112 consist essentially of molybdenum, and the continuous MOF material layer 120 consists essentially of a metal organic framework material (e.g., TUDMOF-1) that contains molybdenum as a metallic component.

In another embodiment, the continuous MOF material layer 120 comprises first portions 120A having a first MOF composition including the first transition metal and a second portion 120B having a second MOF composition including a second transition metal that is different from the first transition metal, and the continuous MOF material layer 120 consists essentially of a metal organic framework material that contains the second transition metal that is different from the first transition metal as a metallic component. In one embodiment, the first metal lines 112 consist essentially of ruthenium, and the continuous MOF material layer 120 consists essentially of a metal organic framework material (e.g., MIL-125) that contains titanium as a metallic component.

In one embodiment, the at least one semiconductor device 600 comprises a three-dimensional memory array including an alternating stack of insulating layers 32 and electrically conductive layers 46 and a two-dimensional array of memory stack structures 55, each of the memory stack structures comprising a semiconductor channel 60 and a vertical stack of memory elements (e.g., portions of the memory film 50), and the first metal lines 112 comprise bit lines of the three-dimensional memory array.

The various embodiments of the present disclosure can be employed to provide a continuous MOF material layer 120 that includes lower MOF portions 120A that function as a line-level dielectric material layer that embeds first metal lines 112 and an upper MOF matrix portion 120B that functions as a via-level dielectric material layer that embeds first metal via structures 122. The lower MOF portions 120A and an upper MOF matrix portion 120B may be formed simultaneously by a single exposure to a linking compound, or by sequential exposure to two linking compounds in case dielectric hard mask strips 114 are employed and include a metal oxide that can be converted into a MOF material. By generating the upper MOF matrix portion 120B as a via-level dielectric material layer during formation of the lower MOF portions 120A, a line-level dielectric material layer and a via-level dielectric material layer can be simultaneously formed.

Furthermore, the first metal lines may be barrierless metal lines, which reduces the resistance and the RC delay of the first metal lines. Still further, the MOF material reduces the capacitance between the adjacent first metal lines and between the first and second metal lines, and reduces moisture diffusion and delamination of the bit line level layers. Furthermore, the thickness of the inter-line dielectric material may be reduced by using a MOF material, which may increase device density and reduce process cost.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A semiconductor structure comprising:
   first metal lines located above at least one semiconductor device;
   a continuous metal organic framework (MOF) material layer including lower MOF portions that are located between neighboring pairs of first metal lines and an upper MOF matrix portion that continuously extends over the first metal lines and connected to each of the lower MOF portions, wherein each of the lower MOF portions is located below a first horizontal plane containing bottom surfaces of the upper MOF matrix portion, and the upper MOF matrix portion has a top surface within a second horizontal plane; and
   dielectric hard mask strips contacting a top surface of a respective one of the first metal lines and a bottom surface of a respective one of the bottom surfaces of the upper MOF matrix portion.

2. The semiconductor structure of claim 1, wherein the lower MOF portions and the upper MOF matrix portion include a homogenous MOF material throughout.

3. The semiconductor structure of claim 1, wherein each sidewall of the first metal lines contacts a respective one of the lower MOF portions.

4. The semiconductor structure of claim 1, wherein each top surface of the first metal lines contacts a respective one of the bottom surfaces of the upper MOF matrix portion.

5. The semiconductor structure of claim 1, further comprising:
   an integrated line-and-via structure comprising a combination of a second metal line and at least one metal via structure, wherein the integrated line-and-via structure comprises a continuous metal portion that extends across the second metal line and each of the at least one metal via structure, and the at least one metal via structure extends through the upper MOF matrix portion and contacts a set of at least one of the first metal lines; and
   a dielectric material layer contacting the second metal line and overlying the continuous MOF material layer.

6. The semiconductor structure of claim 5, wherein:
   the second metal line has a bottom surface contacting the top surface of the upper MOF matrix portion;
   the first metal lines laterally extend along a first horizontal direction; and
   the second metal line laterally extends along a second horizontal direction that is perpendicular to the first horizontal direction.

7. The semiconductor structure of claim 5, wherein the integrated line-and-via structure comprises a metallic barrier liner that continuously extends into each of the second metal line and the at least one metal via structure and contacts a portion of the top surface of the upper MOF matrix portion and a top surface of each first metal line within the set of at least one of the first metal lines.

8. The semiconductor structure of claim 5, further comprising an additional integrated line-and-via structure embedded in the dielectric material layer, including a combination of an additional metal line and at least one additional via structure through which an additional continuous metal portion extends, having a top surface located within a horizontal plane including a top surface of the additional integrated line-and-via structure, and contacting a top surface of the integrated line-and-via structure.

9. The semiconductor structure of claim 1, wherein the first metal lines consist essentially of a first transition metal and lack a metal nitride diffusion barrier layer.

10. The semiconductor structure of claim 9, wherein:
    the first metal lines consist essentially of molybdenum; and
    the continuous MOF material layer consists essentially of a metal organic framework material that contains molybdenum as a metallic component.

11. The semiconductor structure of claim 9, wherein:
    the continuous MOF material layer comprises first portions having a first MOF composition including the first transition metal and a second portion having a second MOF composition including a second transition metal that is different from the first transition metal; and the continuous MOF material layer consists essentially of a metal organic framework material that contains the second transition metal that is different from the first transition metal as a metallic component.

12. The semiconductor structure of claim 11, wherein:
the first metal lines consist essentially of ruthenium; and
the continuous MOF material layer consists essentially of a metal organic framework material that contains titanium as a metallic component.

13. The semiconductor structure of claim 1, wherein:
the at least one semiconductor device comprises a three-dimensional memory array including an alternating stack of insulating layers and electrically conductive layers and a two-dimensional array of memory stack structures, each of the memory stack structures comprising a semiconductor channel and a vertical stack of memory elements; and
the first metal lines comprise bit lines of the three-dimensional memory array.

14. A method of forming a semiconductor structure, comprising:
forming at least one semiconductor device over a substrate;
forming first metal lines laterally extending along a first horizontal direction and laterally spaced apart along a second horizontal direction over the at least one semiconductor device;
forming a metal-containing precursor layer on sidewalls of the first metal lines; and
forming a continuous metal organic framework (MOF) material layer by reacting the metal-containing precursor layer with a vapor of a linking compound, wherein the continuous metal organic framework (MOF) material layer comprises lower MOF portions that fills volumes between neighboring pairs of the first metal lines and an upper MOF matrix portion that continuously extends over the first metal lines and connected to each of the lower MOF portions.

15. The method of claim 14, further comprising providing a hydrophobic functional group into the vapor.

16. The method of claim 14, wherein:
the first metal lines comprise a first transition metal; and
the metal-containing precursor layer comprises an oxide of the first transition metal formed by oxidizing the first metal lines.

17. The method of claim 14, wherein the metal-containing precursor layer is formed by deposition of a metal oxide material on the sidewalls of the first metal lines.

18. The method of claim 14, further comprising forming dielectric hard mask strips on top surfaces of the first metal lines prior to formation of the metal-containing precursor layer.

19. The method of claim 14, wherein the first metal lines consist essentially of a first transition metal and lack a metal nitride diffusion barrier layer.

20. A semiconductor structure comprising:
first metal lines located above at least one semiconductor device;
a continuous metal organic framework (MOF) material layer including lower MOF portions that are located between neighboring pairs of first metal lines and an upper MOF matrix portion that continuously extends over the first metal lines and connected to each of the lower MOF portions, wherein each of the lower MOF portions is located below a first horizontal plane containing bottom surfaces of the upper MOF matrix portion, and the upper MOF matrix portion has a top surface within a second horizontal plane;
an integrated line-and-via structure comprising a combination of a second metal line and at least one metal via structure, wherein the integrated line-and-via structure comprises a continuous metal portion that extends across the second metal line and each of the at least one metal via structure, and the at least one metal via structure extends through the upper MOF matrix portion and contacts a set of at least one of the first metal lines; and
a dielectric material layer contacting the second metal line and overlying the continuous MOF material layer,
wherein the integrated line-and-via structure comprises a metallic barrier liner that continuously extends into each of the second metal line and the at least one metal via structure and contacts a portion of the top surface of the upper MOF matrix portion and a top surface of each first metal line within the set of at least one of the first metal lines.

21. A semiconductor structure comprising:
first metal lines located above at least one semiconductor device; and
a continuous metal organic framework (MOF) material layer including lower MOF portions that are located between neighboring pairs of first metal lines and an upper MOF matrix portion that continuously extends over the first metal lines and connected to each of the lower MOF portions, wherein:
each of the lower MOF portions is located below a first horizontal plane containing bottom surfaces of the upper MOF matrix portion, and the upper MOF matrix portion has a top surface within a second horizontal plane;
the first metal lines consist essentially of a first transition metal and lack a metal nitride diffusion barrier layer;
the continuous MOF material layer comprises first portions having a first MOF composition including the first transition metal and a second portion having a second MOF composition including a second transition metal that is different from the first transition metal; and
the continuous MOF material layer consists essentially of a metal organic framework material that contains the second transition metal that is different from the first transition metal as a metallic component.

* * * * *